(12) United States Patent
Sugimoto

(10) Patent No.: US 10,852,600 B2
(45) Date of Patent: Dec. 1, 2020

(54) ELECTROOPTICAL DEVICE AND ELECTRONIC APPARATUS

(71) Applicant: SEIKO EPSON CORPORATION, Tokyo (JP)

(72) Inventor: Yohei Sugimoto, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/601,638

(22) Filed: Oct. 15, 2019

(65) Prior Publication Data

US 2020/0117063 A1  Apr. 16, 2020

(30) Foreign Application Priority Data

Oct. 16, 2018 (JP) ................................ 2018-194854

(51) Int. Cl.
| | | |
|---|---|---|
| *G02F 1/1362* | (2006.01) | |
| *G02F 1/1368* | (2006.01) | |
| *H01L 27/12* | (2006.01) | |
| *G02F 1/1335* | (2006.01) | |
| *H01L 29/786* | (2006.01) | |
| *G02F 1/1333* | (2006.01) | |

(52) U.S. Cl.
CPC ...... *G02F 1/136213* (2013.01); *G02F 1/1335* (2013.01); *G02F 1/1368* (2013.01); *G02F 1/136209* (2013.01); *G02F 1/136227* (2013.01); *G02F 1/136286* (2013.01); *H01L 27/124* (2013.01); *H01L 29/78606* (2013.01); *G02F 2001/13629* (2013.01); *G02F 2001/133388* (2013.01)

(58) Field of Classification Search
CPC ......... G02F 1/136213; G02F 1/136209; G02F 1/136227; G02F 1/1335; G02F 1/136286; G02F 2001/13629; G02F 2001/133388; H01L 27/124; H01L 29/78606
USPC .................................................. 349/38, 139
See application file for complete search history.

(56) References Cited

U.S. PATENT DOCUMENTS

2013/0082269 A1  4/2013  Hanamura
2015/0108484 A1*  4/2015  Park ................... H01L 27/3248
257/71

(Continued)

FOREIGN PATENT DOCUMENTS

| JP | 2010-054655 A | 3/2010 |
|---|---|---|
| JP | 2012-155118 A | 8/2012 |
| JP | 2013-080040 A | 5/2013 |

(Continued)

*Primary Examiner* — Charles S Chang
(74) *Attorney, Agent, or Firm* — Oliff PLC

(57) ABSTRACT

A liquid crystal device as an electrooptical device includes a TFT as a transistor, a pixel electrode provided correspondingly to the TFT, a storage capacitor in which a first capacitance electrode, a capacitance insulating layer, and a second capacitance electrode are stacked in order, and a contact portion as a first contact portion configured to electrically connect a semiconductor layer of the TFT and the pixel electrode. In the liquid crystal device, the second capacitance electrode includes a first conductive layer and a second conductive layer stacked on the first conductive layer, and the contact portion is configured of the second conductive layer and is provided so as to be in contact with a drain region of the semiconductor layer.

14 Claims, 26 Drawing Sheets

(56) References Cited

U.S. PATENT DOCUMENTS

2017/0031221 A1   2/2017  Sugimoto et al.
2018/0149937 A1   5/2018  Nakajima

FOREIGN PATENT DOCUMENTS

JP    2015-197584 A    11/2015
JP    2018-084724 A    5/2018

* cited by examiner

ELECTROOPTICAL DEVICE AND ELECTRONIC APPARATUS

The present application is based on, and claims priority from JP Application Serial Number 2018-194854, filed Oct. 16, 2018, the disclosure of which is hereby incorporated by reference herein in its entirety.

BACKGROUND

1. Technical Field

The present application relates to an electrooptical device and an electronic apparatus including the electrooptical device.

2. Related Art

For example, an active drive type liquid crystal device including a pixel electrode and a switching element for the pixel electrode, for each pixel is known as an electrooptical device. In such an active drive type liquid crystal device, an image signal to be applied to the pixel electrode is electrically held in a liquid crystal capacitor including the pixel electrode and a counter electrode facing each other with the liquid crystal layer interposed therebetween. When the image signal is held only in the liquid crystal capacitor, the held image signal may attenuate over time. Thus, the pixel also includes a storage capacitor provided in parallel to the liquid crystal capacitor. However, in a high-definition display in which an increased number of pixels having a smaller size are arranged in a display region, each of the pixels has only a limited area for the storage capacitor. Thus, in the high-resolution display, it is difficult to secure electrical capacitance of the storage capacitor capable of storing an image signal for a prescribed period.

For example, JP-A-2012-155118 discloses an electrooptical device including, a data line disposed between a substrate and a pixel electrode, a semiconductor layer disposed between the substrate and the data line, a first insulating layer disposed between the pixel electrode and the semiconductor layer, a second insulating layer disposed between the pixel electrode and the semiconductor layer, and a storage capacitor disposed so as to cover a groove (trench) penetrating through the first insulating layer and the second insulating layer. The storage capacitor having a trench structure can have a large capacitance value as compared to a storage capacitor provided on a planar insulating layer without a groove.

In addition to the data lines electrically coupled with the semiconductor layer, the electrooptical device in JP-A-2012-155118 includes scanning lines and a relay layer for electrically coupling, to the semiconductor layer, one of a pair of capacitance electrodes included in the storage capacitor. In other words, the electrooptical device of JP-A-2012-155118 includes a transistor and the storage capacitor, which are provided in any of a plurality of wiring layers, as well as the relay layers and wiring for these electrical configurations, and thus, has a problem of complicated wiring structure.

SUMMARY

An electrooptical device according to the present application includes a transistor, a pixel electrode provided correspondingly to the transistor, a storage capacitor in which a first capacitance electrode, a capacitance insulating layer, and a second capacitance electrode are stacked in order, and a first contact portion configured to electrically couple a semiconductor layer of the transistor and the pixel electrode. In the electrooptical device, the second capacitance electrode includes a first conductive layer and a second conductive layer stacked on the first conductive layer, and the first contact portion is configured of the second conductive layer and is provided so as to be in contact with the semiconductor layer.

The electrooptical device may include a second contact portion configured to electrically couple the semiconductor layer of the transistor and a data line, and, in the electrooptical device, the second contact portion may be configured of the second conductive layer and be provided so as to be in contact with the semiconductor layer.

The electrooptical device may include a third contact portion configured to electrically couple a gate electrode of the transistor and a scanning line, and, in the electrooptical device, the third contact portion may be configured of the second conductive layer and be provided so as to be in contact with the gate electrode.

In the electrooptical device, the first contact portion, the second contact portion, or the third contact portion may be provided on a sidewall and at an inside of the sidewall, and the sidewall may be configured of the capacitance insulating layer and the first conductive layer of the second capacitance electrode.

In the electrooptical device, the first contact portion, the second contact portion, or the third contact portion may include polysilicon.

The electrooptical device may include a plurality of interlayer insulating layers provided between the transistor and the pixel electrode, and in the electrooptical device, the storage capacitor may be provided along a recessed portion provided in one of the plurality of interlayer insulating layers.

Another electrooptical device according to the present application includes a transistor, a pixel electrode provided correspondingly to the transistor, a storage capacitor in which a first capacitance electrode, a first capacitance insulating layer, a second capacitance electrode, a second capacitance insulating layer, and a third capacitance electrode are stacked in order, a fourth contact portion configured to electrically couple a semiconductor layer of the transistor and the second capacitance electrode and a fifth contact portion configured to electrically couple the fourth contact portion and the pixel electrode. In the other electrooptical device, the second capacitance electrode includes a third conductive layer and a fourth conductive layer stacked on the third conductive layer, the third capacitance electrode includes a fifth conductive layer and a sixth conductive layer stacked on the fifth conductive layer, the fourth contact portion is configured of the fourth conductive layer and is provided so as to be in contact with the semiconductor layer, and the fifth contact portion is configured of the sixth conductive layer and is provided so as to be electrically coupled with the second capacitance electrode.

The other electrooptical device may include a sixth contact portion configured to electrically couple the semiconductor layer of the transistor and a data line, and, in the other electrooptical device, the sixth contact portion may be configured of the sixth conductive layer and be provided so as to be in contact with the semiconductor layer.

The other electrooptical device may include a seventh contact portion configured to electrically couple a gate electrode of the transistor and a scanning line, and, in the other electrooptical device, the seventh contact portion may be configured of the sixth conductive layer and be provided so as to be in contact with the gate electrode.

In the other electrooptical device, the fifth contact portion, the sixth contact portion, or the seventh contact portion may be provided on a sidewall and at an inside of the sidewall, and the sidewall may be configured of the first capacitance insulating layer, the third conductive layer and the fourth conductive layer of the second capacitance electrode, the second capacitance insulating layer, and the fifth conductive layer of the third capacitance electrode.

In the other electrooptical device, the fifth contact portion, the sixth contact portion, or the seventh contact portion may include polysilicon.

The other electrooptical device may include a plurality of interlayer insulating layers provided in a layer between the transistor and the pixel electrode, and in the other electrooptical device, the storage capacitor may be provided along a recessed portion provided in one interlayer insulating layer of the plurality of interlayer insulating layers.

An electronic apparatus according to the present application includes the electrooptical device described above.

DESCRIPTION OF EXEMPLARY EMBODIMENTS

Embodiments of the present disclosure will be described below with reference to the accompanying drawings. Note that, in the following drawings, parts described are illustrated in an enlarged or reduced state as appropriate to the extent that the parts can be recognized.

An electrooptical device according to the embodiment will be described by taking, as an example, an active matrix liquid crystal device including a thin film transistor (TFT) as a switching element of a pixel. The liquid crystal device can be used favorably as a light modulation means for a projection-type display apparatus described below, for example.

First Embodiment

Electrooptical Device

Figure 1:
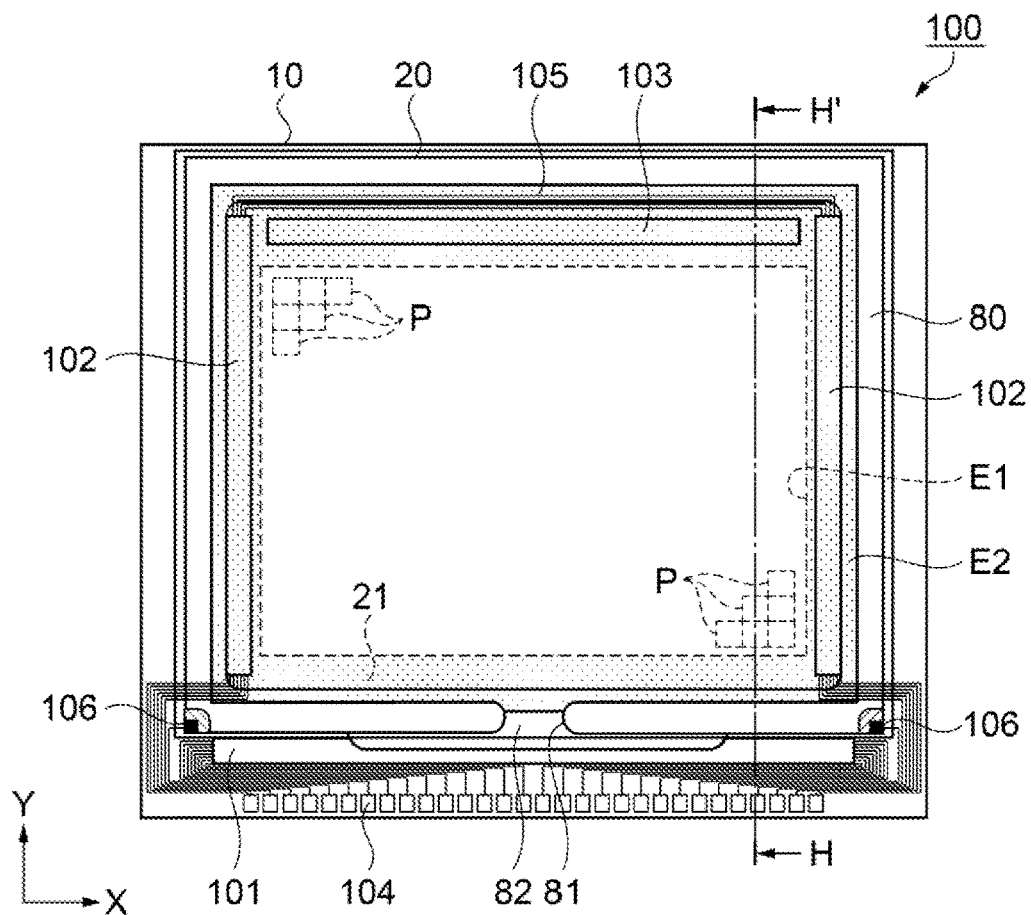
FIG. 1 is a schematic plan view illustrating a configuration of a liquid crystal device of a first embodiment.
Figure 2:
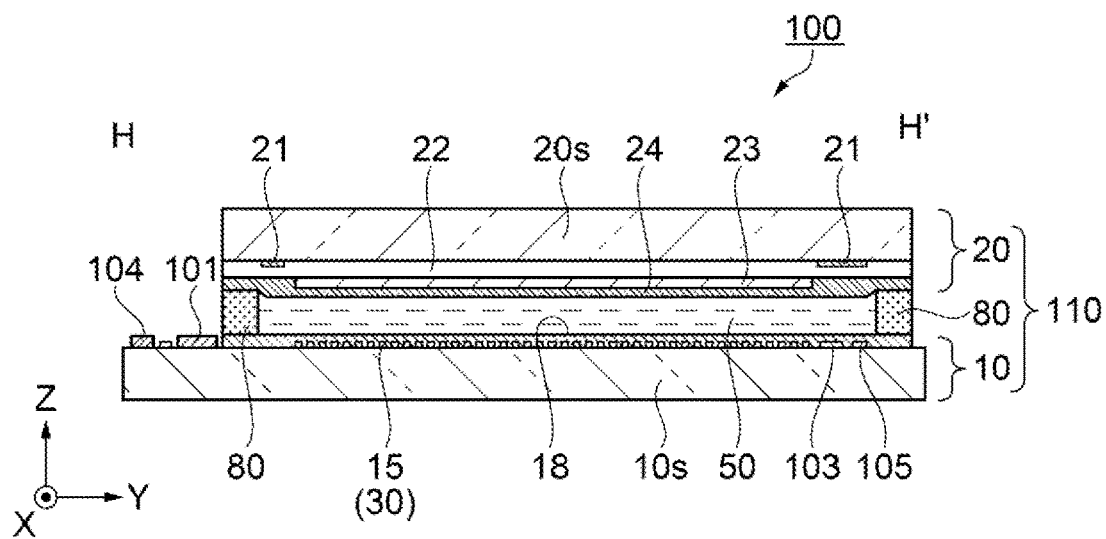
FIG. 2 is a schematic cross-sectional view illustrating a structure of the liquid crystal device of the first embodiment taken along line H-H' in FIG. 1.
Figure 3:
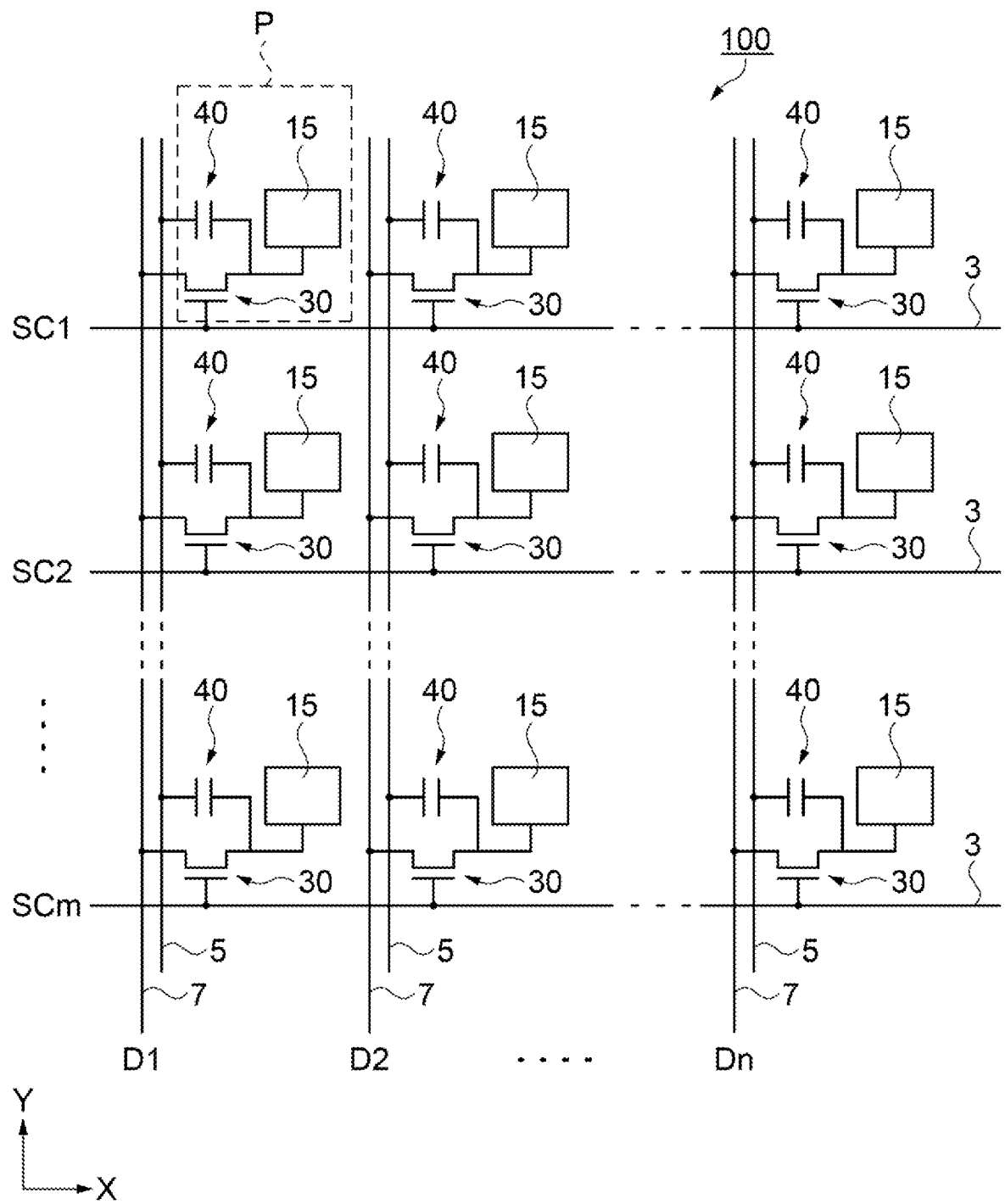
FIG. 3 is an equivalent circuit diagram illustrating an electrical configuration of the liquid crystal device of the first embodiment.

First, a liquid crystal device as an electrooptical device according to the embodiment will be described with reference to FIGS. 1 to 3. FIG. 1 is a schematic plan view illustrating a configuration of a liquid crystal device according to a first embodiment. FIG. 2 is a schematic cross-sectional view illustrating a structure of the liquid crystal device according to the first embodiment taken along line H-H' in FIG. 1. FIG. 3 is an equivalent circuit diagram illustrating an electrical configuration of the liquid crystal device according to the first embodiment.

As illustrated in FIG. 1 and FIG. 2, a liquid crystal device 100 being as an electrooptical device of the embodiment includes a liquid crystal panel 110 including an element substrate 10 and a counter substrate 20 disposed to face each other, and a liquid crystal layer 50 sandwiched between a pair of these substrates. For example, a transparent quartz substrate or glass substrate is used for each of a base material 10s of the element substrate 10 and a base material 20s of the counter substrate 20. The base material 10s included in the element substrate 10 corresponds to the substrate in the present disclosure.

The element substrate 10 has a size larger than the counter substrate 20, and both the substrates are bonded together with a spacing and being intervened by a seal portion 80 disposed along an outer edge of the counter substrate 20. There is a gap in the seal portion 80 and the gap serves as an inlet 81. Liquid crystal is injected from the inlet 81 into the spacing by using a vacuum injection method, and the inlet 81 is sealed with a sealing agent 82. Note that the method of sealing liquid crystal in the above-described spacing is not limited to the vacuum injection method. Thus, for example, it is possible to employ a One Drop Fill (ODF) method, in which liquid crystal are dripped into the inner side of the seal portion 80 disposed in a frame shape, and then the element substrate 10 and the counter substrate 20 are bonded together under a reduced pressure.

As the seal portion 80, for example, an adhesive such as a thermosetting or ultraviolet curable epoxy resin is employed. A spacer (not illustrated) is mingled with the seal portion 80 to keep the spacing between the pair of substrates constant.

A display region E1 in which a plurality of pixels P are arrayed in a matrix pattern is provided at the inner side of the seal portion 80. In addition, in a peripheral area E2 between the seal portion 80 and the display region E1, a partition portion 21 is provided so as to surround the display region E1. The partition portion 21 includes, for example, a metal, an alloy or a metal compound having a light-shielding property.

The element substrate 10 is provided with a terminal portion in which a plurality of external coupling terminals 104 are aligned. A data line drive circuit 101 is provided between a first side portion along the terminal portion and the seal portion 80. In addition, an inspection circuit 103 is provided between the seal portion 80 along a second side portion facing the first side portion and the display region E1. Further, scanning line drive circuits 102 are provided between the seal portion 80 along a third side portion and a fourth side portion orthogonal to the first side portion and facing each other and the display region E1, respectively. Between the seal portion 80 of the second side portion and the inspection circuit 103, a plurality of lines of wiring 105 configured to couple the two scanning line drive circuits 102 are provided.

The wiring (not illustrated) linked to the data line drive circuit 101 and the scanning line drive circuit 102 are coupled to the plurality of external coupling terminals 104 aligned along the first side portion. Note that the arrangement of the inspection circuit 103 is not limited to the above, and may be provided at a position along the inner side of the seal portion 80 between the data line drive circuit 101 and the display region E1.

Hereinafter, descriptions will be given assuming that a direction along the first side portion is an X direction, and a direction along the third side portion is a Y direction. Further, a direction orthogonal to both the X direction and the Y direction and oriented from the element substrate 10 toward the counter substrate 20 is described as a Z direction. Additionally, a view taken along the Z direction from the counter substrate 20 side will be called "plan view".

As illustrated in FIG. 2, a reflective pixel electrode 15 and a thin film transistor (TFT) 30 that is a switching element, provided for each pixel P, a signal wiring, and an alignment film 18 covering these are formed on a surface of the element substrate 10 on the liquid crystal layer 50 side. The thin film transistor 30 is hereinafter referred to as TFT 30. The element substrate 10 includes the base material 10s, and the pixel electrode 15, the TFT 30 being a transistor, the signal wiring, and the alignment film 18 that are arranged on the base material 10s.

The counter substrate 20 disposed facing the element substrate 10 includes the base material 20s, the partition portion 21 formed on the base material 20s, a planarization layer 22 formed covering the partition portion 21, a common electrode 23 that is a transmissive counter electrode covering the planarization layer 22 and being provided so as to at least extend over the display region E1, and an alignment film 24 covering the common electrode 23.

As illustrated in FIG. 1, the partition portion 21 is provided surrounding the display region E1, also at a position planarly overlapping with the scanning line drive circuit 102 and the inspection circuit 103. This causes the partition portion 21 to block light incident on these circuits from the counter substrate 20 side, and to thus serve to prevent these circuits from malfunctioning due to the light. In addition, the partition portion 21 blocks light to prevent unnecessary stray light from being incident on the display region E1, and ensures high contrast in the display of the display region E1.

The planarization layer 22 includes, for example, an inorganic material such as a silicon oxide, has an optical transparency, and is provided to cover the partition portion 21. The planarization layer 22 thus configured may be formed by a film formation method using, for example, a plasma Chemical Vapor Deposit (CVD) method or the like.

The common electrode 23 includes, for example, a transparent conductive film such as an Indium Tin Oxide (ITO) film. The common electrode 23 covers the planarization layer 22 and is electrically coupled to vertical conducting portions 106 provided on the lower two of the four corners of the counter substrate 20, as illustrated in FIG. 1. The vertical conducting portion 106 is electrically coupled to the wiring on the element substrate 10 side.

The alignment film 18 covering the pixel electrode 15 and the alignment film 24 covering the common electrode 23 are selected based on an optical design of the liquid crystal device 100. The alignment films 18 and 24 are, for example, an organic alignment film formed such that an organic material such as polyimide is film formed, and the surface of the film is rubbed to cause the film to be subjected to substantially horizontal alignment treatment with respect to liquid crystal molecules having positive dielectric anisotropy, or an inorganic alignment film formed such that an inorganic material such as SiOx (silicon oxide) is obliquely deposited to cause the film to be subjected to substantially vertical alignment treatment with respect to liquid crystal molecules having negative dielectric anisotropy.

The liquid crystal device 100 thus configured is of a reflective-type, and the design employed is an optical design of a normally white mode in which the reflectance of the pixel P is maximized under a state of voltage being not applied, or a normally black mode in which the reflectance of the pixel P is minimized under a state of voltage being not applied. A polarizing element is disposed on the counter substrate 20 side being the light incidence side of the liquid crystal panel 110, in accordance with the optical design.

In the embodiment, an example is described, in which the optical design of the normally black mode is applied, using the inorganic alignment films described as the alignment films 18 and 24, and a liquid crystal material having negative dielectric anisotropy.

Next, an electrical configuration of the liquid crystal device 100 will be described with reference to FIG. 3. The liquid crystal device 100 includes a plurality of scanning lines 3 and a plurality of data lines 7 as signal wirings insulated from one another and orthogonal to one another at least in the display region E1, and a capacitance line 5 disposed in parallel with the data line 7. The direction in which the scanning line 3 extends is the X direction, and the direction in which the data line 7 extends is the Y direction.

The pixel electrode 15, the TFT 30, and a storage capacitor 40 are provided in each of the regions partitioned by the scanning lines 3, the data lines 7, and the capacitance lines 5, as well as signal lines thereof, where these wirings and components constitute a pixel circuit of the pixel P.

The scanning line 3 is electrically coupled to a gate of the TFT 30, and the data line 7 is electrically coupled to a source of the TFT 30. The pixel electrode 15 is electrically coupled to a drain of the TFT 30.

The data lines 7 coupled to the data line drive circuit 101 (see FIG. 1) supply, to the pixels P, image signals D1, D2, ..., and Dn supplied from the data line drive circuit 101. The scanning lines 3 coupled to the scanning line drive circuit 102 (see FIG. 1) supply, to the pixels P, scanning signals SC1, SC2, ..., and SCm supplied from the scanning line drive circuit 102.

The image signals D1 to Dn supplied from the data line drive circuit 101 to the data lines 7 may be line-sequentially supplied in this order, or may be supplied to the plurality of respective data lines 7 adjacent to each other in groups. The scanning line drive circuit 102 line-sequentially supplies the scan signals SC1 to SCm to the scanning lines 3 in a pulsed manner at predetermined timing.

The liquid crystal device 100 is configured that the TFT 30 as a switching element is turned to be on state only for a certain period by an input of the scan signals SC1 to SCm and thus, the image signals D1 to Dn supplied from the data lines 7 are written in the pixel electrodes 15 at predetermined timing. The image signals D1 to Dn of a predetermined level written into the liquid crystal layer 50 via pixel electrodes 15 are held for a certain period between the pixel electrodes 15 and the common electrode 23, which are arranged to face the pixel electrodes 15 being intervened by the liquid crystal layer 50. The frequency of the image signals D1 to Dn is 60 Hz, for example.

To prevent the image signals D1 to Dn held from leaking, the storage capacitor 40 is coupled in parallel with liquid crystal capacitor formed between the pixel electrode 15 and the common electrode 23. The storage capacitor 40 is provided between the drain of the TFT 30 and the capacitance line 5.

Note that although the inspection circuit 103 illustrated in FIG. 1 is coupled to the data lines 7, and is configured to be capable of detecting the image signals described above to confirm operational defects and the like of the liquid crystal device 100 in a manufacturing process of the liquid crystal device 100, the above configuration is omitted in the equivalent circuit of FIG. 3.

The peripheral circuit configured to drive and control the pixel circuit in the first exemplary embodiment includes the data line drive circuit 101, the scanning line drive circuit 102, and the inspection circuit 103. In addition, the peripheral circuit may include a sampling circuit configured to sample the image signals described above and to supply the image signals to the data lines 7, and a precharge circuit configured to supply precharge signals at predetermined voltage level to the data lines 7 in advance of the supply of the image signals.

Configuration of Pixel

Figure 4:
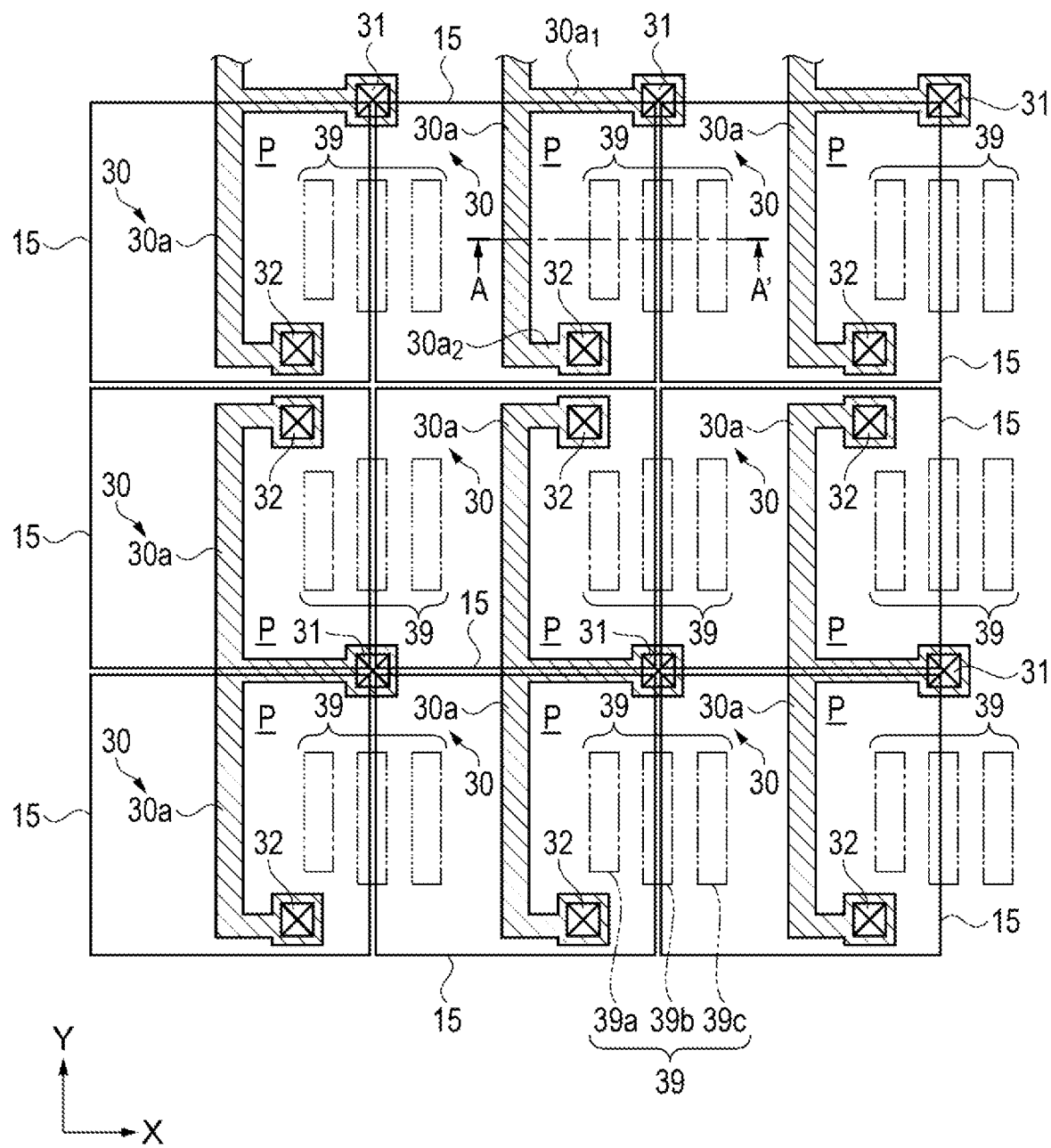
FIG. 4 is a schematic plan view illustrating arrangement of pixel electrodes, a semiconductor layer, and a trench in a pixel of the liquid crystal device of the first embodiment.

Next, the basic configuration of the pixel P will be described with reference to FIG. 4. FIG. 4 is a schematic plan view illustrating arrangement of a pixel electrode, a semiconductor layer, and a trench in a pixel of the liquid crystal device according to the first embodiment.

As illustrated in FIG. 4, the pixel P includes the pixel electrode 15 and a semiconductor layer 30a of the TFT 30 for switching control of the pixel electrode 15. The pixel electrode 15 of the embodiment has a square shape in plan view, and a plurality of the pixel electrodes 15 are arranged to form a matrix. In the matrix, the plurality of the pixel electrodes 15 are arranged at a predetermined arrangement pitch in the X direction and in the Y direction. The arrangement pitch of the pixel electrodes 15 in the embodiment, i.e., the arrangement pitch of the pixels P, is 4 μm, for example.

The semiconductor layer 30a includes a body portion disposed so as to extend, in plan view, over two pixel electrodes 15 adjacent to each other in the Y direction and through the center of the pixel electrodes 15, a first portion $30a_1$ protruding in the X direction from the center of the body portion in the Y direction, and second portions $30a_2$ protruding in the X direction from both ends of the body portion extending in the Y direction. A contact portion 31 configured to electrically couple to the data line 7 is provided at the end of the first portion $30a_1$. A contact portion 32 configured to electrically couple to the pixel electrode 15 is provided at the end of the second portion $30a_2$. In other words, for two pixels P adjacent to each other in the Y direction, the semiconductor layer 30a for the two pixels are continuously disposed so as to share the contact portion 31 configured to electrically couple to the data line 7. In addition, the contact portions 32 configured to electrically couple the semiconductor layer 30a for the two pixels to the pixel electrode 15 are arranged, with respect to the two pixels P adjacent to each other in the Y direction, symmetrically in the Y direction with the first portion $30a_1$ being the symmetrical axis.

Details of the thus-configured wiring structure of the pixel P will be described later. In one of the plurality of interlayer insulating layers on the base material 10s of the element substrate 10, a trench (groove) 39 being a recessed portion in the present disclosure is provided for each pixel P. The trench 39 in the embodiment includes three rectangular grooves 39a, 39b, and 39c elongating in the Y direction in plan view. The three grooves 39a, 39b, and 39c are spaced from each other in the X direction. A dimension in the X direction of each of the three grooves 39a, 39b, and 39c is 400 nm to 500 nm, for example. In addition, out of the three grooves 39a, 39b, and 39c, the groove 39a at the leftmost position in the X direction has a shorter dimension in the Y direction than the other two grooves 39b and 39c. The dimensions of the other two grooves 39b and 39c in the Y direction are 2 µm, for example. Note that the shape of the groove of the trench 39 is defined based on the planar size (area) of the pixel P and the electrical capacitance required for the storage capacitor 40. Thus, for example, the number of grooves is not limited to three.

In each pixel P, the trench 39 is offset from the pixel electrode 15 in the X direction so that the groove 39b being the middle one in the X direction of the three grooves 39a, 39b, and 39c, and a side edge of the pixel electrode 15 extending in the Y direction overlap in plan view.

In the embodiment, in two pixels P adjacent to each other in the Y direction, the semiconductor layer 30a for the two pixels are continuously disposed so as to share a single contact portion 31 and form a symmetrical configuration in the Y direction, and thus, the trench 39 including the three grooves 39a, 39b, and 39c are also disposed symmetrically in the Y direction with the first portion $30a_1$ of the semiconductor layer 30a being the symmetrical axis. As described in detail below, the storage capacitor 40 of the embodiment (see FIG. 3) is disposed for the trench 39 thus configured.

Wiring Structure of Element Substrate

Figure 5:
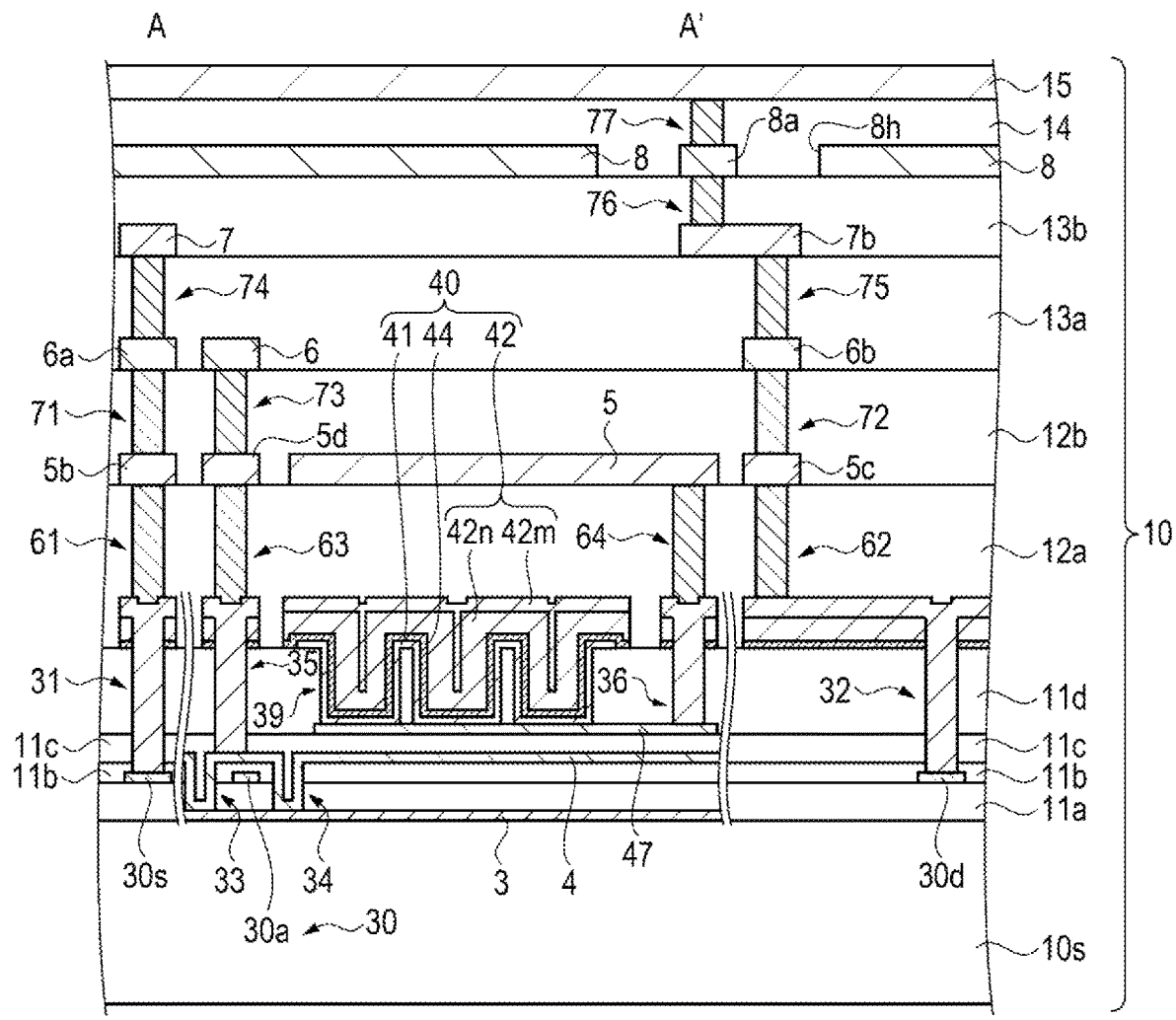
FIG. 5 is a schematic cross-sectional view illustrating a wiring structure of an element substrate in the pixel of the liquid crystal device of the first embodiment taken along line A-A' illustrated in FIG. 4.

Next, a wiring structure of the element substrate 10 will be described with reference to FIG. 5. FIG. 5 is a schematic cross-sectional view illustrating the wiring structure of the element substrate in the pixels of the liquid crystal device of the first embodiment taken along line A-A' illustrated in FIG. 4. Note that line A-A' in FIG. 4 is a line segment crossing the semiconductor layer 30a of the TFT 30 and the trench 39, in the X direction. FIG. 5 illustrates not only a wiring structure of a portion along line A-A' of FIG. 4, but also a wiring structure in which the source region 30a of the semiconductor layer 30a is electrically coupled to the data line 7 and a wiring structure in which the drain region 30d of the semiconductor layer 30a, the storage capacitor 40, and the pixel electrode 15 are electrically coupled.

As illustrated in FIG. 5, the scanning line 3 is firstly formed on the base material 10s made of, for example, a quartz substrate, of the element substrate 10. The scanning line 3 is formed by patterning, by using photolithography method, a thin film made of a high melting point metal such as tungsten (W), tantalum (Ta), molybdenum (Mo), chromium (Cr), and titanium (Ti) whose fusing point exceeds 1000° C., where the thin film is formed by using, for example, a sputtering method, or a thin film made of silicide of a high melting point metal. The scanning line 3 of the embodiment is made of tungsten silicide having a film thickness of, for example, 100 nm (nanometer).

Next, an underlying insulating layer 11a covering the scan line 3 is formed. The underlying insulating layer 11a is formed, for example, by using a silicon oxide film (non-doped silicate glass; NSG film) or a silicon nitride film ($Si_xN_y$ film) in which impurities are intentionally not introduced. The underlying insulating layer 11a of the embodiment is, for example, an NSG film having a film thickness of 200 nm.

Next, the semiconductor layer 30a of the TFT 30 is formed on the underlying insulating layer 11a. The semiconductor layer 30a of the embodiment includes a polysilicon film crystallized by subjecting a thin film of amorphous silicon to thermal treatment at 600° C. for 10 hours or more. Then, the semiconductor layer 30a includes a Lightly Doped Drain (LDD) structure including a channel region formed by selectively injecting impurities into the polysilicon film, a low concentration impurity region being in contact with the channel region, and high concentration impurity regions 30d and 30s being in contact with the low concentration impurity region. Since the data line 7 is electrically coupled to the high concentration impurity region 30s being one of the high concentration impurity regions 30d and 30s, the high concentration impurity region 30s in the semiconductor layer 30a is referred to as the source region 30s. Further, since the pixel electrode 15 is electrically coupled to the high concentration impurity region 30d being the other of the high concentration impurity regions 30d and 30s, the high concentration impurity region 30d in the semiconductor layer 30a is referred to as the drain region 30d. A gate insulating layer 11b covering the semiconductor layer 30a is formed. The gate insulating layer 11b is a silicon oxide film having a film thickness of, for example, 30 nm and formed by, for example, the CVD method or the like.

Next, two through holes reaching the scanning line 3 after passing through the gate insulating layer 11b and the underlying insulating layer 11a are formed at positions sandwiching the semiconductor layer 30a in plan view. A conductive layer covering the gate insulating layer 11b is formed so as to cover the interior of the two through holes, and the conductive layer is patterned to form a second scanning line 4 and a pair of contact holes 33 and 34. As a result, the second scanning line 4 is electrically coupled to the scanning line 3 via the pair of contact holes 33 and 34. A portion of the second scanning line 4 that faces the semiconductor layer 30a via the gate insulating layer 11b functions as a gate electrode in the TFT 30. The conductive layer configuring the second scanning line 4 of the embodiment is formed from a multilayer film in which a thin film made of tungsten silicide is stacked to a thin film made of polysilicon, and the film thickness is, for example, 60 nm to 100 nm.

Next, a first interlayer insulating layer 11c covering the second scanning line 4 is formed. The first interlayer insulating layer 11c is formed so as to substantially cover the TFT 30, and therefore, unevenness is formed on the surface thereof. Therefore, planarization processing such as Chemical Mechanical Polishing (CMP) processing is performed in consideration of a formation state of various types of wirings and electrodes to be formed later. An average film thickness of the first interlayer insulating layer 11c obtained after the planarization processing is, for example, 500 nm.

Next, a conductive layer is formed and patterned on the first interlayer insulating layer 11c to form a relay layer 47. The conductive layer included in the relay layer 47 is formed of, for example, a polysilicon film doped with phosphorus (p), and has a film thickness of 60 nm, for example. A second interlayer insulating layer 11d covering the relay layer 47 is formed. The second interlayer insulating layer 11d of the embodiment is a silicon oxide film having a film thickness of, for example, 1 µm (micrometer) or greater.

Next, the trench 39 reaching the relay layer 47 after passing through the second interlayer insulating layer 11d is formed. The trench 39 is formed to include three grooves 39a, 39b, and 39c (see FIG. 4) as previously described.

Next, a conductive layer is formed so as to cover the trench 39, which is subjected to patterning, to form a first capacitance electrode 41. The conductive layer included in the first capacitance electrode 41 is formed of, for example, a polysilicon film doped with phosphorus (p), and has a film thickness of 50 nm, for example. Then, a capacitance insulating layer 44 and a second capacitance electrode 42 are formed by sequentially stacking and collectively patterning the insulating layer and the conductive layer with respect to the first capacitance electrode 41.

As the insulating layer included in the capacitance insulating layer 44, for example, a silicon nitride film having a film thickness of 20 nm or greater, or a multilayer film formed by stacking a silicon nitride film having a film thickness of 15 nm or greater on a silicon oxide film having a film thickness of 4 nm or greater, may be used.

The conductive layer included in the second capacitance electrode 42 is formed of a polysilicon film doped with phosphorus (p), similarly to the first capacitance electrode 41, and has a film thickness of 350 nm, for example. Note that a conductive polysilicon film having a film thickness of 350 nm is formed in two stages. In other words, the second capacitance electrode 42 is configured of a first conductive layer 42n and a second conductive layer 42m stacked on the first conductive layer 42n.

As a result, the storage capacitor 40 is configured by the first capacitance electrode 41, the capacitance insulating layer 44, and the second capacitance electrode 42, which are sequentially stacked along the trench 39. In view of ensuring an electrical capacitance in the storage capacitor 40, it is desirable that a surface area of the first capacitance electrode 41 and the second capacitance electrode 42 disposed facing each other via the capacitance insulating layer 44 is as large as possible. Therefore, a depth of the trench 39, that is, the film thickness of the second interlayer insulating layer 11d, is preferably 1 μm or greater. Additionally, the trench 39 preferably includes a plurality of grooves rather than one groove.

In the embodiment, in the formation process of such a storage capacitor 40, the contact portion 31 configured to electrically couple the source region 30s of the semiconductor layer 30a and the data line 7, the contact portion 32 configured to electrically couple the drain region 30d of the semiconductor layer 30a, the second capacitance electrode 42, and the pixel electrode 15, a contact portion 35 configured to electrically couple the gate electrode of the TFT 30 and the third scanning line 6, and a contact portion 36 configured to electrically couple the relay layer 47 and the capacitance line 5 are simultaneously formed. A method of forming the storage capacitor 40 and the four contact portions 31, 32, 35, and 36 will be described detail later. Any of the four contact portions 31, 32, 35, and 36 is formed in a plug shape by using the second conductive layer 42m included in the second capacitance electrode 42 of the storage capacitor 40.

In the embodiment, the contact portion 31 is an example of a second contact portion configured to electrically couple a semiconductor layer and a data line in the electrooptical device of the present disclosure. The contact portion 32 is an example of a first contact portion configured to electrically couple the semiconductor layer and a pixel electrode in the electrooptical device of the present disclosure. The contact portion 35 is an example of a third contact portion configured to electrically couple a gate electrode of a transistor and a scanning line in the electrooptical device of the present disclosure.

Next, a third interlayer insulating layer 12a covering the storage capacitor 40 and the contact portions 31, 32, 35, and 36 is formed. When the storage capacitor 40 and the contact portions 31, 32, 35, and 36, are covered, unevenness is formed on the surface of the third interlayer insulating layer 12a, and therefore, planarization processing such as CMP processing is performed to alleviate the unevenness. The third interlayer insulating layer 12a is formed of, for example, a silicon oxide film, and has an average film thickness of 800 nm, for example, which is obtained after the planarization processing.

Next, a total of four through holes reaching respectively the contact portions 31, 32, 35, and 36 after passing through the third interlayer insulating layer 12a are formed, and a conductive layer to fill the four through holes is formed and patterned to form contact portions 61, 62, 63, and 64. The conductive layer is, for example, made of tungsten, and the contact portions 61, 62, 63, and 64 are tungsten plugs. Then, a low resistance conductive layer covering the third interlayer insulating layer 12a is formed and patterned to form the capacitance line 5 and relay layers 5b, 5c, and 5d. The low resistance conductive layer is obtained, for example, by stacking an aluminum (Al) film having a film thickness of 150 nm or greater on a titanium nitride (TiN) film having a film thickness of 20 nm or greater. As a result, the relay layer 5b is coupled to the contact portion 31 via the contact portion 61. The relay layer 5c is coupled to the contact portion 32 via the contact portion 62. The relay layer 5d is coupled to the contact portion 35 via the contact portion 63. The capacitance line 5 is coupled to the contact portion 36 via the contact portion 64. That is, the first capacitance electrode 41 formed so as to contact the relay layer 47 at the bottom of the trench 39 is electrically coupled to the capacitance line 5 via the relay layer 47 and the two contact portions 36 and 64.

Next, a fourth interlayer insulating layer 12b covering the capacitance line 5 and the relay layers 5b, 5c, and 5d is formed. When the capacitance line 5 and the relay layers 5b, 5c, and 5d are covered, unevenness is formed on the surface of the fourth interlayer insulating layer 12b, and therefore, planarization processing such as CMP processing is performed to alleviate the unevenness. The fourth interlayer insulating layer 12b is formed of, for example, a silicon oxide film, and has an average film thickness of 800 nm, for example, which is obtained after the planarization processing.

Next, three through holes reaching respectively the relay layers 5b, 5c, and 5d after passing through the fourth interlayer insulating layer 12b are formed, and a conductive layer to fill the three through holes is formed and patterned to form contact portions 71, 72, and 73. The conductive layer is made of, for example, tungsten, and the contact portions 71, 72, and 73 are also tungsten plugs. Then, a low resistance conductive layer covering the fourth interlayer insulating layer 12b is formed and patterned to form the third scanning line 6 and relay layers 6a and 6b. The low resistance conductive layer is obtained, for example, by stacking an aluminum (Al) film having a film thickness of 300 nm or greater on a titanium nitride (TiN) film having a film thickness of 20 nm or greater. As a result, the relay layer 6a is coupled to the relay layer 5b via the contact portion 71. The relay layer 6b is coupled to the relay layer 5c via the contact portion 72. The third scanning line 6 is coupled to the relay layer 5d via the contact portion 73. That is, the third scanning line 6 is electrically coupled to the second scanning line 4 via the contact portion 73, the relay layer 5d, the contact portion 63, and the contact portion 35.

Next, a fifth interlayer insulating layer 13a covering the third scanning line 6 and the relay layers 6a and 6b is formed. When the third scanning line 6 and the relay layers 6a and 6b are covered, unevenness is formed on the surface of the fifth interlayer insulating layer 13a, and therefore, planarization processing such as CMP processing is performed to alleviate the unevenness. The fifth interlayer insulating layer 13a is formed of, for example, a silicon oxide film, and has an average film thickness of 800 nm, for example, which is obtained after the planarization processing.

Next, two through holes reaching respectively the relay layers 6a and 6b after passing through the fifth interlayer insulating layer 13a are formed, and a conductive layer to fill the two through holes is formed and patterned to form contact portions 74 and 75. The conductive layer is made of, for example, tungsten, and the contact portions 74 and 75 are also tungsten plugs. Then, a low resistance conductive layer covering the fifth interlayer insulating layer 13a is formed and patterned to form the data line 7 and a relay layer 7b. The low resistance conductive layer is obtained, for example, by stacking an aluminum (Al) film having a film thickness of 300 nm or greater on a titanium nitride (TiN) film having a film thickness of 20 nm or greater. As a result, the data line 7 is electrically coupled to the source region 30s of the semiconductor layer 30a via the contact portion 74, the relay layer 6a, the contact portion 71, the relay layer 5b, the contact portion 61, and the contact portion 31.

Next, a sixth interlayer insulating layer 13b covering the data line 7 and the relay layer 7b is formed. When the data line 7 and the relay layer 7b are covered, unevenness is formed on the surface of the sixth interlayer insulating layer 13b, and therefore, planarization processing such as CMP processing is performed to alleviate the unevenness. The sixth interlayer insulating layer 13b is formed of, for example, a silicon oxide film, and has an average film thickness of 800 nm, for example, which is obtained after the planarization processing.

Next, a through hole reaching the relay layer 7b after passing through the sixth interlayer insulating layer 13b is formed, and a conductive layer to fill the through hole is formed and patterned to form a contact portion 76. The conductive layer is made of, for example, tungsten, and the contact portion 76 is also a tungsten plug. Then, a low resistance conductive layer covering the sixth interlayer insulating layer 13b is formed and patterned to form a common potential line 8 and a relay layer 8a. The relay layer 8a is formed in an island shape inside an opening 8h formed in the common potential line 8. The low resistance conductive layer is obtained, for example, by stacking an aluminum (Al) film having a film thickness of 150 nm or greater on a titanium nitride (TiN) film having a film thickness of 20 nm or greater. As a result, the relay layer 8a is coupled to the relay layer 7b via the contact portion 76.

Next, a seventh interlayer insulating layer 14 covering the common potential line 8 and relay layer 8a is formed. When the common potential line 8 and the relay layer 8a are covered, unevenness is formed on the surface of the seventh interlayer insulating layer 14, and therefore, planarization processing such as CMP processing is performed to alleviate the unevenness. The seventh interlayer insulating layer 14 is formed of, for example, a silicon oxide film, and has an average film thickness of 800 nm, for example, which is obtained after the planarization processing.

Next, a through hole reaching the relay layer 8a after passing through the seventh interlayer insulating layer 14 is formed, and a conductive layer to fill the through hole is formed and patterned to form a contact portion 77. The conductive layer is made of, for example, tungsten, and the contact portion 77 is also a tungsten plug. Then, a low resistance conductive layer covering the seventh interlayer insulating layer 14 is formed and patterned to form the pixel electrode 15 having light reflectivity. The low resistance conductive layer is obtained, for example, by stacking an aluminum (Al) film having a film thickness of 150 nm or greater on a titanium nitride (TiN) film having a film thickness of 20 nm or greater. Thus, the pixel electrode 15 is coupled to the drain region 30d of the semiconductor layer 30a via the contact portion 77, the relay layer 8a, the contact portion 76, the relay layer 7b, the contact portion 75, the relay layer 6b, the contact portion 72, the relay layer 5c, the contact portion 62, and the contact portion 32.

As described above, on the base material 10s, the element substrate 10 includes the scanning line 3, the semiconductor layer 30a, the second scanning line 4, the relay layer 47 and the storage capacitor 40, the capacitance line 5, the third scanning line 6, the data line 7, the common potential line 8, the pixel electrode 15, and a plurality of wiring layers formed with relay layers for the coupling of these electrical configurations. These electrical configurations and specific arrangements of the relay layers in each of the wiring layers will be described below.

Electrical Configuration and Arrangement of Relay Layers in Each Wiring Layer

The electrical configuration and the arrangement of the relay layers including the contact portions, of each of the wiring layers in the element substrate 10 will be described with reference to FIG. 6 to FIG. 18. Note that except for FIG. 10 to FIG. 13, in FIG. 6 to FIG. 18, a regions sectioned with dashed lines extending in the X direction and in the Y direction indicates a pixel P region.

Figure 6:
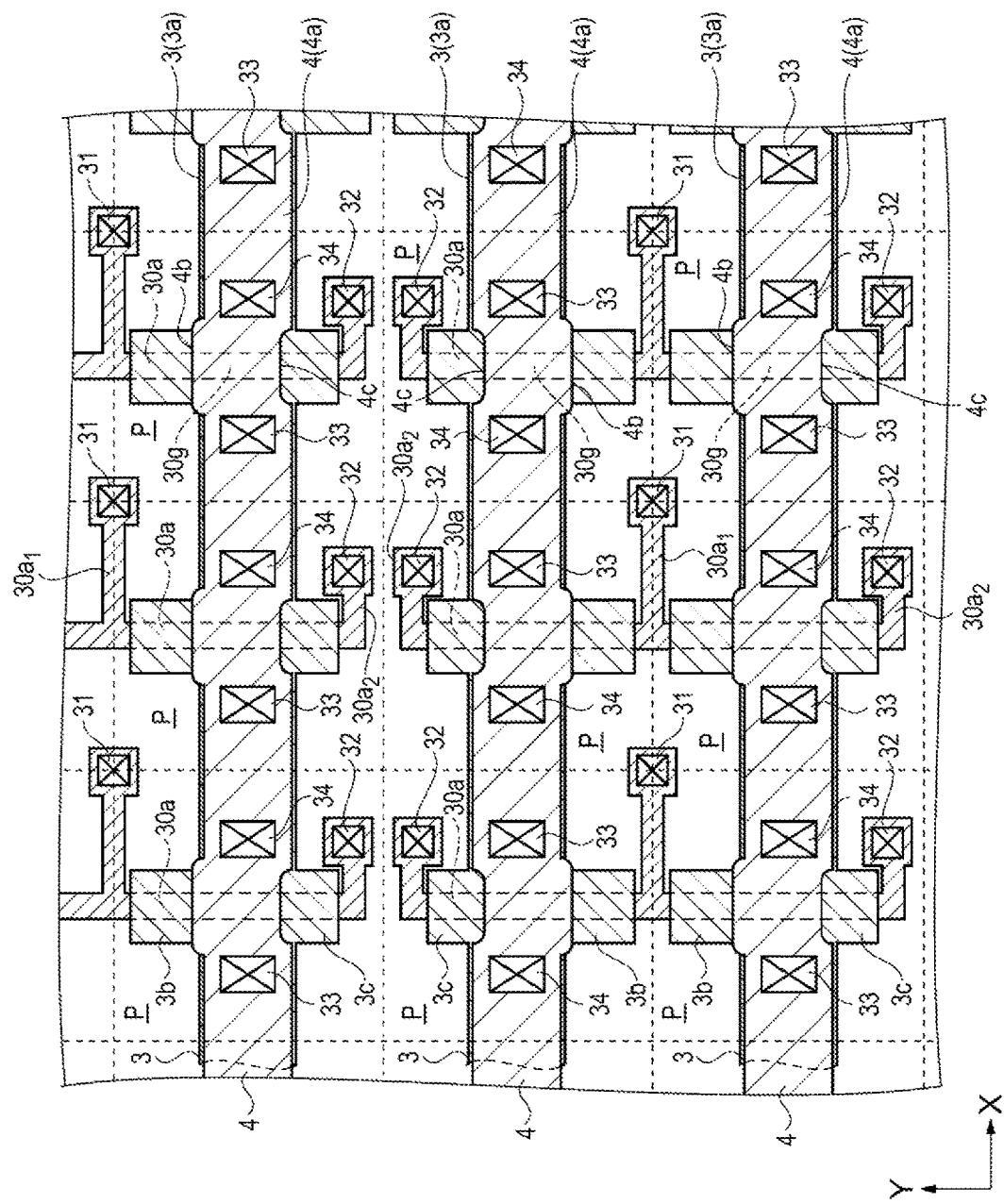
FIG. 6 is a schematic plan view illustrating arrangement of a scanning line, the semiconductor layer, and a second scanning line of the first embodiment.

FIG. 6 is a schematic plan view illustrating arrangement of the scanning line, the semiconductor layer, and the second scanning line of the first embodiment. More specifically, in FIG. 6, the wiring layer on which the scanning line 3 is disposed, the wiring layer on which the semiconductor layer 30a is disposed, and the wiring layer on which the second scanning line 4 is disposed are illustrated in an overlapped manner.

As illustrated in FIG. 6, the scanning line 3 includes a main line portion 3a extending in the X direction, and protruding portions 3b and 3c protruding in the Y direction from the main line portion 3a. A plurality of the protruding portions 3b and 3c are disposed in parallel in the X direction with the same arrangement pitch as the pixel pitch with respect to the main line portion 3a. A width of the main line portion 3a in the Y direction and a width of the protruding portions 3b and 3c in the X direction are the same. The lengths of the protruding portion 3b and the protruding portion 3c in the Y direction, which protrude from the main line portion 3a, are the same.

As described above, the semiconductor layer 30a includes a main body portion disposed so as to span two pixels P adjacent to each other in the Y direction in plan view, a first portion $30a_1$ protruding in the X direction from a center of the main body portion in the Y direction, and a second portion $30a_2$ protruding in the X direction from both end sides of the main body portion extending in the Y direction. The contact portion 31 configured to electrically couple to the data line 7 is provided at the end of the first portion $30a_1$. The contact portion 32 configured to electrically couple to the pixel electrode 15 is provided at the end of the second portion $30a_2$. The main body portion of the semiconductor layer 30a is disposed so as to overlap the protruding portions 3b and 3c of the scanning line 3 in plan view.

The second scanning line 4 includes a main line portion 4a arranged to extend in the X direction so as to overlap with the main line portion 3a of the scanning line 3 in plan view, a protruding portion 4b protruding slightly in the Y direction from the main line portion 4a, and a recessed portion 4c obtained as a result of the main line portion 4a being slightly recessed in the Y direction on the opposite side of the protruding portion 4b. The protruding portion 4b includes a plurality of protruding portion 4b to be disposed in parallel in the X direction with the same arrangement pitch as the pixel pitch with respect to the main line portion 4a. In other words, each of the protruding portions 4b of the second scanning line 4 overlaps with the protruding portion 3b of the scanning line 3 in plan view. A portion overlapping with the semiconductor layer 30a, out of the main line portion 4a of the second scanning line 4 functions as the gate electrode 30g in the TFT 30. In addition, a pair of contact holes 33 and 34 configured to electrically couple the scanning line 3 and the second scanning line 4 are provided on both sides sandwiching the semiconductor layer 30a in the X direction. A pair of contact holes 33 and 34 are provided for each pixel P.

Figure 7:
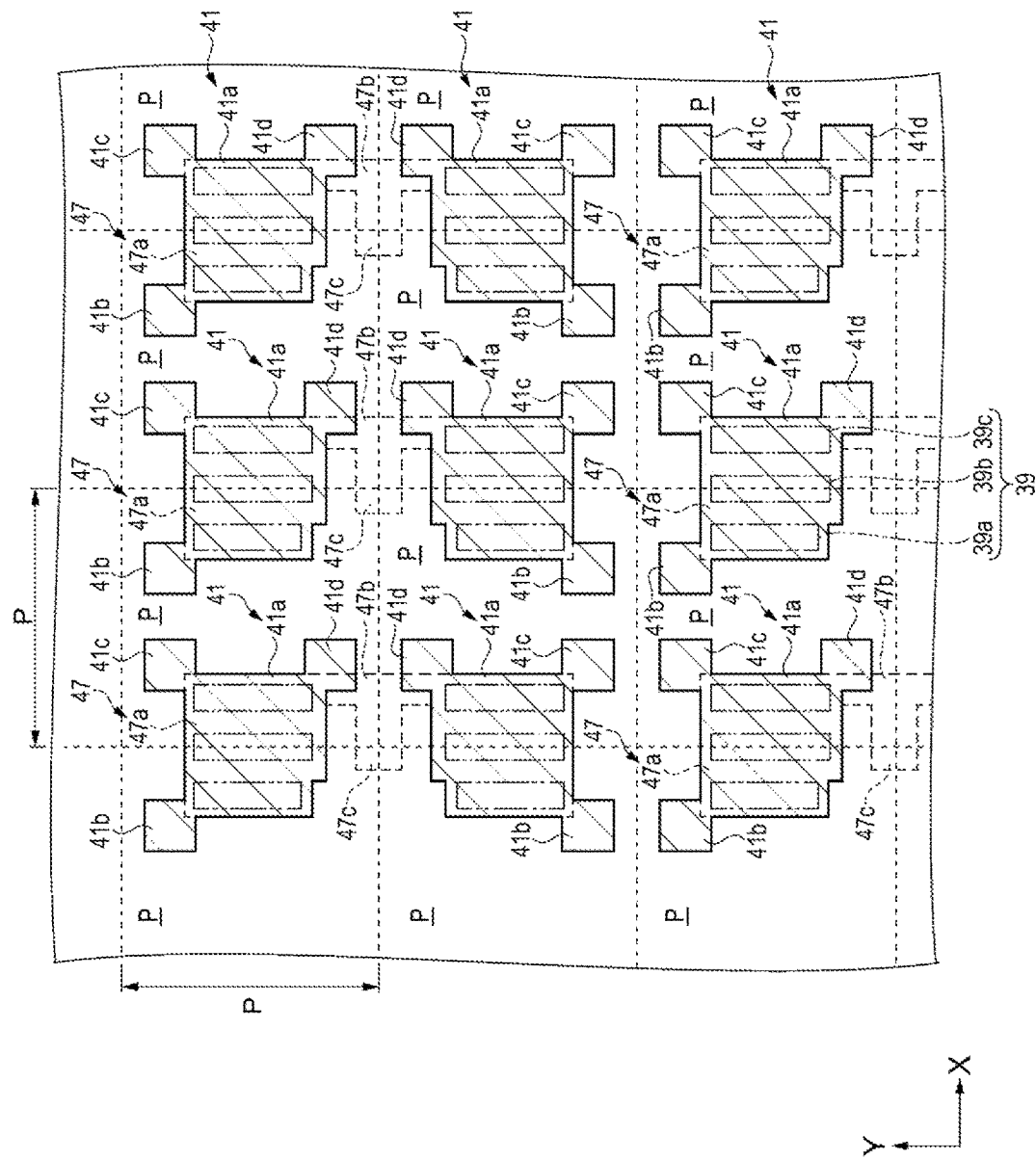
FIG. 7 is a schematic plan view illustrating arrangement of a relay layer and a first capacitance electrode with respect to the trench of the first embodiment.

FIG. 7 is a schematic plan view illustrating arrangement of the relay layer and the first capacitance electrode with respect to the trench of the first embodiment.

As illustrated in FIG. 7, the relay layer 47 is disposed so as to be shared by two pixels P adjacent to each other in the Y direction. Specifically, the relay layer 47 includes a main body portion 47a overlapping in plan view with the trench 39 in each of two pixels P adjacent to each other in the Y direction, a coupling portion 47b to couple the two main body portions 47a, and a protruding portion 47c protruding in the X direction from the coupling portion 47b. The main body portions 47a are provided symmetrically in the Y direction and correspondingly to the two pixels P adjacent to each other in the Y direction. The protruding portion 47c is provided so as to overlap, in plan view, with a boundary along the X direction of the two pixels P adjacent to each other in the Y direction.

The first capacitance electrode 41 is disposed electrically independently of each other in the two pixels P adjacent to each other in the Y direction, and is disposed symmetrically in the Y direction. Specifically, the first capacitance electrode 41 includes a substantially rectangular main body portion 41a overlapping with the trench 39 in plan view, and protruding portions 41b, 41c, and 41d protruding from three corners of four corners of the main body portion 41a. Shapes of the protruding portions 41b, 41c, and 41d are also rectangular (square). Not only the main body portion 41 overlapping with the trench 39 but also the three protruding portions 41b, 41c, and 41d are provided to ensure a surface area of the first capacitance electrode 41.

Figure 8:
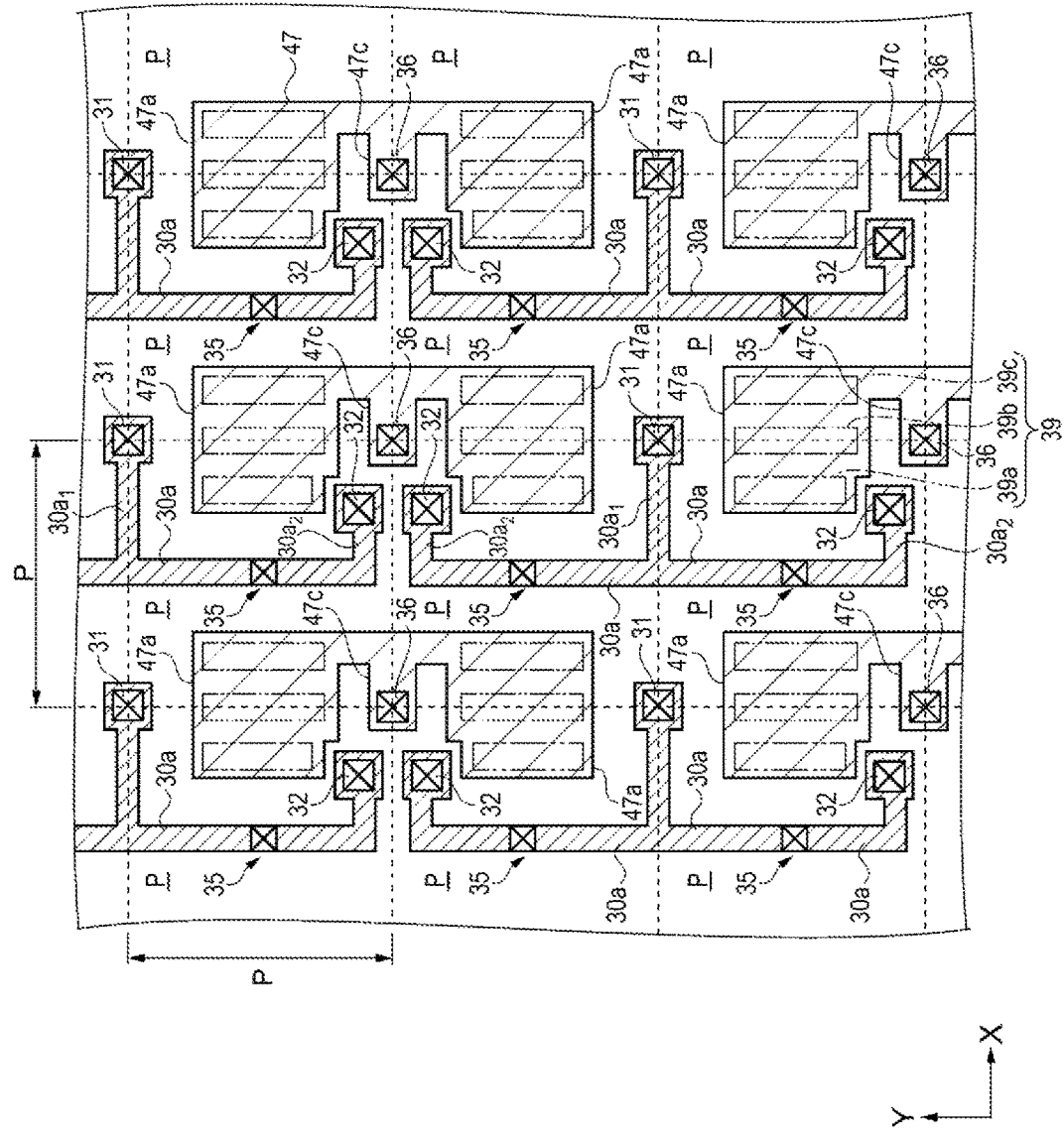
FIG. 8 is a schematic plan view illustrating arrangement of four contact portions relating to the semiconductor layer and the relay layer of the first embodiment.

FIG. 8 is a schematic plan view illustrating arrangement of four contact portions relating to the semiconductor layer and the relay layer of the first embodiment. Note that in FIG. 8, illustration of the first capacitance electrode 41 illustrated in FIG. 7 is omitted. As illustrated in FIG. 8, the contact portion 31 configured to electrically couple the semiconductor layer 30a and the data line 7 is provided at an end of the first portion $30a_1$ being one portion of the semiconductor layer 30a extending in the X direction. The contact portion 32 configured to electrically couple the semiconductor layer 30a, the second capacitance electrode 42, and the pixel electrode 15 is provided at an end of a second portion $30a_2$ of being another portion the semiconductor layer 30a extending in the X direction. The contact portion 35 configured to electrically couple the second scanning line 4 and the third scanning line 6 is provided at a position overlapping with the main body portion of the semiconductor layer 30a extending in the Y direction. The contact portion 36 configured to electrically couple the relay layer 47 and the capacitance line 5 is provided at an end of the protruding portion 47c of the relay layer 47.

Figure 9:
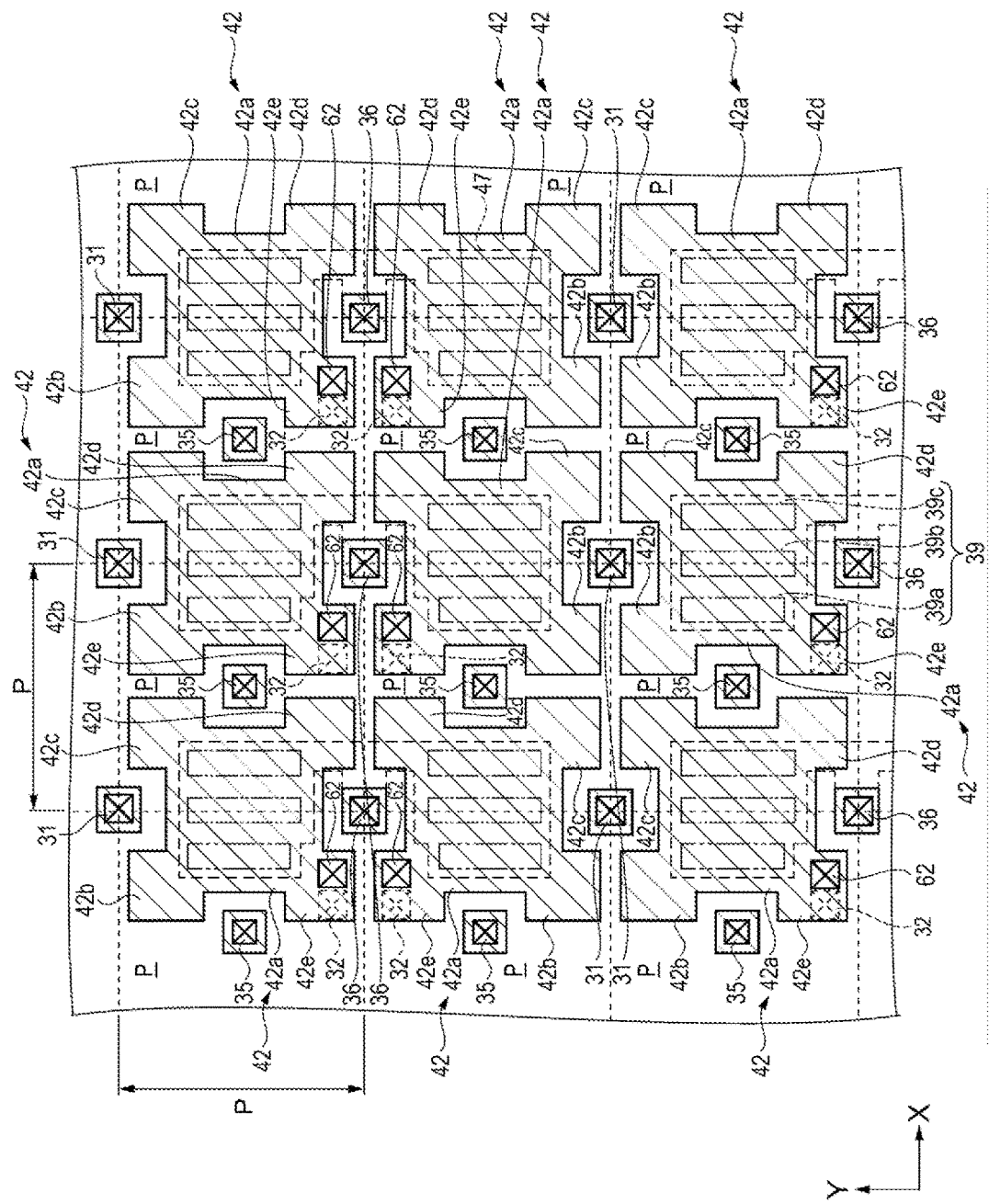
FIG. 9 is a schematic plan view illustrating arrangement of a second capacitance electrode and the relay layer of the first embodiment.

FIG. 9 is a schematic plan view illustrating arrangement of the second capacitance electrode and the relay layer of the first embodiment.

As illustrated in FIG. 9, the second capacitance electrode 42 is electrically independently disposed for each pixel P. Specifically, the second capacitance electrode 42 includes a substantially rectangular main body portion 42a overlapping with the trench 39 in plan view, and protruding portions 42b, 42c, 42d, and 42e protruding from four corners of the main body portion 42a. Shapes of the protruding portions 42b, 42c, 42d, and 42e are also rectangular (square). Not only the main body portion 42a overlapping with the trench 39 but also the four protruding portions 42b, 42c, 42d, and 42e are provided to increase a surface area of the second capacitance electrode 42. Note that the second capacitance electrode 42 is formed to overlap with the first capacitance electrode 41 illustrated in FIG. 7, and three protruding portions 42b, 42c, and 42d of the four protruding portions 42b, 42c, 42d, and 42e overlap in plan view with the three protruding portions 41b, 41c, and 41d of the first capacitance electrode 41.

On the boundary of the pixel P along the X direction, the contact portion 31 is provided in an island shape between the protruding portion 42b and the protruding portion 42c, and the contact portion 36 is provided in an island shape between the protruding portion 42d and the protruding portion 42e. On the boundary of the pixel P along the Y direction, the contact portion 35 is provided in an island shape between the protruding portion 42b and the protruding portion 42e. In addition, the contact portion 32 is provided in the protruding portion 42e, and the contact portion 62 configured to electrically couple with the below-described relay layer 5c is in contact with the protruding portion 42e.

FIG. 10 to FIG. 13 are schematic cross-sectional views illustrating a method of forming four contact portions relating to a thin film transistor (TFT) and a storage capacitor of the first embodiment. The method of forming the four contact portions 31, 32, 35, and 36 will be specifically described with reference to FIG. 10 to FIG. 13.

Figure 10:
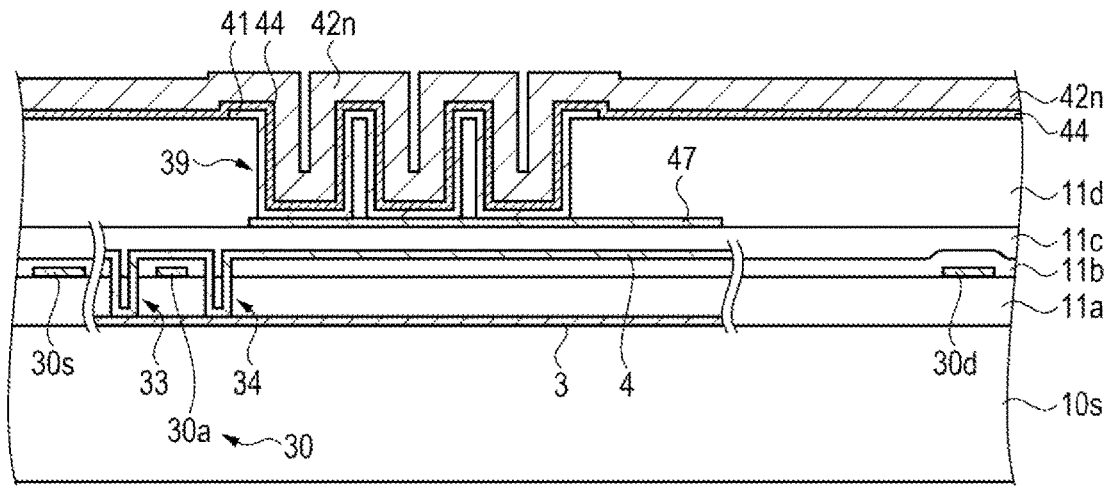
FIG. 10 is a schematic cross-sectional view illustrating a method of forming four contact portions relating to a thin film transistor (TFT) and a storage capacitor of the first embodiment.

As illustrated in FIG. 10, first, for example, a dry etching method is used to form the trench 39 including three grooves reaching the relay layer 47 after passing through the second interlayer insulating layer 11d. The relay layer 47 located at the boundary between the first interlayer insulating layer 11c and the second interlayer insulating layer 11d functions as a stopper layer during the dry etching. Then, a conductive polysilicon film is formed and patterned to cover the inside of the three grooves to form the first capacitance electrode 41. A film thickness of the first capacitance electrode 41 covering side walls and bottoms of the three grooves is preferably as thin as possible, and in the embodiment, is approximately 50 nm. Next, the capacitance insulating layer 44 having a film thickness of, for example, approximately 20 nm is formed so as to cover the first capacitance electrode 41. As described above, a silicon nitride film or a layered film formed by stacking a silicon oxide film and a silicon nitride film is used as the capacitance insulating layer 44. Next, the first conductive layer 42n of the second capacitance electrode 42 is stacking so as to cover the capacitance insulating layer 44, the first conductive layer 42n being formed of the conductive polysilicon film. A film thickness of the first conductive layer 42n is 50 nm, for example.

Figure 11:
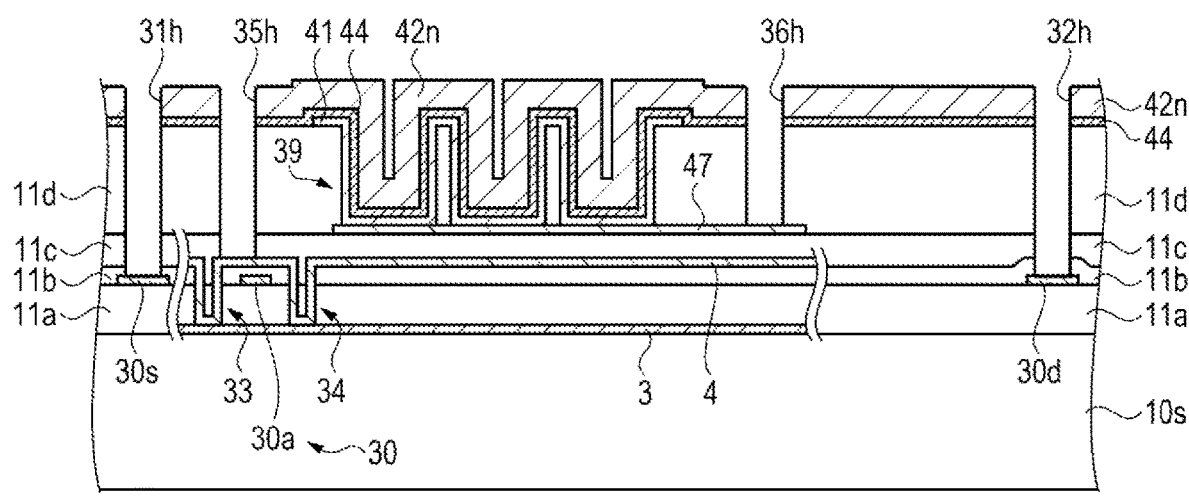
FIG. 11 is a schematic cross-sectional view illustrating the method of forming the four contact portions relating to the thin film transistor (TFT) and the storage capacitor of the first embodiment.

Next, as illustrated in FIG. 11, a dry etching method is used to form a first through hole 31h reaching the source region 30s after passing through the first conductive layer 42n, the capacitance insulating layer 44, the second interlayer insulating layer 11d, the first interlayer insulating layer 11c, and the gate insulating layer 11b, and a second through hole 32h reaching the drain region 30d. Furthermore, a third through hole 35h reaching the second scanning line 4 after passing through the first conductive layer 42n, the capacitance insulating layer 44, the second interlayer insulating layer 11d, and the first interlayer insulating layer 11c, and a fourth through hole 36h reaching the relay layer 47 after passing through the first conductive layer 42n, the capacitance insulating layer 44, and the second interlayer insulating layer 11d are formed. A diameter of each of the first through hole 31h to the fourth through hole 36h is, for example, φ0.2 μm or greater. Then, a dilute hydrofluoric acid treatment is applied to the surfaces of the source region 30s, the drain region 30d, the second scanning line 4, and the relay layer 47. The dilute hydrofluoric acid treatment removes, with dilute hydrofluoric acid, natural oxide films formed by naturally oxidizing the surfaces of the source region 30s, the drain region 30d, the second scanning line 4, and the relay layer 47, exposed at the bottom of these through holes. During the dilute hydrofluoric acid treatment, the capacitance insulating layer 44 is covered by the first conductive layer 42n, so that it is possible to prevent defects such as erosion of the capacitance insulating layer 44 with the dilute hydrofluoric acid. On the second interlayer insulating layer 11d, a side wall formed of the capacitance insulating layer 44 and the first conductive layer 42n is formed around the through holes.

Figure 12:
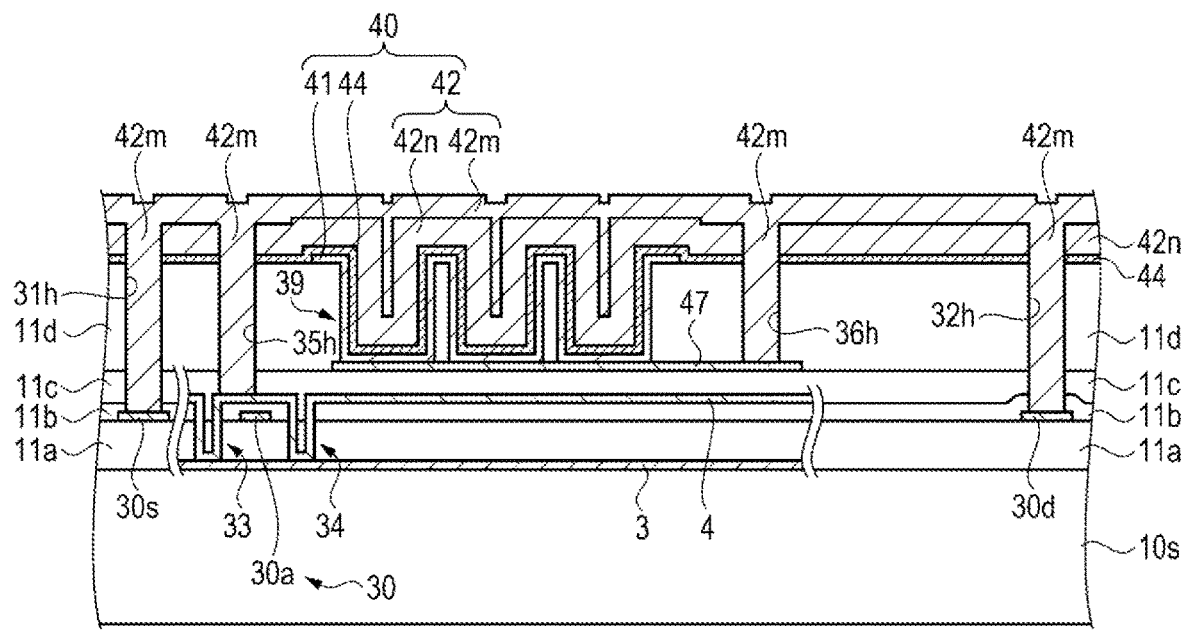
FIG. 12 is a schematic cross-sectional view illustrating the method of forming the four contact portions relating to the thin film transistor (TFT) and the storage capacitor of the first embodiment.

Next, as illustrated in FIG. 12, the first through hole 31h, the second through hole 32h, the third through hole 35h, and the fourth through hole 36h are filled, and a second conductive layer 42m covering the first conductive layer 42n is formed. The second conductive layer 42m is formed of a conductive polysilicon film, similarly to the first conductive layer 42n, and has a film thickness of 300 nm or greater, for example.

Figure 13:
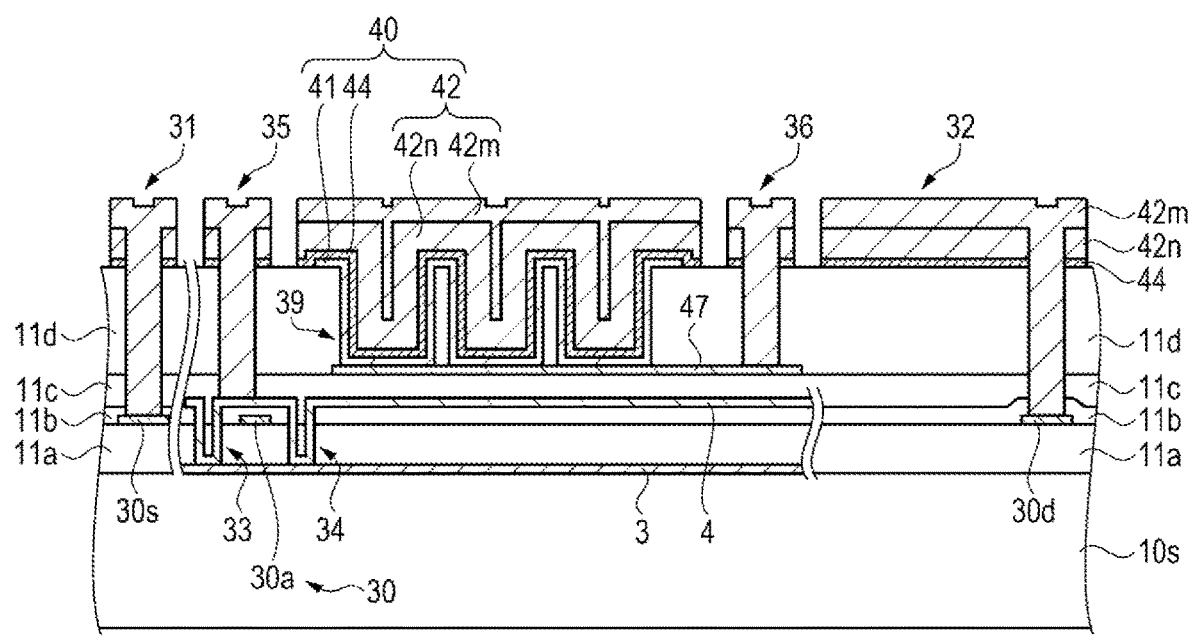
FIG. 13 is a schematic cross-sectional view illustrating the method of forming the four contact portions relating to the thin film transistor (TFT) and the storage capacitor of the first embodiment.

Next, as illustrated in FIG. 13, a layered film of the capacitance insulating layer 44, the first conductive layer 42n, and the second conductive layer 42m is patterned by being dry etched at once, and the storage capacitor 40 and the four contact portions 31, 32, 35, and 36 are formed simultaneously. An etching gas used during dry etching at once can include a mixed gas of hydrogen bromide (HBr) and chlorine (Cl). In addition, after the dry etching at once, the surface is oxidized under a dry atmosphere or under a wet atmosphere in order to prevent the storage capacitor 40 and the four contact portions 31, 32, 35, and 36 from being electrically short-circuited with each other. Examples thereof under a dry atmosphere include oxidation treatments in which the surface is heated to 900° C. or higher in a dried atmosphere, and left for 10 minutes or longer. As a result, plug-shaped contact portions 31, 32, 35, and 36 electrically coupled to each of the source region 30s, the drain region 30d, the second scanning line 4 (the gate electrode), and the relay layer 47 are formed in the same layer as the second conductive layer 42m. The contact portion 31 is configured of the second conductive layer 42m of the second capacitance electrode 42 and is provided so as to be in contact with the source region 30s of the semiconductor layer 30a of the TFT 30. Further, the contact portion 32 is configured of the second conductive layer 42m of the second capacitance electrode 42 and is provided so as to be in contact with the drain region 30d of the semiconductor layer 30a of the TFT 30. The contact portion 35 is configured of the second conductive layer 42m of the second capacitance electrode 42 and is provided so as to be in contact with the second scanning line 4 that functions as the gate electrode of the TFT 30. The contact portion 36 is configured of the second conductive layer 42m of the second capacitance electrode 42 and is provided so as to be in contact with the relay layer 47.

As described above, among the four contact portions 31, 32, 35, and 36, the contact portion 32 configured to electrically couple the drain region 30d of the semiconductor layer 30a to the second capacitance electrode 42 and the pixel electrode 15 is an example of a first contact portion of the electrooptical device of the present disclosure. In addition, the contact portion 31 configured to electrically couple the source region 30s of the semiconductor layer 30a and the data line 7 is an example of a second contact portion of the electrooptical device of the present disclosure. Furthermore, the contact portion 35 configured to electrically couple the second scanning line 4 (gate electrode) and the third scanning line 6 is an example of a third contact portion of the electrooptical device of the present disclosure.

That is, the contact portions 31, 32, and 35 are configured by using the second conductive layer 42m, and are provided on a side wall and at an inside of the side wall formed from the capacitance insulating layer 44 and the first conductive layer 42n of the second capacitance electrode 42.

Figure 14:
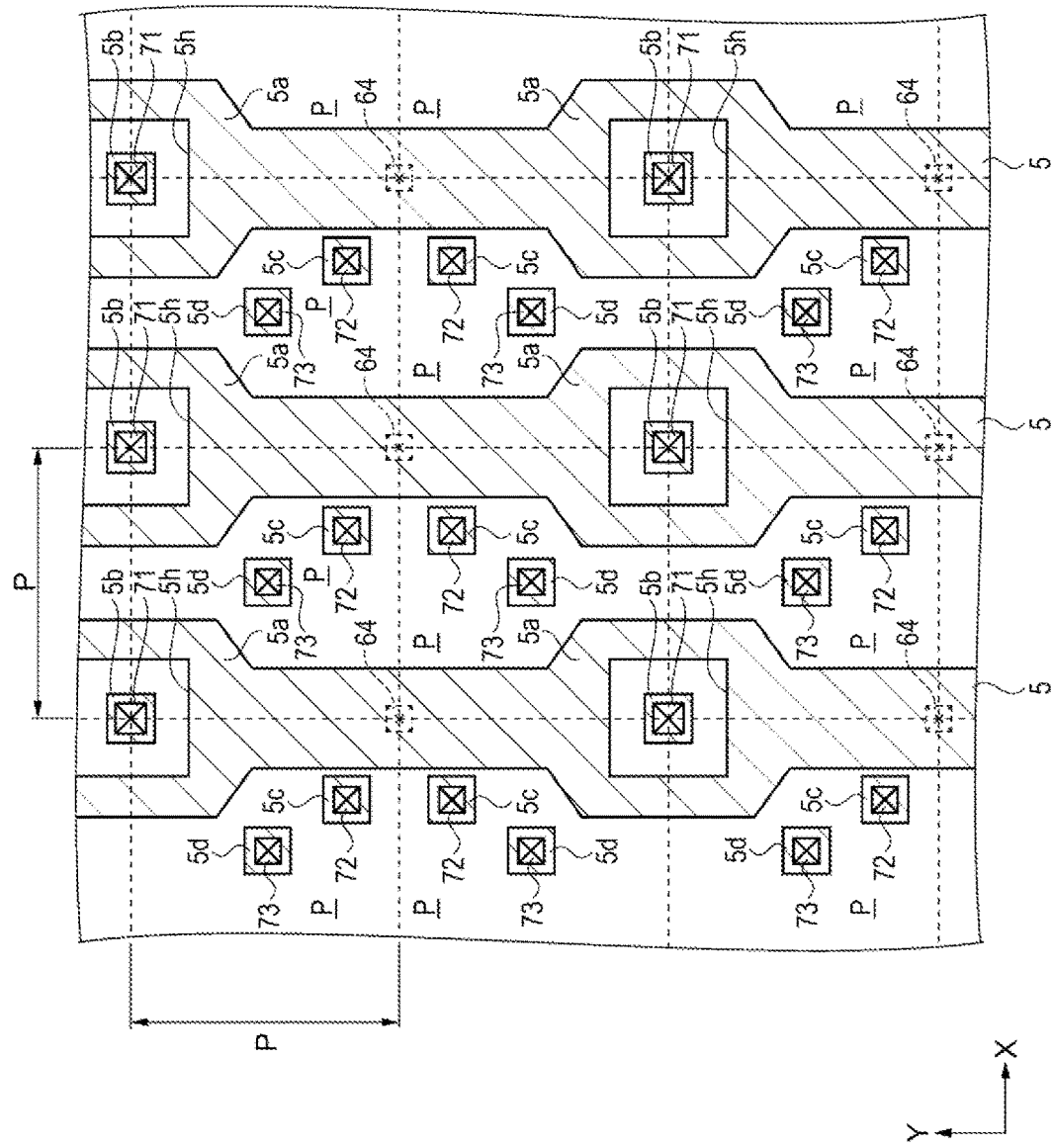
FIG. 14 is a schematic plan view illustrating arrangement of capacitance lines and the relay layer of the first embodiment.

Next, the arrangement of the electrical configuration in each of the wiring layers will be described. FIG. 14 is a schematic plan view illustrating arrangement of capacitance lines and the relay layers of the first embodiment.

As illustrated in FIG. 14, the capacitance line 5 extends in the Y direction so as to overlap with a side of the pixel P along the Y direction in plan view. The capacitance line 5 includes an extended portion 5a with a width in the X direction extended at a position overlapping with one side of the pixel P along the X direction. An outer shape of the extended portion 5a is substantially hexagonal, and an opening 5h having a substantially rectangular outer shape is formed in a center of the extended portion 5a. The relay layer 5b is disposed in a center of the opening 5h. The extended portion 5a in which the opening 5h is formed in the capacitance line 5 is disposed symmetrically in the Y direction, in the two pixels P adjacent to each other in the Y direction. The relay layer 5c is disposed at a position along the capacitance line 5 extending in the Y direction. In addition, the relay layer 5d is disposed in a center of the pixel P between the capacitance lines 5 arranged next to each other in the X direction. The capacitance line 5 and the three relay layers 5b, 5c, and 5d are provided in the same layer (see FIG. 5). The relay layer 5b is disposed at a position overlapping with two corners adjacent to each other in the X direction, out of the four corners of the pixel P, and the contact portion 64 configured to electrically couple the capacitance line 5 and the contact portion 36 (see FIG. 5) is disposed at a position overlapping with the other two corners adjacent to each other in the X direction. The contact portion 71 configured to electrically couple the relay layer 5b and the relay layer 6a is disposed in the relay layer 5b. The contact portion 72 configured to electrically couple the relay layer 5c and the relay layer 6b is disposed in the relay layer 5c. The contact portion 73 configured to electrically couple the relay layer 5d and the third scanning line 6 is disposed in the relay layer 5d.

Figure 15:
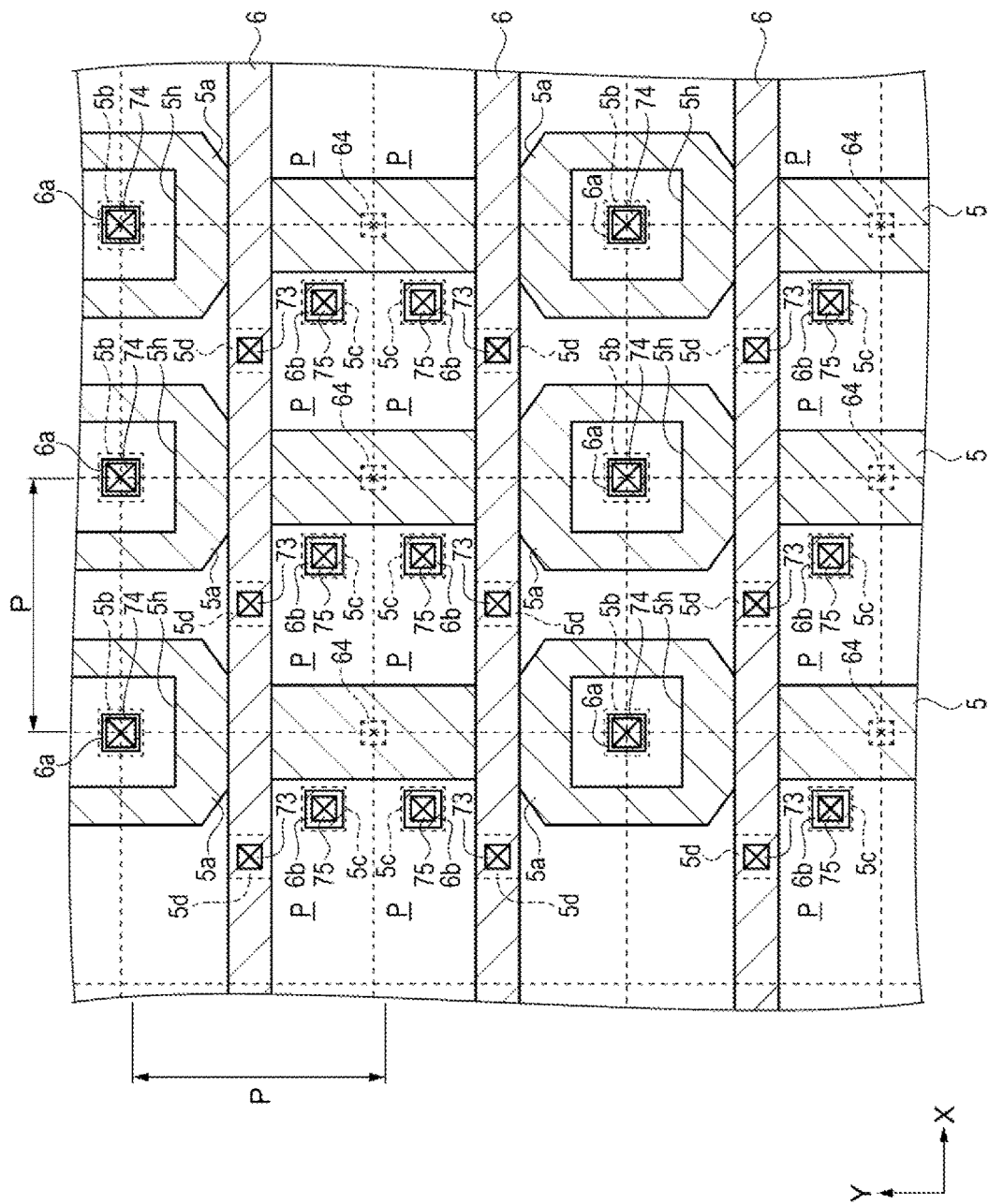
FIG. 15 is a schematic plan view illustrating arrangement of third scanning lines and the relay layer of the first embodiment.

FIG. 15 is a schematic plan view illustrating arrangement of third capacitance lines and the relay layer of the first embodiment.

As illustrated in FIG. 15, the third scanning line 6 is disposed to extend in the X direction at a position overlapping in plan view with the relay layer 5*d* disposed in the center of the pixel P in a lower layer. Such a third scanning line 6 includes a plurality of third scanning lines 6 provided in parallel at the same arrangement pitch as the pixel pitch of the pixels P in the Y direction. The relay layer 6*a* is disposed between the third scanning lines 6 adjacent to each other in the Y direction and at a position overlapping in plan view with the lower relay layer 5*b*. In addition, the relay layer 6*b* is disposed at a position spaced apart in the Y direction from the third scanning line 6 and at a position overlapping in plan view with the lower relay layer 5*c*. Such the third scanning lines 6 and the relay layers 6*a* and 6*b* are symmetrically disposed in the Y direction, with respect to the two pixels P adjacent to each other in the Y direction. The third scanning line 6 and the relay layers 6*a* and 6*b* are provided in the same layer (see FIG. 5). The contact portion 74 configured to electrically couple the relay layer 6*a* and the data line 7 is disposed in the relay layer 6*a*. The contact portion 75 configured to electrically couple the relay layer 6*b* and the relay layer 7*b* is disposed in the relay layer 6*b*.

Figure 16:
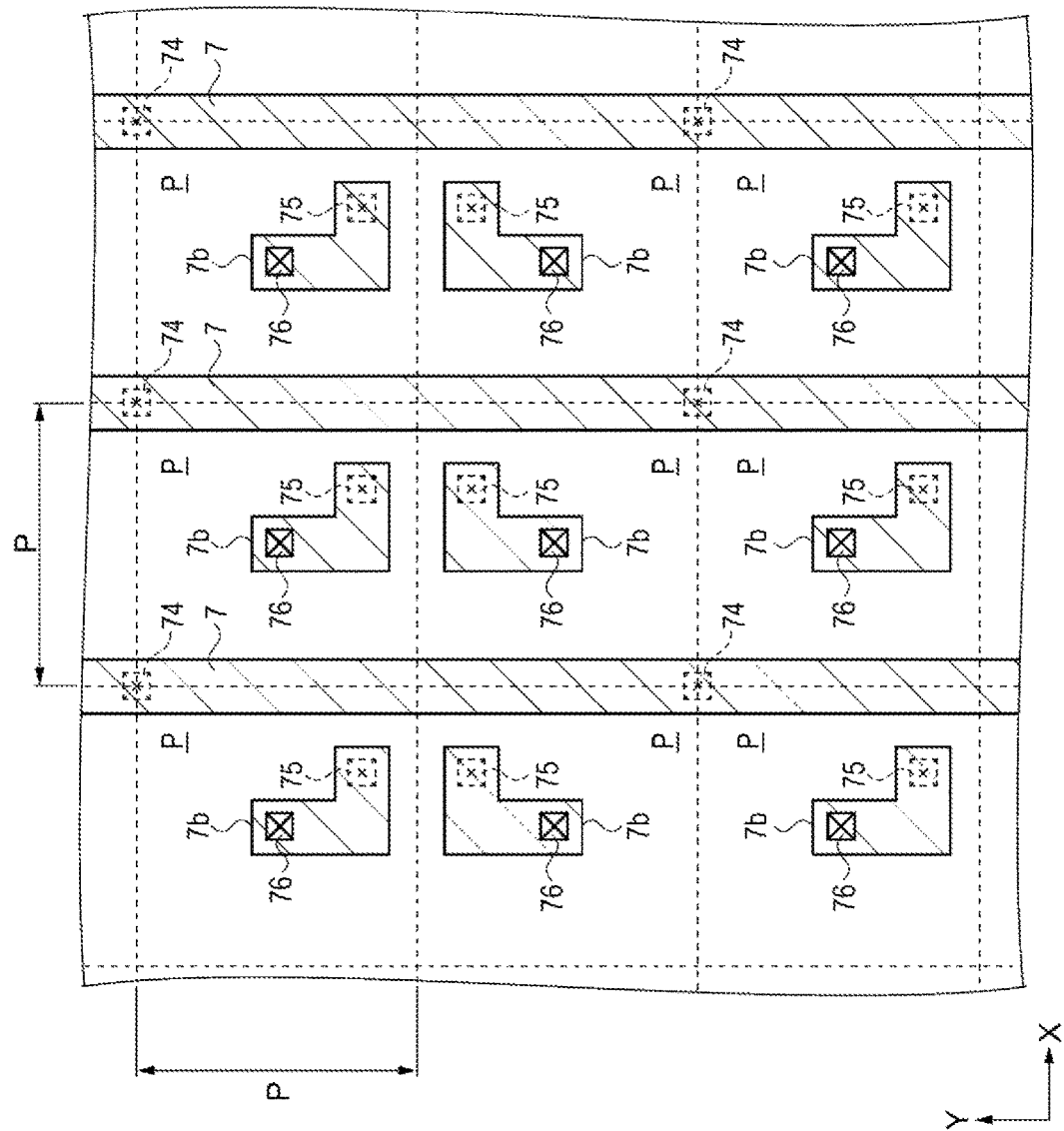
FIG. 16 is a schematic plan view illustrating arrangement of data lines and the relay layer of the first embodiment.

FIG. 16 is a schematic plan view illustrating arrangement of data lines and the relay layer of the first embodiment.

As illustrated in FIG. 16, the data line 7 are disposed to extend in the Y direction so as to overlap with a side of the pixel P along the Y direction. Such a data line 7 includes a plurality of data lines 7 provided in parallel at the same arrangement pitch as the pixel pitch of the pixels P in the X direction. The contact portion 74 configured to electrically couple the lower relay layer 6*a* and the data line 7 is disposed at a position overlapping with one corner of the four corners of the pixel P. The relay layer 7*b* is disposed between the data lines 7 adjacent to each other in the X direction. The relay layer 7*b* has a shape bent at a right angle in plan view, and includes a portion extending in the X direction and a portion extending in the Y direction. The contact portion 75 configured to electrically couple the lower relay layer 6*b* and the relay layer 7*b* is disposed at a position overlapping the end of the portion of the relay layer 7*b* extending in the X direction. In addition, the portion of the relay layer 7*b* extending in the Y direction extends up to the center of the pixel P, and the contact portion 76 configured to electrically couple the upper relay layer 8*a* and the relay layer 7*b* is disposed at an end of the relay layer 7*b*. Such a relay layer 7*b* is symmetrically disposed in the Y direction, with respect to the two pixels P adjacent to each other in the Y direction. The data line 7 and the relay layer 7*b* are provided in the same layer (see FIG. 5).

Figure 17:
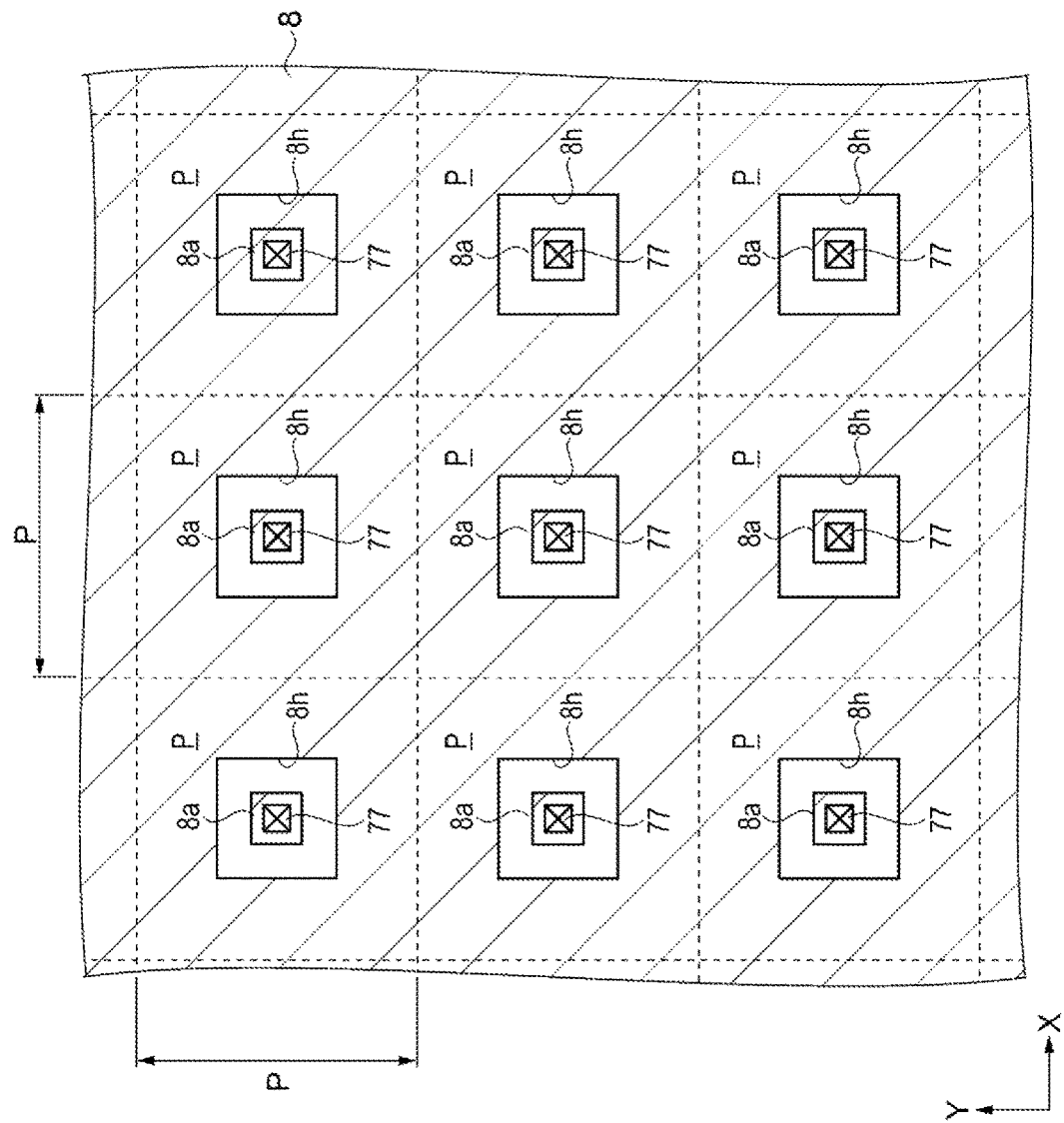
FIG. 17 is a schematic plan view illustrating arrangement of a common potential line and the relay layer of the first embodiment.

FIG. 17 is a schematic plan view illustrating arrangement of a common potential line and the relay layers of the first embodiment.

As illustrated in FIG. 17, the common potential line 8 is disposed so as to be planar in the X direction and in the Y direction without being divided for each pixel P. Specifically, the common potential line 8 is provided across at least the display region E1 in the liquid crystal panel 110 illustrated in FIG. 1. Further, as illustrated in FIG. 17, a rectangular opening 8*h* is formed at a position corresponding to the center of the pixel P, in the common potential line 8. In addition, the relay layer 8*a* is disposed in the center of the opening 8*h*. The contact portion 77 configured to electrically couple the upper pixel electrode 15 and the relay layer 8*a* is disposed in the relay layer 8*a*.

Figure 18:
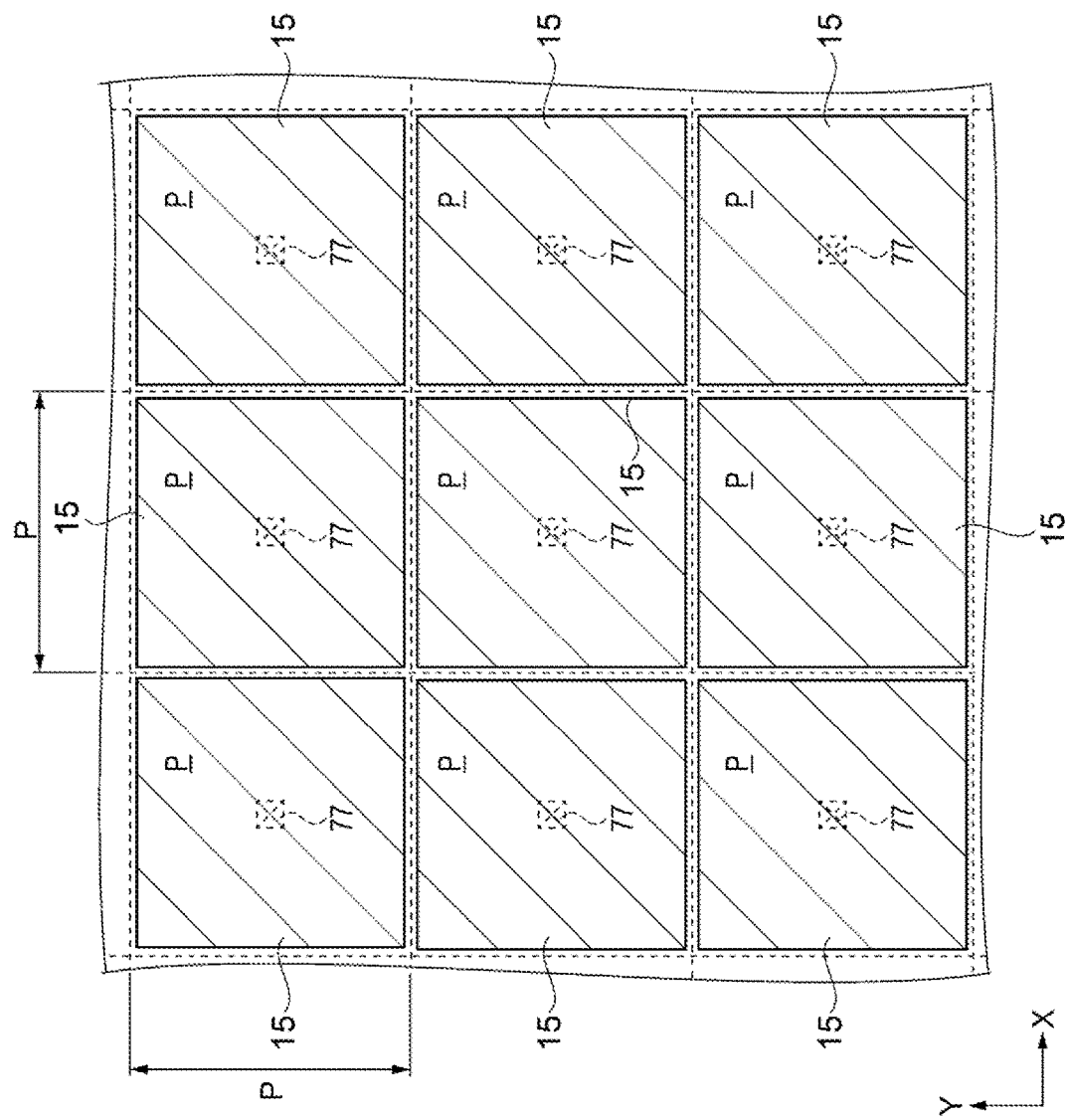
FIG. 18 is a schematic plan view illustrating arrangement of the pixel electrodes of the first embodiment.

FIG. 18 is a schematic plan view illustrating arrangement of the pixel electrodes of the first embodiment.

As illustrated in FIG. 18, the pixel electrode 15 having light reflectivity is square in plan view, and includes a plurality of pixel electrodes 15 disposed at the same arrangement pitch as the pixel pitch of the pixels P in the X direction and in the Y direction. The contact portion 77 configured to electrically couple the lower relay layer 8*a* and the pixel electrode 15 is disposed in the center of the pixel electrode 15. Since the contact portion 77 has a plug shape as illustrated in FIG. 5, even if the contact portion 77 is in contact with the pixel electrode 15, unevenness does not easily occur on the surface of the pixel electrode 15. Since the surface of the pixel electrode 15 is planar, light incident on the pixel electrode 15 is reflected at a reflection angle corresponding to an angle of incidence with respect to a normal line of the pixel electrode 15. Note that a planar position of the contact portion 77 is not limited to the center of the pixel electrode 15.

In the embodiment, the contact portions 61, 62, 63, and 64 passing through the third interlayer insulating layer 12*a*, the contact portions 71, 72, and 73 passing through the fourth interlayer insulating layer 12*b*, the contact portions 74 and 75 passing through the fifth interlayer insulating layer 13*a*, and the contact portion 76 passing through the sixth interlayer insulating layer 13*b*, and the contact portion 77 passing through the seventh interlayer insulating layer 14 are all formed in a plug shape by filling the through holes with tungsten. Such a configuration of the contact portion is referred to as a tungsten plug.

When the tungsten plug is formed, from a relationship between an aspect ratio of the through hole (ratio of a size of a diameter of the through hole relative to a depth of the through hole) and covering and filling of the through hole with tungsten, a film thickness of the interlayer insulating layer in which the through hole is provided is desirably less than 1 μm, and in the embodiment, the film thickness is 800 nm.

On the other hand, the contact portions 31, 32, 35, and 36 configured to electrically couple to the second scanning line 4 functioning as the semiconductor layer 30*a* or the gate electrode 30*g* of the TFT 30, and the capacitance electrode of the storage capacitor 40 are plugged by filling the through hole passing through the second interlayer insulating layer 11*d* with polysilicon. For example, when a film of polysilicon is formed by the CVD method or the like, the through hole can be easily filled compared to tungsten, so that the film thickness of the second interlayer insulating layer 11*d* can be 1 μm or greater. That is, the film thickness of the second interlayer insulating layer 11*d* can be thicker than that of the other interlayer insulating layers, and thus, if the trench 39 is formed in the second interlayer insulating layer 11*d* and the storage capacitor 40 is formed along the trench 39, it is possible to realize the storage capacitor 40 with a greater electrical capacitance per unit area.

The liquid crystal device 100 of the first embodiment described above can provide the following advantages.

(1) In the element substrate 10 included in the liquid crystal panel 110 of the liquid crystal device 100, the contact portion 31 as a second contact portion configured to electrically couple a source of the TFT 30 (the source region 30*s* of the semiconductor layer 30*a*) and the data line 7, the contact portion 32 as a first contact portion configured to electrically couple a drain of the TFT 30 (the drain region 30*d* of the semiconductor layer 30*a*), the second capacitance electrode 42, and the pixel electrode 15, the contact portion 35 as a third contact portion configured to electrically couple a gate of the TFT 30 (the gate electrode 30g) and the third scanning line 6, and the contact portion 36 configured to electrically couple the first capacitance electrode 41 and the capacitance line 5, are all formed in a plug shape by filling the through hole passing through the second interlayer insulating layer 11d with the second conductive layer 42m of the second capacitance electrode 42. Additionally, the storage capacitor 40 and the four contact portions 31, 32, 35, and 36 are patterned by dry etching at once the layered film formed by stacking the insulating layer forming the capacitance insulating layer 44 and the conductive layer forming the second capacitance electrode 42. Thus, the wiring structure and manufacturing process in the element substrate 10 can be simplified compared to a case where the four contact portions 31, 32, 35, and 36 are configured of a conductive layer not related to the storage capacitor 40. That is, a reflective liquid crystal device 100 can be provided as an electrooptical device including the element substrate 10 having a simplified wiring structure.

(2) The four contact portions 31, 32, 35, and 36 are configured by using the second conductive layer 42m of the second capacitance electrode 42, and are provided on a side wall and at an inside of the side wall formed of the capacitance insulating layer 44 and the first conductive layer 42n of the second capacitance electrode 42. Such four contact portions 31, 32, 35, and 36 are formed into a plug shape by forming the through hole reaching the semiconductor layer 30a, the gate electrode 30g, and the relay layer 47, to which the contact portions 31, 32, 35, and 36 are coupled, after passing through the capacitance insulating layer 44 and the first conductive layer 42n of the second capacitance electrode 42, and filling the through hole with the second conductive layer 42m. In other words, the conductive layer in contact with the source region 30s, the drain region 30d, the gate electrode 30g, and the relay layer 47, to which the contact portions 31, 32, 35, and 36 are coupled is limited to one type, and thus, a stable electrical coupling structure can be realized compared to a case where each of the four contact portions 31, 32, 35, and 36 is configured by using a plurality of types of conductive layers.

(3) The four contact portions 31, 32, 35, and 36 are formed in a plug shape by using the second conductive layer 42m made of polysilicon. This provides excellent coverage and filling properties for the through holes reaching the coupling destination. Accordingly, a stable electrical coupling structure can be realized compared to a case where a conductive layer other than the conductive polysilicon layer is used.

(4) The storage capacitor 40 is provided along the trench 39 as a recessed portion formed in the second interlayer insulating layer 11d having the largest film thickness, out of the plurality of interlayer insulating layers. Because the trench 39 is configured to include the three grooves 39a, 39b, and 39c, the electric capacity per unit area can be increased compared to a case where the storage capacitor 40 is provided in a planar portion. Accordingly, even when the size of the pixels P decreases, the reflective liquid crystal device 100 can be provided as an electrooptical device including the element substrate 10 having a wiring structure capable of securing a desired electric capacity in the storage capacitor 40.

Second Embodiment

Electrooptical Device

Next, an electrooptical device of a second embodiment will be described by exemplifying a reflective liquid crystal device as with the first embodiment. A reflective liquid crystal device 200 of the second embodiment differs from the liquid crystal device 100 of the first embodiment in the configuration of the storage capacitor in the element substrate and the configuration of the relay layer (contact portion) for the TFT 30 and the storage capacitor. Accordingly, the same configurations as the configurations in the liquid crystal device 100 of the first embodiment are denoted by the same reference signs, and detailed description of the same configurations will be omitted.

The reflective liquid crystal device 200 as the electrooptical device of the embodiment includes a liquid crystal panel in which the liquid crystal layer 50 is sandwiched between an element substrate 210 and the counter substrate 20. The liquid crystal panel includes the light reflective pixel electrode 15, the TFT 30 for switching control of the pixel electrode 15, and a storage capacitor 240, in the pixel P. Configurations of the liquid crystal layer 50 and the counter substrate 20 are the same as those in the first embodiment. A wiring structure of the element substrate 210, which is a feature of the embodiment, will be described below with reference to FIG. 19.

Wiring Structure of Element Substrate

Figure 19:
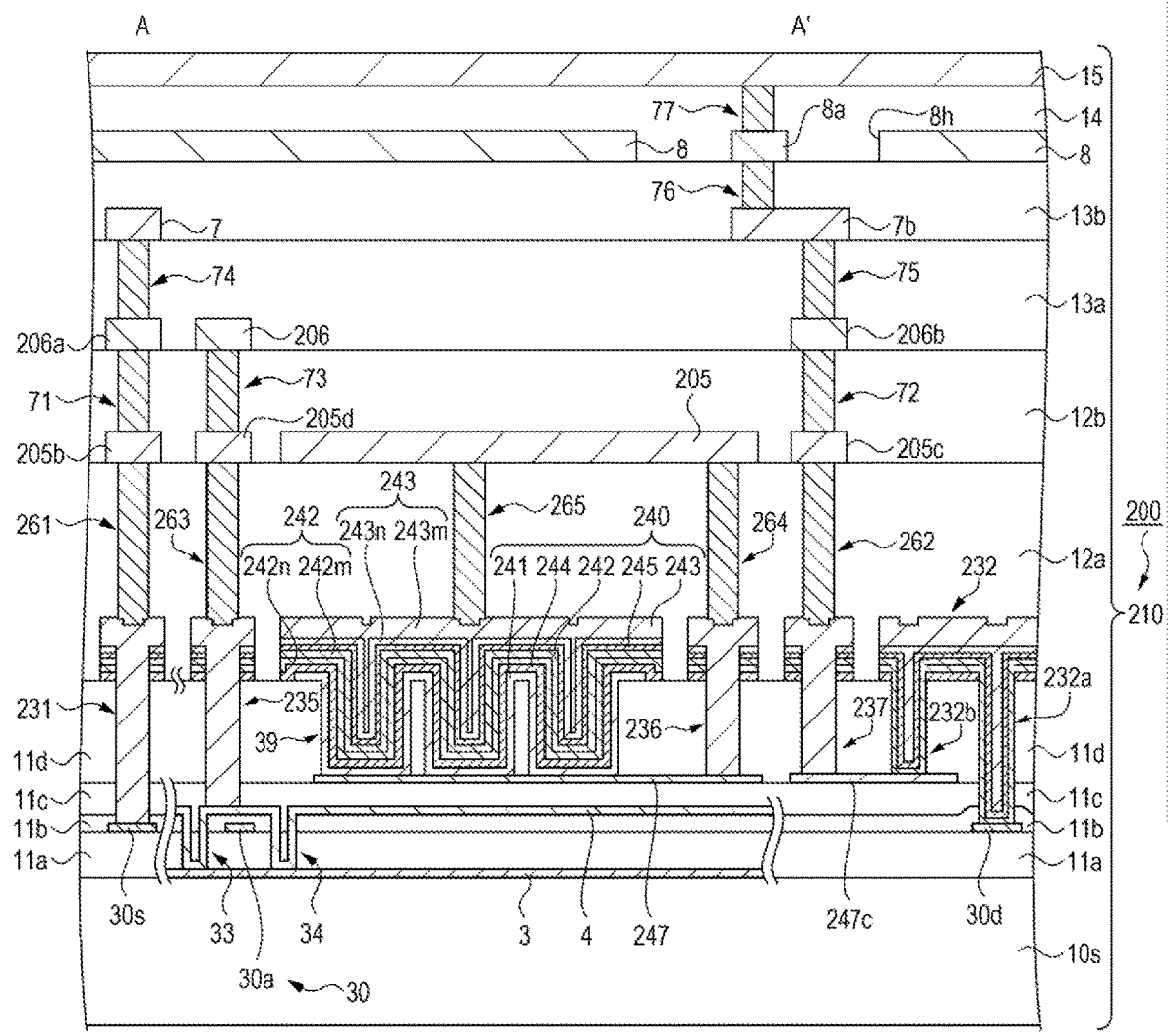
FIG. 19 is a schematic cross-sectional view illustrating a wiring structure of an element substrate in a pixel of a liquid crystal device of a second embodiment.

FIG. 19 is a schematic cross-sectional view illustrating a wiring structure of the element substrate in a pixel of the liquid crystal device of the second embodiment. Note that FIG. 19 is a schematic cross-sectional view corresponding to FIG. 5 illustrating the wiring structure of the element substrate 10 in the pixel P of the liquid crystal device 100 in the first embodiment. That is, line A-A' in FIG. 4 is a line segment crossing the semiconductor layer 30a of the TFT 30 and the trench 39 in the X direction. In addition, FIG. 19 illustrates not only a wiring structure of a portion along line A-A', but also a wiring structure in which the source region 30a of the semiconductor layer 30a is electrically coupled to the data line 7 and a wiring structure in which the drain region 30d of the semiconductor layer 30a, the storage capacitor 240, and the pixel electrode 15 are electrically coupled.

As illustrated in FIG. 19, the element substrate 210 includes the base material 10s and a plurality of wiring layers provided on the base material 10s. Specifically, on the base material 10s, a first wiring layer including the scanning line 3, a second wiring layer including the semiconductor layer 30a, a third wiring layer including the second scanning line 4, a fourth wiring layer including a first relay layer 247 and the storage capacitor 240, a fifth wiring layer including a capacitance line 205, a sixth wiring layer including a third scanning line 206, a seventh wiring layer including the data line 7, an eighth wiring layer including the common potential line 8, and a ninth wiring layer including a light reflective pixel electrode 15 are provided in this order.

Furthermore, the underlying insulating layer 11a is formed on the base material 10s between the scanning line 3 and the semiconductor layer 30a. The gate insulating layer 11b is provided between the semiconductor layer 30a and the second scanning line 4. The first interlayer insulating layer 11c is formed between the second scanning line 4 and the first relay layer 247. The storage capacitor 240 is provided along the trench 39 formed in the second interlayer insulating layer 11d. The third interlayer insulating layer 12a is formed between the storage capacitor 240 and the capacitance line 205. The fourth interlayer insulating layer 12b is formed between the capacitance line 205 and the third scanning line 206. The fifth interlayer insulating layer 13a is formed between the third scanning line 206 and the data line 7. The sixth interlayer insulating layer 13b is formed between the data line 7 and the common potential line 8. The seventh interlayer insulating layer 14 is formed between the common potential line 8 and the pixel electrode 15. Configurations of the underlying insulating layer 11a, the gate insulating layer 11b, and the interlayer insulating layers described above are the same as those of the first embodiment. In the element substrate 210 of the embodiment, electrical configurations from the first wiring layer to the third wiring layer described above are basically the same as those of the first embodiment, and thus, the fourth wiring layer and upper layers thereof only will be described below.

The first relay layer 247 and the second relay layer 247c are formed by forming and patterning a conductive layer on the first interlayer insulating layer 11c covering the second scanning line 4. The conductive layer included in these relay layers is formed of, for example, a polysilicon film doped with phosphorus (p), and has a film thickness of, for example, 60 nm. The second interlayer insulating layer 11d covering these relay layers is formed. The second interlayer insulating layer 11d is a silicon oxide film having a film thickness of, for example, 1 µm or greater.

Next, the trench 39 passing through the second interlayer insulating layer 11d to reach the first relay layer 247 is formed. The trench 39 is formed to include the three grooves 39a, 39b, and 39c (see FIG. 4).

Next, a first capacitance electrode 241 is formed by forming and patterning a conductive layer so as to cover the trench 39. The conductive layer included in the first capacitance electrode 241 is made from a polysilicon film doped with phosphorus (p), and has a film thickness of 50 nm, for example. Then, the insulating layer and the conductive layer are repeatedly stacked in this order and patterned at once, on the first capacitance electrode 241 to form a first capacitance insulating layer 244, a second capacitance electrode 242, a second capacitance insulating layer 245, and a third capacitance electrode 243. As the insulating layer included in the first capacitance insulating layer 244 and the second capacitance insulating layer 245, for example, a silicon nitride film having a film thickness of 20 nm or greater, or a multilayer film formed by stacking a silicon nitride film having a film thickness of 15 nm or greater on a silicon oxide film having a film thickness of 4 nm or greater, may be used.

The conductive layer included in the second capacitance electrode 242 is formed of a polysilicon film doped with phosphorus (p), similarly to the first capacitance electrode 241, and has a film thickness of 100 nm, for example. Note that a conductive polysilicon film having a film thickness of 100 nm is formed in two stages. That is, the second capacitance electrode 242 includes, for example, a third conductive layer 242n having a film thickness of 50 nm, and a fourth conductive layer 242m having the same film thickness of 50 nm, which is stacked on the third conductive layer 242n.

The conductive layer included in the third capacitance electrode 243 is formed of a polysilicon film doped with phosphorus (p), similarly to the first capacitance electrode 241, and has a film thickness of 250 nm, for example. Note that a conductive polysilicon film having a film thickness of 250 nm is formed in two stages. That is, the third capacitance electrode 243 includes, for example, a fifth conductive layer 243n having a film thickness of 50 nm, and a sixth conductive layer 243m having a film thickness of 200 nm, which is stacked on the fifth conductive layer 243n.

As a result, the storage capacitor 240 includes the first capacitance electrode 241, the first capacitance insulating layer 244, the second capacitance electrode 242, the second capacitance insulating layer 245, and the third capacitance electrode 243, all of which are overlaid along the trench 39. One capacitance element is configured of the first capacitance electrode 241 and the second capacitance electrode 242 disposed facing each other with the first capacitance insulating layer 244 interposed therebetween, and the other capacitance electrode is configured of the second capacitance electrode 242 and the third capacitance electrode 243 disposed facing each other with the second capacitance insulating layer 245 interposed therebetween. The first capacitance electrode 241 and the third capacitance electrode 243 are electrically coupled to the capacitance line 205, which will be described later. The storage capacitor 240 of the embodiment includes the two capacitance elements electrically coupled in parallel.

In the embodiment, in such a process of forming the storage capacitance 240, a contact portion 231 configured to electrically couple the source region 30s of the semiconductor layer 30a and the data line 7, contact portions 232 and 237 configured to electrically couple the drain region 30d of the semiconductor layer 30a, and the second capacitance electrode 242 and the pixel electrode 15, a contact portion 235 configured to electrically couple the third scanning line 206 and the second scanning line 4 functioning as the gate electrode of the TFT 30, and a contact portion 236 configured to electrically couple the first relay layer 247 and the capacitance line 205 are simultaneously formed. The method of forming the storage capacitor 240 and the five contact portions 231, 232, 235, 236, and 237 will be described in detail later, and all of the four contact portions 231, 235, 236, and 237 are formed in a plug shape by using the sixth conductive layer 243m included in the third capacitance electrode 243.

The other remaining contact portion 232 is configured to include a first contact portion 232a reaching the drain region 30d of the semiconductor layer 30a after passing through the second interlayer insulating layer 11d, the first interlayer insulating layer 11c, and the gate insulating layer 11b, and a second contact portion 232b reaching the second relay layer 247c after passing through the second interlayer insulating layer 11d. Furthermore, the first contact portion 232a and the second contact portion 232b are configured by using the fourth conductive layer 242m of the second capacitance electrode 242. That is, the contact portion 237 formed in the plug shape described above is electrically coupled to the drain region 30d via the second relay layer 247c, the second contact portion 232b, and the first contact portion 232a.

Of the five contact portions 231, 232, 235, 236, and 237 described above, the contact portion 231 is an example of a sixth contact portion configured to electrically couple a semiconductor layer of a transistor and a data line in another electrooptical device of the present disclosure. The contact portion 232 is an example of a fourth contact portion configured to electrically couple the semiconductor layer of the transistor and a second capacitance electrode in the other electrooptical devices of the present disclosure. The contact portion 235 is an example of a seventh contact portion configured to electrically couple a gate electrode of the transistor and a scanning line in the other electrooptical device of the present disclosure. The contact portion 237 is an example of a fifth contact portion configured to electrically couple the fourth contact portion and a pixel electrode in the other electrooptical device of the present disclosure.

Next, the third interlayer insulating layer 12a covering the storage capacitor 240 and the contact portions 231, 232, 235, 236, and 237 is formed. When the storage capacitance 240 and the contact portions 231, 232, 235, 236, and 237 are covered, unevenness is formed on the surface of the third interlayer insulating layer 12a, and therefore, planarization processing such as CMP processing is performed to alleviate the unevenness. The third interlayer insulating layer 12a is formed of, for example, a silicon oxide film, and has an average film thickness of 800 nm, for example, which is obtained after the planarization processing.

Next, a total of five through holes reaching each of the four contact portions 231, 235, 236, and 237 and the third capacitance electrode 243 of the storage capacitor 240 after passing through the third interlayer insulating layer 12a are formed, and a conductive layer filling the five through holes is formed and patterned to form contact portions 261, 262, 263, 264, and 265. The conductive layer is, for example, made of tungsten, and the contact portions 261, 262, 263, 264, and 265 are tungsten plugs.

Then, a low resistance conductive layer covering the third interlayer insulating layer 12a is formed and patterned to form the capacitance line 205 and relay layers 205b, 205c, and 205d. The low resistance conductive layer is obtained, for example, by stacking an aluminum (Al) film having a film thickness of 150 nm or greater on a titanium nitride (TiN) film having a film thickness of 20 nm or greater. As a result, the relay layer 205b is coupled to the contact portion 231 via the contact portion 261. The relay layer 205c is coupled to the contact portion 237 via the contact portion 262. The relay layer 205d is coupled to the contact portion 235 via the contact portion 263. The capacitance line 205 is electrically coupled to the first capacitance electrode 241 formed in contact with the first relay layer 247 at the bottom of the trench 39 via the contact portion 264, the contact portion 236, and the first relay layer 247. Furthermore, the capacitance line 205 is coupled to the third capacitance electrode 243 via the contact portion 265.

Next, the fourth interlayer insulating layer 12b covering the capacitance line 205 and the relay layers 205b, 205c, and 205d is formed. When the capacitance line 205 and the relay layers 205b, 205c, and 205d are covered, unevenness is formed on the surface of the fourth interlayer insulating layer 12b, and therefore, planarization processing such as CMP processing is performed to alleviate the unevenness. The fourth interlayer insulating layer 12b is formed of, for example, a silicon oxide film, and has an average film thickness of 800 nm, for example, which is obtained after the planarization processing.

Next, three through holes reaching each of the relay layers 205b, 205c, and 205d after passing through the fourth interlayer insulating layer 12b are formed, and a conductive layer filling the three through holes is formed and patterned to form contact portions 71, 72, and 73. The conductive layer is, for example, made of tungsten, and the contact portions 71, 72, and 73 are also tungsten plugs. Then, a low resistance conductive layer covering the fourth interlayer insulating layer 12b is formed and patterned to form the third scanning line 206 and relay layers 206a and 206b. The low resistance conductive layer is obtained, for example, by stacking an aluminum (Al) film having a film thickness of 300 nm or greater on a titanium nitride (TiN) film having a film thickness of 20 nm or greater. As a result, the relay layer 206a is coupled to the relay layer 205b via the contact portion 71. The relay layer 206b is coupled to the relay layer 205c via the contact portion 72. The third scanning line 206 is coupled to the relay layer 205d via the contact portion 73. That is, the third scanning line 206 is electrically coupled to the second scanning line 4 via the contact portion 73, the relay layer 205d, the contact portion 263, and the contact portion 235.

Next, the fifth interlayer insulating layer 13a covering the third scanning line 206 and the relay layers 206a and 206b is formed. When the third scanning line 206 and the relay layers 206a and 206b are covered, unevenness is formed on the surface of the fifth interlayer insulating layer 13a, planarization processing such as CMP processing is performed to alleviate the unevenness. The fifth interlayer insulating layer 13a is formed of, for example, a silicon oxide film, and has an average film thickness of 800 nm, for example, which is obtained after the planarization processing.

Next, two through holes reaching each of the relay layers 206a and 206b after passing through the fifth interlayer insulating layer 13a are formed, and a conductive layer filling the two through holes is formed and patterned to form contact portions 74 and 75. The conductive layer is, for example, made of tungsten, and the contact portions 74 and 75 are also tungsten plugs. Then, a low resistance conductive layer covering the fifth interlayer insulating layer 13a is formed and patterned to form the data line 7 and a relay layer 7b. The low resistance conductive layer is obtained, for example, by stacking an aluminum (Al) film having a film thickness of 300 nm or greater on a titanium nitride (TiN) film having a film thickness of 20 nm or greater. As a result, the data line 7 is electrically coupled to the source region 30s of the semiconductor layer 30a via the contact portion 74, the relay layer 206a, the contact portion 71, the relay layer 205b, the contact portion 261, and the contact portion 231.

Next, a sixth interlayer insulating layer 13b covering the data line 7 and the relay layer 7b is formed. When the data line 7 and the relay layer 7b are covered, unevenness is formed on the surface of the sixth interlayer insulating layer 13b, and therefore, planarization processing such as CMP processing is performed to alleviate the unevenness. The sixth interlayer insulating layer 13b is formed of, for example, a silicon oxide film, and has an average film thickness of 800 nm, for example, which is obtained after the planarization processing.

Next, a through hole reaching the relay layer 7b after passing through the sixth interlayer insulating layer 13b is formed, and a conductive layer filling the through hole is formed and patterned to form a contact portion 76. The conductive layer is, for example, made of tungsten, and the contact portion 76 also is a tungsten plug. Then, a low resistance conductive layer covering the sixth interlayer insulating layer 13b is formed and patterned to form a common potential line 8 and a relay layer 8a. The relay layer 8a is formed in an island shape inside an opening 8h formed in the common potential line 8. The low resistance conductive layer is obtained, for example, by stacking an aluminum (Al) film having a film thickness of 150 nm or greater on a titanium nitride (TiN) film having a film thickness of 20 nm or greater. As a result, the relay layer 8a is coupled to the relay layer 7b via the contact portion 76.

Next, a seventh interlayer insulating layer 14 covering the common potential line 8 and the relay layer 8a is formed. When the common potential line 8 and the relay layer 8a are covered, unevenness are formed on the surface of the seventh interlayer insulating layer 14, and therefore, planarization processing such as CMP processing is performed to alleviate the unevenness. The seventh interlayer insulating layer 14 is formed of, for example, a silicon oxide film, and has an average film thickness of 800 nm, for example, which is obtained after the planarization processing.

Next, a through hole reaching the relay layer 8a after passing through the seventh interlayer insulating layer 14 is formed, and a conductive layer filling the through hole is formed and patterned to form a contact portion 77. The conductive layer is, for example, made of tungsten, and the contact portion 77 also is a tungsten plug. Then, a low resistance conductive layer covering the seventh interlayer insulating layer 14 is formed and patterned to form the pixel electrode 15 having light reflectivity. The low resistance conductive layer is obtained, for example, by stacking an aluminum (Al) film having a film thickness of 150 nm or greater on a titanium nitride (TiN) film having a film thickness of 20 nm or greater. As a result, the pixel electrode 15 is coupled to the drain region 30$d$ of the semiconductor layer 30$a$ via the contact portion 77, the relay layer 8$a$, the contact portion 76, the relay layer 7$b$, the contact portion 75, the relay layer 206$b$, the contact portion 72, the relay layer 205$c$, the contact portion 262, the contact portion 237, the second relay layer 247$c$, and the contact portion 232 (the first contact portion 232$a$ and the second contact portion 232$b$).

As described above, the element substrate 210 includes, on the base material 10$s$, a plurality of wiring layers formed with the scanning line 3, the semiconductor layer 30$a$, the second scanning line 4, the first relay layer 247, the second relay layer 247$c$, the storage capacitor 240, the capacitance line 205, the third scanning line 206, the data line 7, the common potential line 8, the pixel electrode 15, and the relay layer related to coupling of these electrical configurations. These electrical configurations and specific arrangements of the relay layers in each of the wiring layers will be described below.

Electrical Configuration and Arrangement of Relay Layers in Each Wiring Layer

The electrical configuration and the arrangement of the relay layers including the contact portions, of each of the wiring layers in the element substrate 210 will be described with reference to FIG. 20 to FIG. 29. Note that except for FIG. 24 to FIG. 27, in FIG. 20 to FIG. 29, a region sectioned with dashed lines extending in the X direction and in the Y direction indicates a pixel P region.

Figure 20:
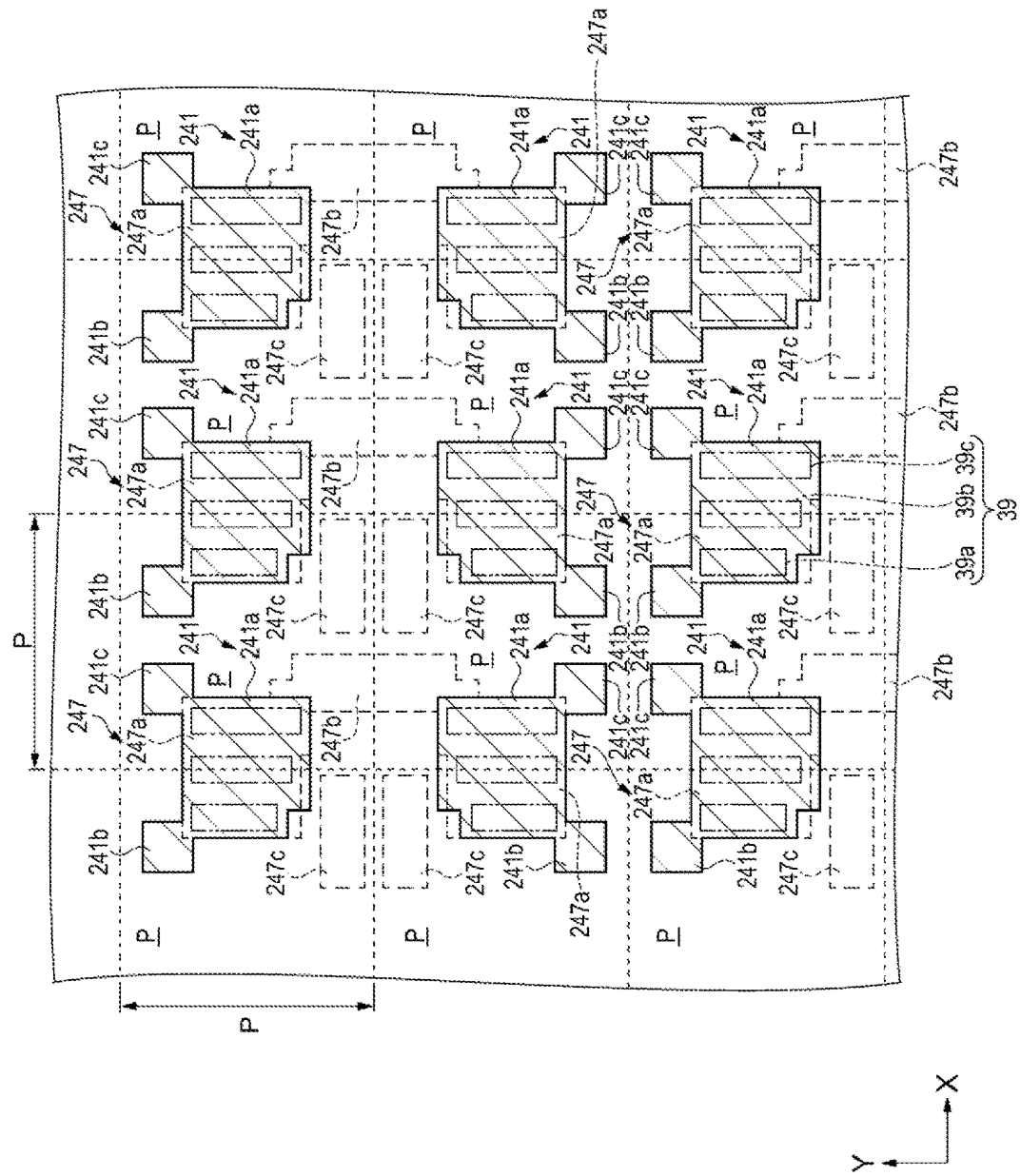
FIG. 20 is a schematic plan view illustrating arrangement of a first relay layer, a second relay layer, and a first capacitance electrode with respect to a trench of the second embodiment.

FIG. 20 is a schematic plan view illustrating arrangement of a first relay layer, a second relay layer, and a first capacitance electrode with respect to a trench of the second embodiment.

As illustrated in FIG. 20, the first relay layer 247 is disposed so as to be shared by the two pixels P adjacent to each other in the Y direction. Specifically, the first relay layer 247 includes a main body portion 247$a$ overlapping in plan view with the trench 39 in each of the two pixels P adjacent to each other in the Y direction, and a coupling portion 247$b$ coupling the two main body portions 247$a$. The main body portions 247$a$ are provided symmetrically in the Y direction and correspondingly to the two pixels P adjacent to each other in the Y direction. The second relay layer 247$c$ is oblong in plan view, and is disposed along the boundary of the two pixels P, with respect to which the first relay layer 247 is disposed symmetrically in the Y direction. Note that, because the second relay layer 247$c$ is provided, a length in the Y direction of the center groove 39$b$ of the three grooves 39$a$, 39$b$, and 39$c$ of the trench 39 of the embodiment is slightly shorter than that of the groove 39$b$ in the first embodiment.

The first capacitance electrode 241 is disposed electrically independently in the two pixels P adjacent to each other in the Y direction, and is disposed symmetrically in the Y direction. Specifically, the first capacitance electrode 241 includes a substantially rectangular main body portion 241$a$ overlapping with the trench 39 in plan view, and protruding portions 241$b$ and 241$c$ protruding from two corners of four corners of the main body portion 241$a$. Shapes of the protruding portions 241$b$ and 241$c$ are also rectangular (square). Not only the main body portion 241$a$ overlapping with the trench 39 but also the two protruding portions 241$b$ and 241$c$ are provided to ensure a surface area of the first capacitance electrode 241.

Figure 21:
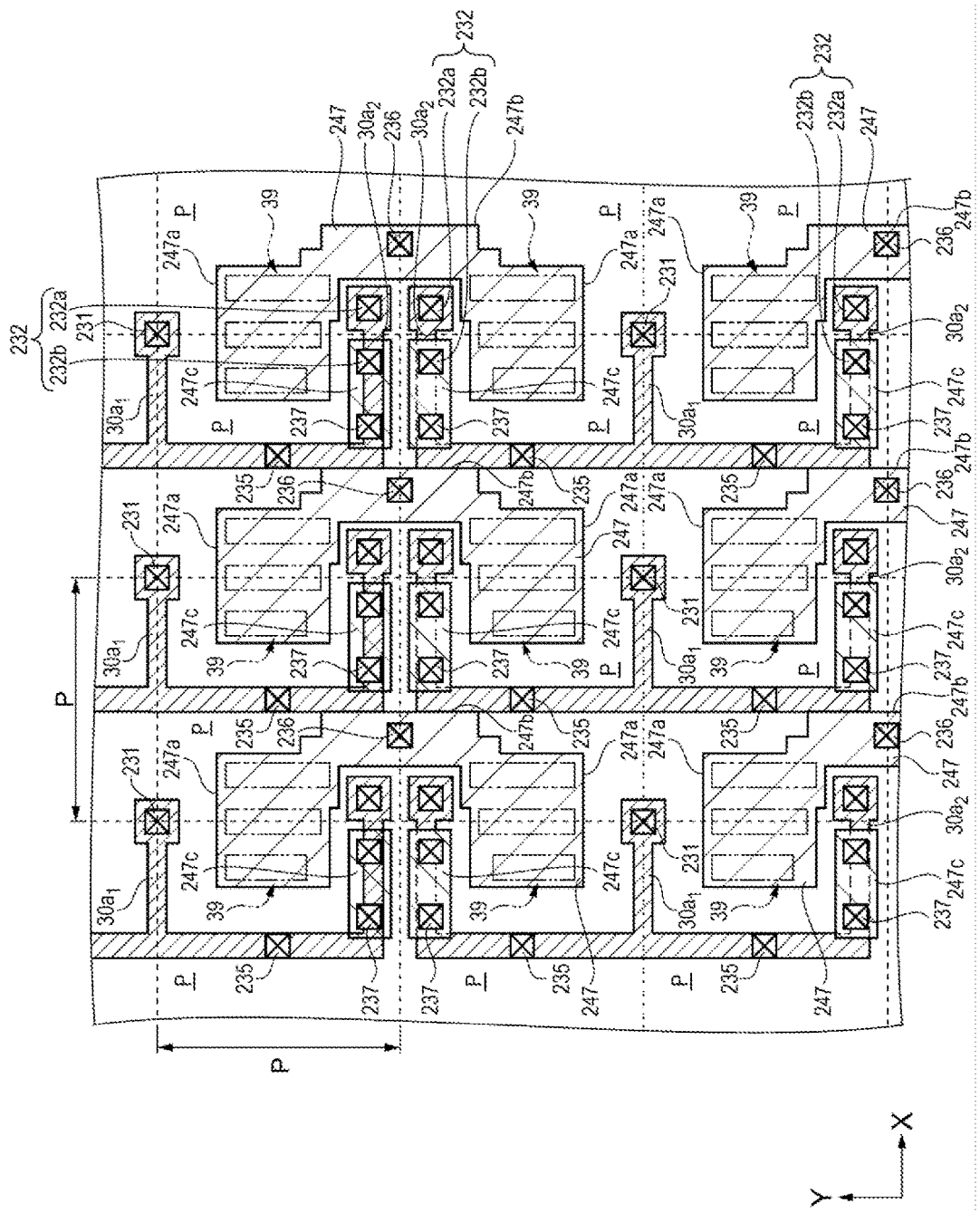
FIG. 21 is a schematic plan view illustrating arrangement of six contact portions relating to a semiconductor layer, the first relay layer, and the second relay layer of the second embodiment.

FIG. 21 is a schematic plan view illustrating arrangement of six contact portions relating to the semiconductor layer, the first relay layer, and the second relay layer of the second embodiment. Note that in FIG. 21, illustration of the first capacitance electrode 241 illustrated in FIG. 20 is omitted.

As illustrated in FIG. 21, the contact portion 231 configured to electrically couple the semiconductor layer 30$a$ and the data line 7 is provided at an end of the first portion 30$a_1$ being one portion of the semiconductor layer 30$a$ extending in the X direction. In the second portion 30$a_2$ being another portion of the semiconductor layer 30$a$ extending in the X direction, the contact portion 232 and the contact portion 237 configured to electrically couple the semiconductor layer 30$a$, and the second capacitance electrode 242 and the pixel electrode 15 are provided. Specifically, the first contact portion 232$a$ of the contact portion 232 is disposed at the end of the second portion 30$a_2$ of the semiconductor layer 30$a$, and the second contact portion 232$b$ and the contact portion 237 are disposed adjacent to each other in the X direction so as to overlap in plan view with the second relay layer 247$c$. The contact portion 235 configured to electrically couple the second scanning line 4 and the third scanning line 206 is provided at a position overlapping with the main body portion of the semiconductor layer 30$a$ extending in the Y direction. The contact portion 236 configured to electrically couple the first relay layer 247 and the capacitance line 205 is provided in the center of the coupling portion 247$b$ of the first relay layer 247 extending in the Y direction. Thus, the contact portion 236 is disposed at the boundary between the two pixels P adjacent to each other in the Y direction in plan view. Note that a length in the X direction of the second portion 30$a_2$ of the semiconductor layer 30$a$ extending in the X direction in the embodiment is longer than that of the first embodiment.

Figure 22:
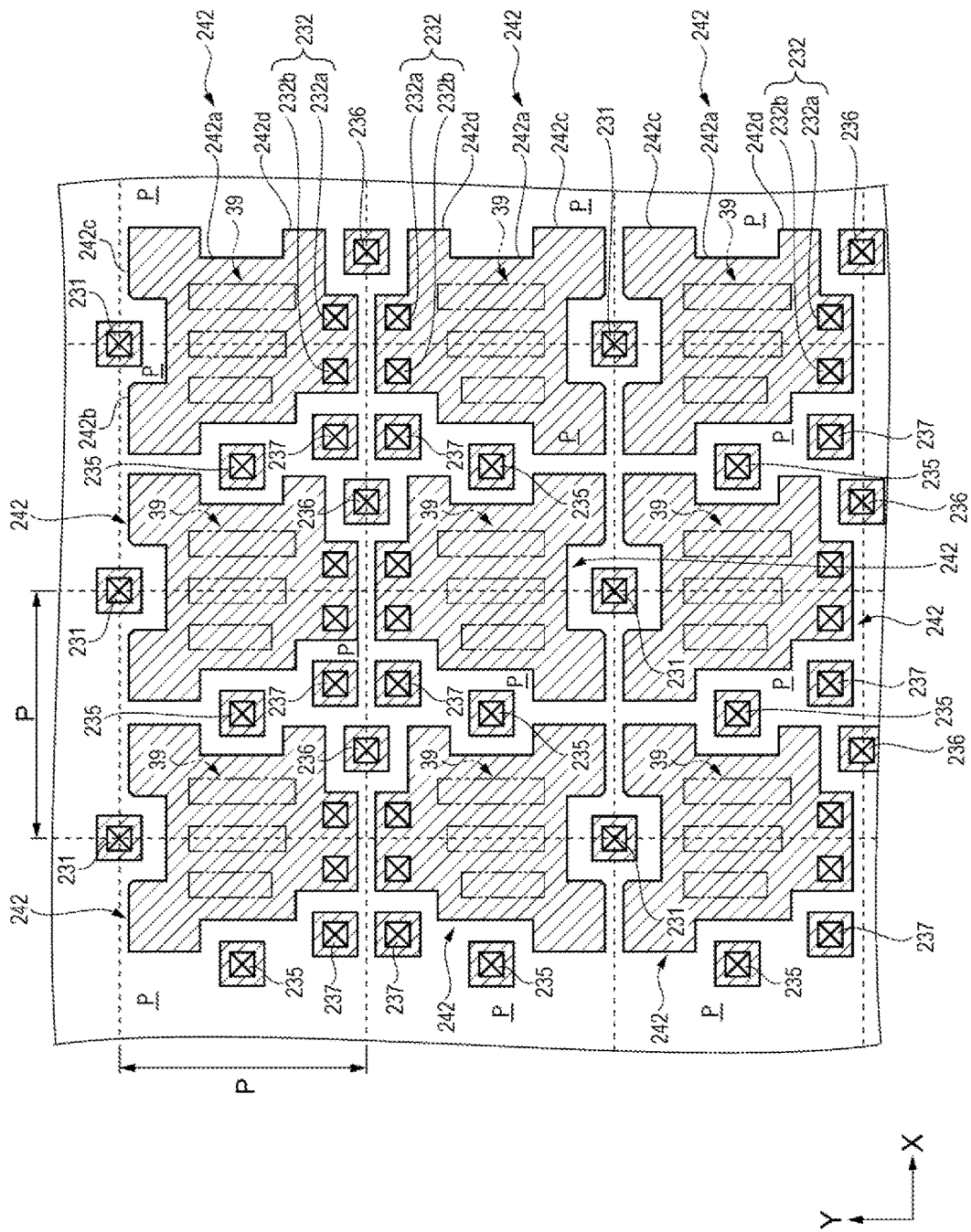
FIG. 22 is a schematic plan view illustrating arrangement of second capacitance electrodes and the relay layer of the second embodiment.

FIG. 22 is a schematic plan view illustrating arrangement of the second capacitance electrode and the relay layer of the second embodiment.

As illustrated in FIG. 22, the second capacitance electrode 242 is electrically independently disposed for each pixel P. Specifically, the second capacitance electrode 242 includes a substantially rectangular main body portion 242$a$ that overlaps with the trench 39 in plan view, and protruding portions 242$b$, 242$c$, and 242$d$ protruding from three corners of four corners of the main body portion 242$a$. Shapes of the protruding portions 242$b$ and 242$c$ are rectangular (square). A shape of the protruding portion 242$d$ is oblong. Not only the main body portion 242$a$ overlapping with the trench 39 but also the three protruding portions 242$b$, 242$c$, and 242$d$ are provided to ensure a surface area of the second capacitance electrode 242. Note that the second capacitance electrode 242 is formed to overlap with the first capacitance electrode 241 illustrated in FIG. 20, and the two protruding portions 242$b$ and 242$c$ of the three protruding portions 242$b$, 242$c$, and 242$d$ overlap in plan view with the two protruding portions 241$b$ and 241$c$ of the first capacitance electrode 241.

The contact portion 231 is provided in an island shape between the protruding portion 242$b$ and the protruding portion 242$c$ of the boundary along the X direction of the pixel P. The contact portion 235 is provided in an island shape at a position overlapping in plan view with the boundary on a side of the protruding portion 242b of the boundary along the Y direction of the pixel P. The first contact portion 232a and the second contact portion 232b of the contact portion 232 are provided in a portion of the main body portion 242a projecting in the Y direction. The contact portion 237 is provided in an island shape in the corner of the pixel P on a side where the contact portion 232 is disposed. The contact portion 236 is provided in an island shape between the protruding portions 242d of the two second capacitance electrodes 242 disposed symmetrically and correspondingly to the two pixels P adjacent to each other in the Y direction. That is, the contact portion 231 is disposed at one boundary along the X direction of the pixel P, and the contact portion 236 is disposed at the other boundary along the X direction of the pixel P.

Figure 23:
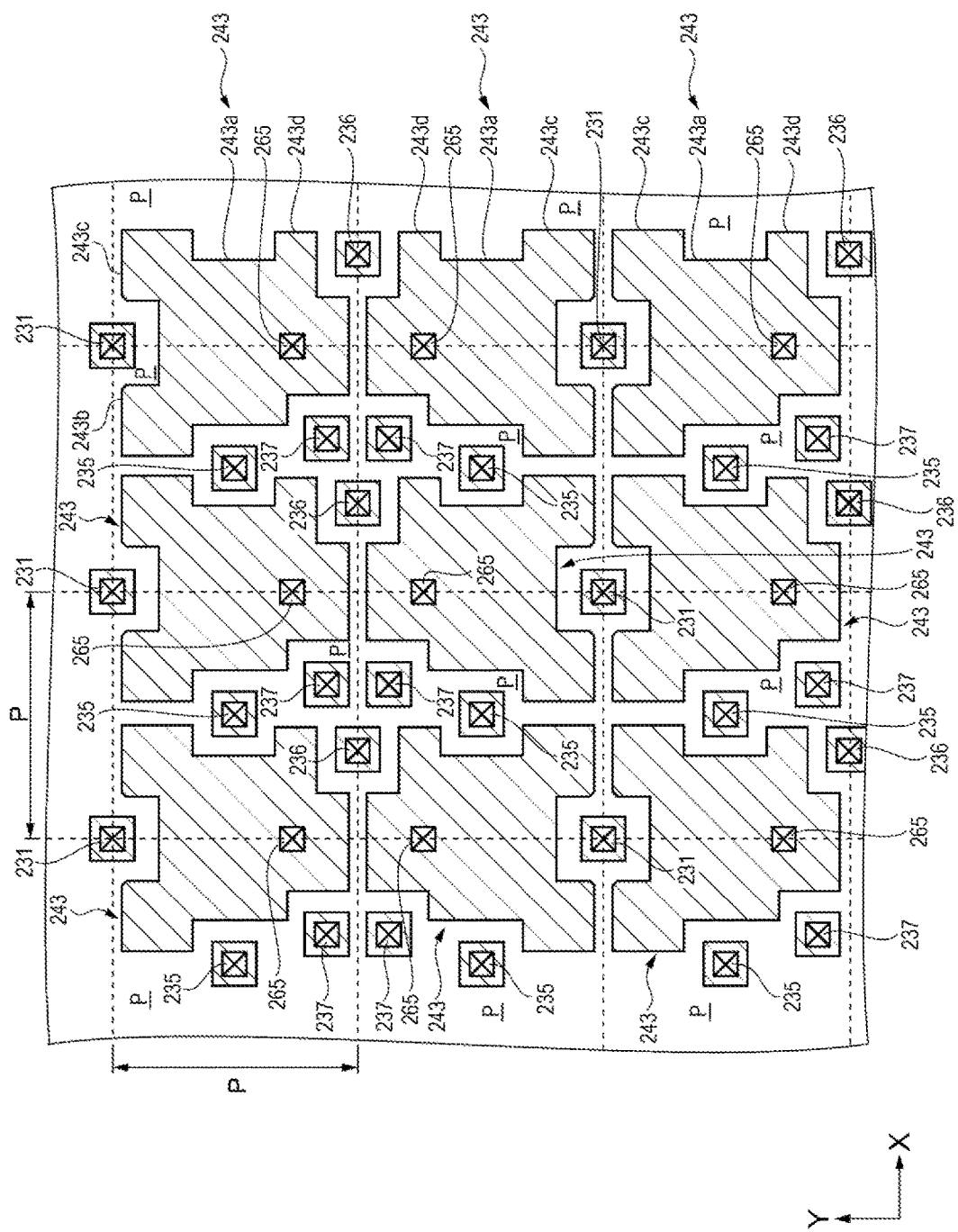
FIG. 23 is a schematic plan view illustrating arrangement of third capacitance electrodes and the relay layer of the second embodiment.

FIG. 23 is a schematic plan view illustrating arrangement of third capacitance electrodes and the relay layer of the second embodiment.

As illustrated in FIG. 23, the third capacitance electrode 243 is the same in planar shape as the second capacitance electrode 242 illustrated in FIG. 22. That is, the third capacitance electrode 243 includes a substantially rectangular body portion 243a, and protruding portions 243b, 243c, and 243d protruding from four corners of the main body portion 243a. Shapes of the protruding portions 243b and 243c are also rectangular (square). A shape of the protruding portion 243d is oblong. Not only the main body portion 243a but also the three protruding portions 243b, 243c, and 243d are provided to ensure a surface area of the third capacitance electrode 243. Note that the third capacitance electrode 243 is formed so as to overlap with the second capacitance electrode 242 illustrated in FIG. 22.

A relative arrangement of the four contact portions 231, 235, 236, and 237 to the third capacitance electrode 243 is the same as the arrangement to the second capacitance electrode 242 described above. That is, the contact portion 231 is provided in an island shape between the protruding portion 243c and the protruding portion 243c of the boundary along the X direction of the pixel P. The contact portion 235 is provided in an island shape at a position overlapping in plan view with the boundary on a side of the protruding portion 243b of the boundary along the Y direction of the pixel P. The contact portion 237 is provided in an island shape at a position spaced apart in the X direction from a portion of the main body portion 243a projecting in the Y direction. The contact portion 236 is provided in an island shape between the protruding portions 243d of the two third capacitance electrodes 243 disposed symmetrically with respect to the two pixels P adjacent to each other in the Y direction. The contact portion 265 configured to electrically couple with the capacitance line 205 described below is disposed in a portion of the main body portion 243a projecting in the Y direction.

FIG. 24 to FIG. 27 are schematic cross-sectional views illustrating a method of forming the five contact portions relating to the thin film transistor (TFT) and the storage capacitor of the second embodiment. A method of forming the five contact portions 231, 232, 235, 236, and 237 will be described with reference to FIG. 24 to FIG. 27. Note that because the contact portion 232 includes the first contact portion 232a and the second contact portion 232b as described above, substantially, a method of forming the six contact portions will be specifically described.

Figure 24:
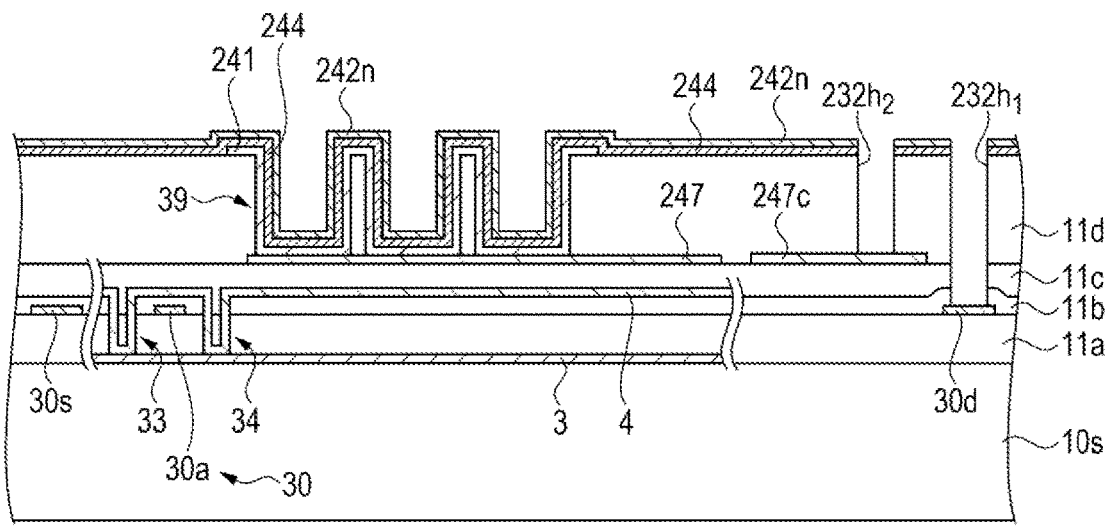
FIG. 24 is a schematic cross-sectional view illustrating a method of forming five contact portions relating to a thin film transistor (TFT) and a storage capacitor of the second embodiment.

As illustrated in FIG. 24, first, for example, a dry etching method is used to form the trench 39 including three grooves reaching the first relay layer 247 after passing through the second interlayer insulating layer 11d. The first relay layer 247 located at the boundary between the first interlayer insulating layer 11c and the second interlayer insulating layer 11d functions as a stopper layer during the dry etching. Then, a conductive polysilicon film having a film thickness of approximately 50 nm, for example, is formed and patterned to cover the inside of the three grooves to form the first capacitance electrode 241. Next, the first capacitance insulating layer 244 having a film thickness of approximately 20 nm, for example, is formed so as to cover the first capacitance electrode 241. As described above, a silicon nitride film or a layered film formed by stacking a silicon oxide film and a silicon nitride film is used as the first capacitance insulating layer 244. Next, the third conductive layer 242n of the second capacitance electrode 242 is stacked so as to cover the first capacitance insulating layer 244, the third conductive layer 242n being formed of the conductive polysilicon film. The film thickness of the third conductive layer 242n is 50 nm, for example.

Then, the dry etching method is used to form a first through hole $232h_1$ reaching the drain region 30d after passing through the third conductive layer 242n, the first capacitance insulating layer 244, the second interlayer insulating layer 11d, the first interlayer insulating layer 11c, and the gate insulating layer 11b; and a second through hole $232h_2$ reaching the second relay layer 247c after passing through the third conductive layer 242n, the first capacitance insulating layer 244, and the second interlayer insulating layer 11d. Diameters of the two through holes are, for example, φ0. 2 μm or greater.

Next, a dilute hydrofluoric acid treatment is applied to the surfaces of the drain region 30d and the second relay layer 247c. The dilute hydrofluoric acid treatment removes, with dilute hydrofluoric acid, a natural oxide film formed by naturally oxidizing the surfaces of the drain region 30d formed of a polysilicon film, which is exposed at the bottom of the first through hole $232h_1$ and the second relay layer 247c also formed of a polysilicon film, which is exposed at the bottom of the second through hole $232h_2$. During the dilute hydrofluoric acid treatment, the first capacitance insulating layer 244 is covered by the third conductive layer 242n, so it is possible to prevent defects such as erosion of the first capacitance insulating layer 244 with the dilute hydrofluoric acid.

Figure 25:
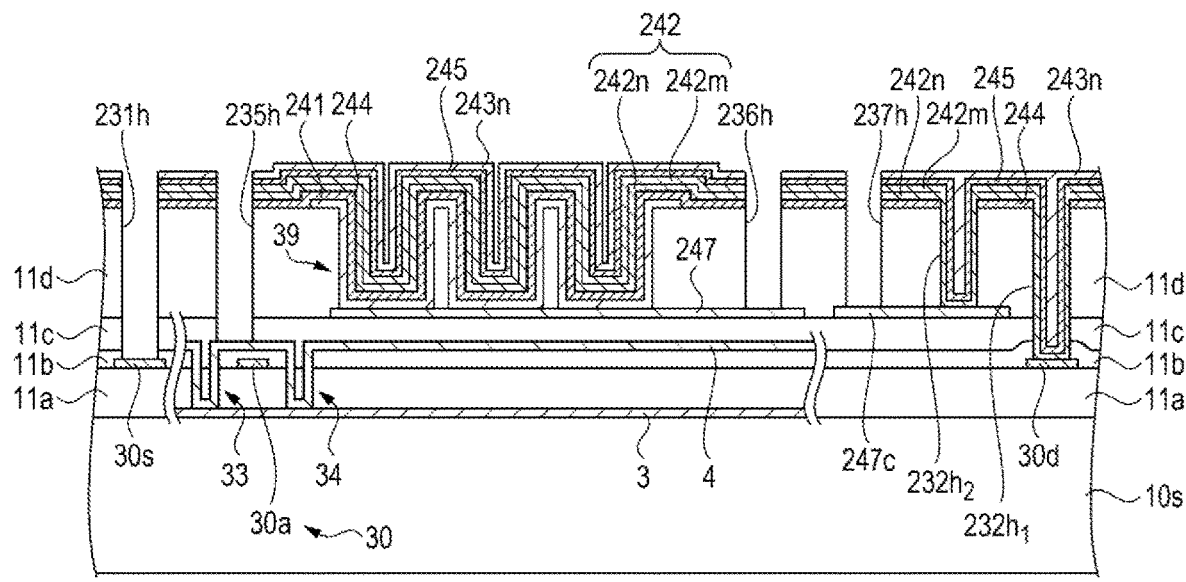
FIG. 25 is a schematic cross-sectional view illustrating the method of forming the five contact portions relating to the thin film transistor (TFT) and the storage capacitor of the second embodiment.

Next, as illustrated in FIG. 25, the fourth conductive layer 242m of the second capacitance electrode 242, and the second capacitance insulating layer 245, and the fifth conductive layer 243n of the third capacitance electrode 243, are stacked in this order so as to cover the inside of the first through hole $232h_1$ and the second through hole $232h_2$ and the third conductive layer 242n of the second capacitance electrode 242 on the second interlayer insulating layer 11d. The fourth conductive layer 242m and the fifth conductive layer 243n are formed of a conductive polysilicon film. A film thickness of the fourth conductive layer 242m of the second capacitance electrode 242 is 50 nm, for example, a film thickness of the second capacitance insulating layer 245 is 30 nm, for example, and a film thickness of the fifth conductive layer 243n of the third capacitance electrode 243 is 50 nm, for example. Accordingly, the fourth conductive layer 242m and the drain region 30d of the second capacitance electrode 242 come into contact with each other at the bottom of the first through hole $232h_1$. Also, at the bottom of the second through hole $232h_2$, the fourth conductive layer 242m of the second capacitance electrode 242 comes into contact with the second relay layer 247c.

Next, the dry etching method is used to form a third through hole 231h reaching the source area 30s after passing through the fifth conductive layer 243n of the third capacitance electrode 243, the second capacitance insulating layer 245, the third conductive layer 242n and the fourth conductive layer 242m of the second capacitance electrode 242, the first capacitance insulating layer 244, the second interlayer insulating layer 11d, the first interlayer insulating layer 11c, and the gate insulating layer 11b. Further, a fourth through hole 235h is formed which reaches the second scanning line 4 after passing through the fifth conductive layer 243n of the third capacitance electrode 243, the second capacitance insulating layer 245, the third conductive layer 242n and the fourth conductive layer 242m of the second capacitance electrode 242, the second interlayer insulating layer 11d, and the first interlayer insulating layer llc. Further, a fifth through hole 236h is formed which reaches the first relay layer 247 after passing through the fifth conductive layer 243n of the third capacitance electrode 243, the second capacitance insulating layer 245, the third conductive layer 242n and the fourth conductive layer 242m of the second capacitance electrode 242, the first capacitance insulating layer 244, and the second interlayer insulating layer 11d. Further, a sixth through hole 237h is formed which reaches the second relay layer 247c after passing through the fifth conductive layer 243n of the third capacitance electrode 243, the second capacitance insulating layer 245, the third conductive layer 242n and the fourth conductive layer 242m of the second capacitance electrode 242, the first capacitance insulating layer 244, and the second interlayer insulating layer 11d. Diameters of the four through holes are, for example, φ0. 2 μm or greater. Then, a dilute hydrofluoric acid treatment is applied to the surfaces of the source region 30s, the second scanning line 4, the first relay layer 247, and the second relay layer 247c. The dilute hydrofluoric acid treatment removes, with dilute hydrofluoric acid, natural oxide films formed by naturally oxidizing the surfaces of the source region 30s, the second scanning line 4, the first relay layer 247, and the second relay layer 247c, exposed at the bottom of the four through holes. During the dilute hydrofluoric acid treatment, the first capacitance insulating layer 244 is covered by the third conductive layer 242n and the fourth conductive layer 242m of the second capacitance electrode 242 and the second capacitance insulating layer 245 is covered by the fifth conductive layer 243n of the third capacitance electrode 243, and thus, it is possible to prevent defects such as erosion of the first capacitance insulating layer 244 and the second capacitance insulating layer 245 with dilute acid. On the second interlayer insulating layer 11d, a side wall formed of the first capacitance insulating layer 244, the third conductive layer 242n and the fourth conductive layer 242m of the second capacitance electrode 242, the second capacitance insulating layer 245, and the fifth conductive layer 243n of the third capacitance electrode 243, is formed around the through holes.

Figure 26:
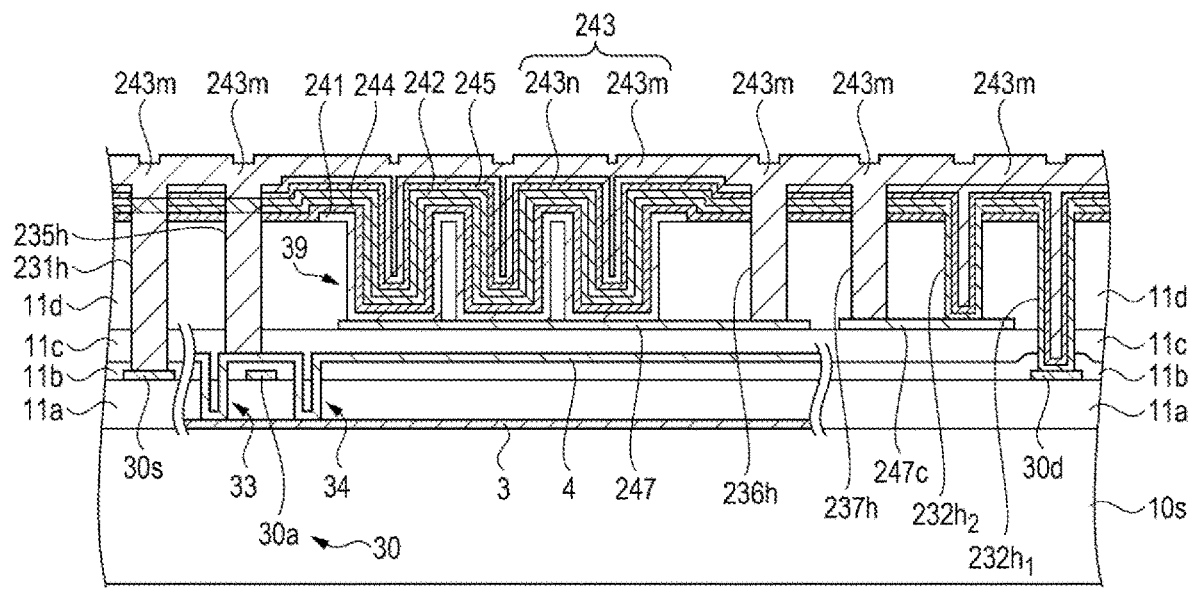
FIG. 26 is a schematic cross-sectional view illustrating the method of forming the five contact portions relating to the thin film transistor (TFT) and the storage capacitor of the second embodiment.

Next, as illustrated in FIG. 26, the third through hole 231h, the fourth through hole 235h, the fifth through hole 236h, and the sixth through hole 237h are filled, and the sixth conductive layer 243m covering the fifth conductive layer 243n is formed. The sixth conductive layer 243m is formed of a conductive polysilicon film, similarly to the fifth conductive layer 243n, and has a film thickness of 200 nm or greater, for example.

Figure 27:
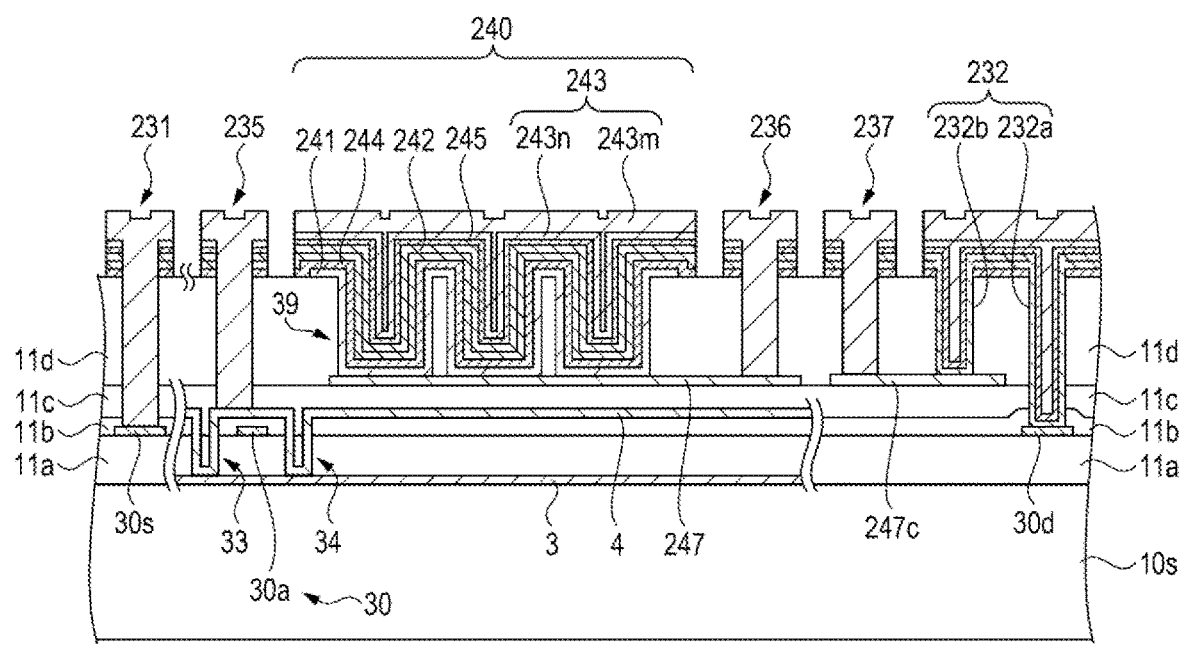
FIG. 27 is a schematic cross-sectional view illustrating the method of forming the five contact portions relating to the thin film transistor (TFT) and the storage capacitor of the second embodiment.

Next, as illustrated in FIG. 27, a layered film including the first capacitance insulating layer 244, the third conductive layer 242n and the fourth conductive layer 242m of the second capacitance electrode 242, the second capacitance insulating layer 245, and the fifth conductive layer 243n and the sixth conductive layer 243m of the third capacitance electrode 243 are dry etched at once and patterned to simultaneously form the five contact portions 231, 232, 235, 236, and 237 of the storage capacitor 240. An etching gas used during dry etching at once can include a mixed gas of hydrogen bromide (HBr) and chlorine (Cl). In addition, after the dry etching at once, the surface is oxidized under a dry atmosphere or under a wet atmosphere in order to prevent the storage capacitor 240 and the five contact portions 231, 232, 235, 236, and 237 from being electrically short-circuited with each other. Examples thereof under a dry atmosphere include oxidation treatments in which the surface is heated to 900° C. or higher in a dried atmosphere, and left for 10 minutes or longer. As a result, the plug-shaped contact portions 231, 235, 236, and 237 electrically coupled to each of the source region 30s, the second scanning line 4 (gate electrode), the first relay layer 247, and the second relay layer 247c are formed by using the sixth conductive layer 243m of the third capacitance electrode 243. Furthermore, the contact portion 232 electrically coupled to the second relay layer 247c and the drain region 30d is formed. In other words, the contact portion 231 is configured by using the sixth conductive layer 243m of the third capacitance electrode 243 and is provided so as to be in contact with the source region 30s of the semiconductor layer 30a of the TFT 30. Further, the first contact portion 232a of the contact portion 232 is configured by using the fourth conductive layer 242m of the second capacitance electrode 242, and is provided so as to be in contact with the drain region 30d of the semiconductor layer 30a of the TFT 30. The second contact portion 232b of the contact portion 232 is configured by using the fourth conductive layer 242m of the second capacitance electrode 242, and is provided so as to be in contact with the second relay layer 247c. The contact portion 235 is configured by using the sixth conductive layer 243m of the third capacitance electrode 243 and is provided so as to be in contact with the second scanning line 4 that functions as the gate electrode of the TFT 30. The contact portion 236 is configured by using the sixth conductive layer 243m of the third capacitance electrode 243 and is provided so as to be in contact with the first relay layer 247. The contact portion 237 is configured by using the sixth conductive layer 243m of the third capacitance electrode 243 and is provided so as to be in contact with the second relay layer 247c.

As described above, among the five contact portions 231, 232, 235, 236, and 237, the contact portion 232 configured to electrically couple the drain region 30d of the semiconductor layer 30a, and the second capacitance electrode 242 and the pixel electrode 15 is an example of a fourth contact portion of another electrooptical device of the present disclosure. In addition, the contact portion 237 electrically coupled to the contact portion 232 via the second relay layer 247c is an example of a fifth contact portion in the other electrooptical device of the present disclosure. Furthermore, the contact portion 231 configured to electrically couple the source region 30s of the semiconductor layer 30a and the data line 7 is an example of a sixth contact portion in the other electrooptical device of the present disclosure. Furthermore, the contact portion 235 configured to electrically couple the second scanning line 4 and the third scanning line 206 is an example of a seventh contact portion in the other electrooptical device of the present disclosure.

That is, the four contact portions 231, 235, 236, and 237 except for the contact portion 232 are configured by using the sixth conductive layer 243m of the third capacitance electrode 243, and are provided on a side wall and at an inside of the side wall formed of the first capacitance insulating layer 244, the third conductive layer 242n and the fourth conductive layer 242m of the second capacitance electrode 242, the second capacitance insulating layer 245, and the fifth conductive layer 243n of the third capacitance electrode 243.

Figure 28:
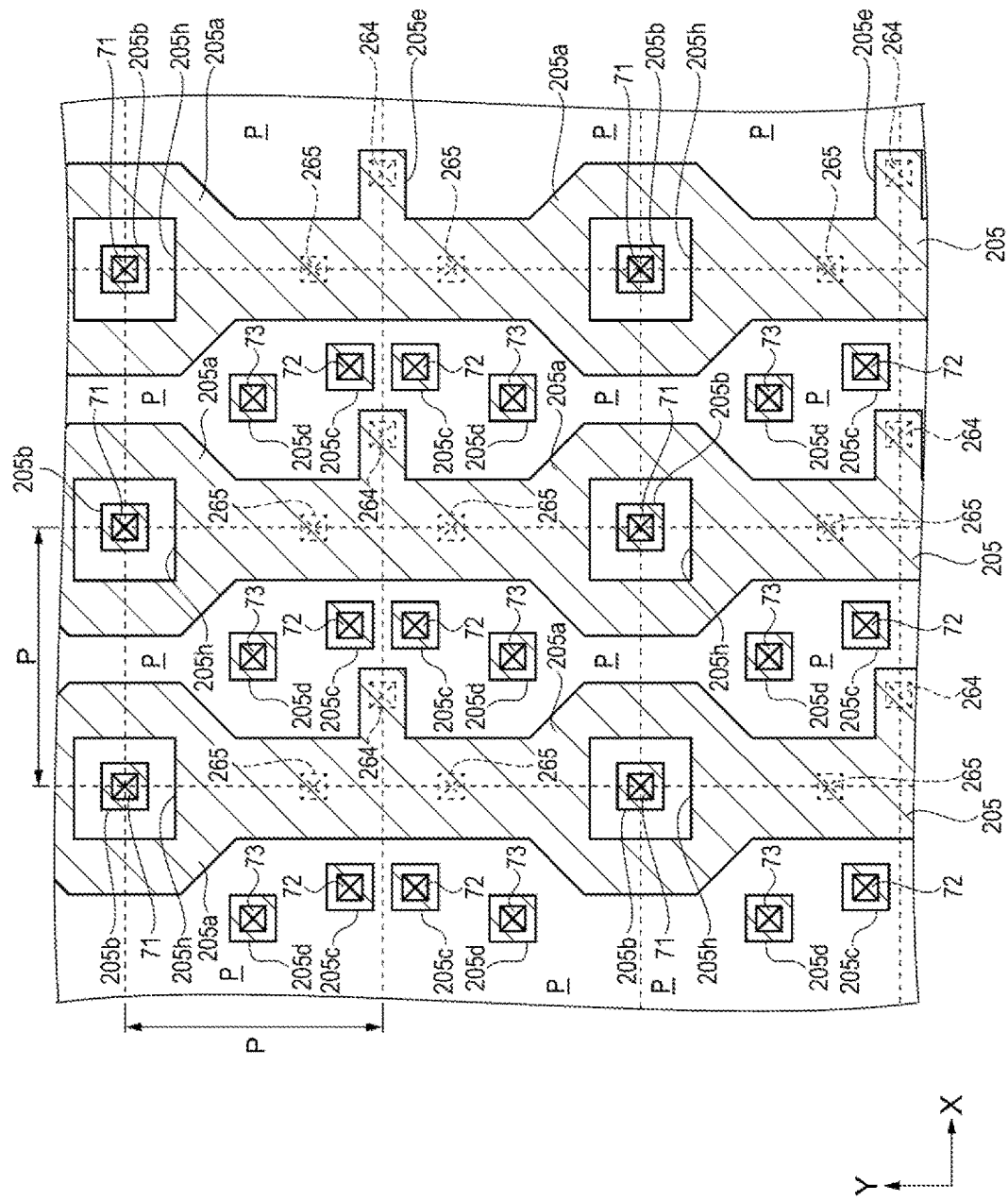
FIG. 28 is a schematic plan view illustrating arrangement of capacitance lines and the relay layer of the second embodiment.

Next, the arrangement of the electrical configuration in each of the wiring layers will be described. FIG. 28 is a schematic plan view illustrating arrangement of the capacitance lines and the relay layers of the second embodiment.

As illustrated in FIG. 28, the capacitance line 205 of the embodiment extends in the Y direction so as to overlap, in plan view, with the side along the Y direction of the pixel P. The capacitance line 205 includes an extended portion 205a with its width in the X direction extended at a position overlapping with one side along the X direction of the pixel P. An outer shape of the extended portion 205a is substantially hexagonal, and an opening 205h having a substantially rectangular outer shape is formed in a center of the extended portion 205a. The relay layer 205b is disposed in the center of the opening 205h. The extended portions 205a formed with the opening 205h in the capacitance line 205 are formed are disposed symmetrically in the Y direction, in the two pixels P adjacent to each other in the Y direction. In addition, the two relay layers 205c are disposed so as to face over the boundary between the two pixels P adjacent to each other in the Y direction. In addition, the relay layer 205d is disposed in a center of the pixel P between the capacitance lines 205 arranged next to each other in the X direction. The capacitance line 205 and the three relay layers 205b, 205c, and 205d are provided in the same layer (see FIG. 19). A protruding portion 205e protruding in the X direction from the capacitance line 205 extending in the Y direction is provided. The contact portion 264 configured to electrically couple with the lower contact portion 236 is disposed at an end of the protruding portion 205e. Such a protruding portion 205e overlaps in plan view with one of the boundaries along the X direction of the pixel P. In addition, the contact portion 265 configured to electrically couple with the third capacitance electrode 243 in the lower storage capacitor 240 is disposed on the capacitance line 205 extending in the Y direction.

The contact portion 71 configured to electrically couple the relay layer 205b and the relay layer 206a is disposed in the relay layer 205b. The contact portion 72 configured to electrically couple the relay layer 205c and the relay layer 206b is disposed in the relay layer 205c. The contact portion 73 configured to electrically couple the relay layer 205d and the third scanning line 206 is disposed in the relay layer 205d.

Figure 29:
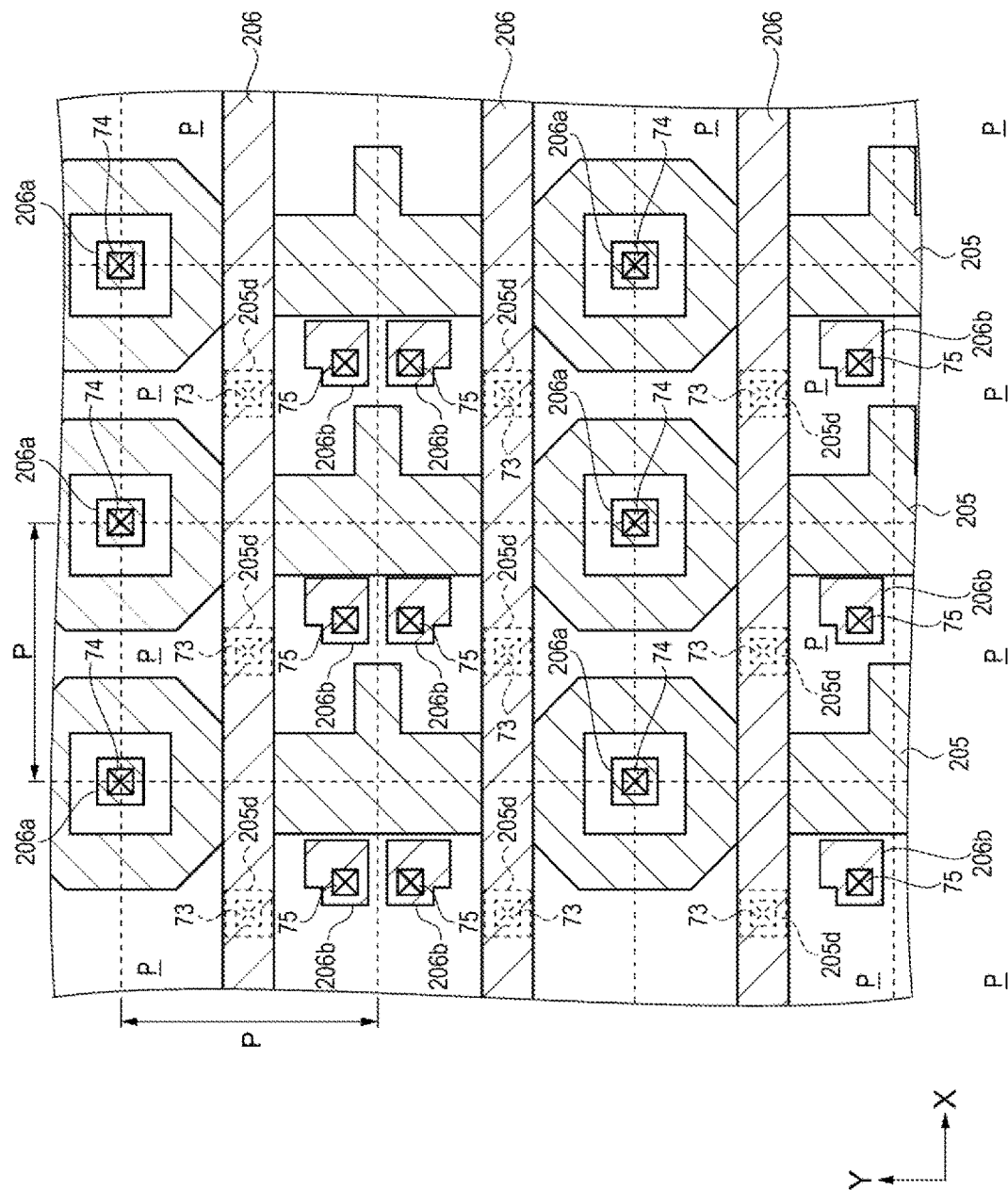
FIG. 29 is a schematic plan view illustrating arrangement of third scanning lines and the relay layer of the second embodiment.

FIG. 29 is a schematic plan view illustrating arrangement of the third scanning line and the relay layer of the second embodiment.

As illustrated in FIG. 29, the third scanning line 206 is disposed to extend in the X direction at a position overlapping in plan view with the relay layer 205d disposed in the center of the pixel P in a lower layer. Such a third scanning line 206 includes a plurality of third scanning lines 206 provided in parallel at the same arrangement pitch as the pixel pitch of the pixels P in the Y direction. The relay layer 206a is disposed between the third scanning lines 206 adjacent to each other in the Y direction and at a position overlapping in plan view with the lower relay layer 205b. In addition, the substantially rectangular relay layer 206b in plan view is disposed at a position spaced apart in the Y direction from the third scanning line 206, and at a position overlapping in plan view with the lower relay layer 205c. Such third scanning lines 206, relay layers 206a and 206b are symmetrically disposed in the Y direction with respect to the two pixels P adjacent to each other in the Y direction. The third scanning line 206 and the relay layers 206a and 206b are provided in the same layer (see FIG. 19). The contact portion 74 configured to electrically couple the relay layer 206a and the data line 7 is disposed in the relay layer 206a. The contact portion 75 configured to electrically couple the relay layer 206b and the relay layer 7b is disposed in the relay layer 206b.

A configuration of a seventh wiring layer including the data line 7 and the relay layer 7b located above the wiring layer including the third scanning line 206 on the base material 10s of the embodiment is the same in content as that described in the first embodiment (see FIG. 16). The configuration of an eighth wiring layer including the common potential line 8 and the relay layer 8a is the same in content as that described in the first embodiment (see FIG. 17). Furthermore, the configuration of an ninth wiring layer including the pixel electrode 15 is the same in content as that described in the first embodiment (see FIG. 18). Therefore, a detailed description is omitted, but as illustrated in FIG. 19, the data line 7 is electrically coupled to the source region 30s of the semiconductor layer 30a via the contact portion 74, the relay layer 206a, the contact portion 71, the relay layer 205b, the contact portion 261, and the contact portion 231. That is, the third scanning line 206 is electrically coupled to the second scanning line 4 via the contact portion 73, the relay layer 205d, the contact portion 263, and the contact portion 235. The pixel electrode 15 is electrically coupled to the drain region 30d of the semiconductor layer 30a via the contact portion 77, the relay layer 8a, the contact portion 76, the relay layer 7b, the contact portion 75, the relay layer 206b, the contact portion 72, the relay layer 205c, the contact portion 262, the contact portion 237, the second relay layer 247c, and the contact portion 232.

In the embodiment, similarly to the first embodiment, the contact portions 261, 262, 263, 264, and 265 passing through the third interlayer insulating layer 12a, the contact portions 71, 72, and 73 passing through the fourth interlayer insulating layer 12b, the contact portions 74 and 75 passing through the fifth interlayer insulating layer 13a, the contact portion 76 passing through the sixth interlayer insulating layer 13b, and the contact portion 77 passing through the seventh interlayer insulating layer 14 are all tungsten plugs in which the through holes are filled with tungsten.

When the tungsten plug is formed, from a relationship between an aspect ratio of the through hole (ratio of a size of a diameter of the through hole relative to a depth of the through hole) and covering and filling of the through hole with tungsten, a film thickness of the interlayer insulating layer in which the through hole is provided is desirably less than 1 µm, and in the embodiment, the film thickness is 800 nm.

On the other hand, the contact portions 231, 235, 236, and 237 configured to electrically couple to the source region 30s of the semiconductor layer 30a of the TFT 30, the second scanning line 4 functioning as the gate electrode 30g, the first relay layer 247, and the second relay layer 247c are plugged by filling the through hole passing through the second interlayer insulating layer 11d with polysilicon. For example, when a film of polysilicon is formed by the CVD method or the like, the through hole can be easily filled compared to tungsten, so that the film thickness of the second interlayer insulating layer 11d can be 1 µm or greater. That is, the film thickness of the second interlayer insulating layer 11d can be thicker than that of the other interlayer insulating layers, and thus, if the trench 39 is formed in the second interlayer insulating layer 11d and the storage capacitor 240 is formed along the trench 39, it is possible to realize the storage capacitor 240 with a greater electrical capacitance per unit area.

The liquid crystal device 200 of the second embodiment described above can provide the following advantages.

(1) In the element substrate 210 included in the liquid crystal panel of the liquid crystal device 200, the contact portion 237 as a fifth contact portion configured to electrically couple a drain of the TFT 30 (the drain region 30d of the semiconductor layer 30a) and the pixel electrode 15 via the contact portion 232, the contact portion 231 as a sixth contact portion configured to electrically couple a source of the TFT 30 (the source region 30s of the semiconductor layer 30a) and the data line 7, the contact portion 235 as a seventh contact portion configured to electrically couple the third scanning line 206 and the second scanning line 4 functioning as the gate electrode of the TFT 30, and the contact portion 236 configured to electrically couple the first capacitance electrode 241 and the capacitance line 205, are all formed in a plug shape by filling the through hole passing through the second interlayer insulating layer 11d with the sixth conductive layer 243m of the third capacitance electrode 243. Furthermore, in the storage capacitor 240 and the five contact portions 231, 232, 235, 236, and 237, a layered film obtained by stacking the first capacitance insulating layer 244, the third conductive layer 242n and the fourth conductive layer 242m included in the second capacitance electrode 242, the second capacitance insulating layer 245, and the fifth conductive layer 243n included in the third capacitance electrode 243 is subject to dry etching at once and patterned. Thus, the wiring structure and manufacturing process in the element substrate 210 can be simplified compared to a case where the five contact portions 231, 232, 235, 236, and 237 are configured of a conductive layer not related to the storage capacitor 240. That is, a reflective liquid crystal device 200 can be provided as an electrooptical device having the element substrate 210 having a simplified wiring structure.

(2) The four contact portions 231, 235, 236, and 237, except for the contact portion 232, are configured by using the sixth conductive layer 243m of the third capacitance electrode 243, and are provided on the side wall and at an inside of the side wall thereof formed of the first capacitance insulating layer 244, the second capacitance electrode 242, the second capacitance insulating layer 245, and the fifth conductive layer 243n of the third capacitance electrode 243. Thus, the four contact portions 231, 235, 236, and 237 can be formed by forming the through hole reaching the semiconductor layer 30a, the gate electrode 30g, the first relay layer 247, and the second relay layer 247c, to which the four contact portions 231, 235, 236, and 237 are coupled, after passing through the first capacitance insulating layer 244, the second capacitance electrode 242, the second capacitance insulating layer 245, and the fifth conductive layer 243n of the third capacitance electrode 243, and filling the through hole with the sixth conductive layer 243m of the third capacitance electrode 243. In other words, in the four contact portions 231, 235, 236, and 237, the conductive layer in contact with the source region 30s, the drain region 30d, the gate electrode 30g, the first relay layer 247, and the second relay layer 247c, to which the four contact portions 231, 235, 236, and 237 are coupled is limited to one type, and thus, a stable electrical coupling structure can be realized compared to a case where each of the four contact portions 231, 235, 236, and 237 is configured by using a plurality of types of conductive layers.

(3) The four contact portions 231, 235, 236, and 237 are formed in a plug shape using the sixth conductive layer 243m made of polysilicon of the third capacitance electrode 243. This provides excellent coverage and filling properties for the through holes reaching the coupling destination. Accordingly, a stable electrical coupling structure can be realized compared to a case where a conductive layer other than the conductive polysilicon layer is used.

(4) The storage capacitor 240 is provided along the trench 39 as a recessed portion formed in the second interlayer insulating layer 11d having the largest film thickness, of the plurality of interlayer insulating layers. Because the trench 39 is configured to include three grooves 39a, 39b, and 39c, the electrical capacitance per unit area can be increased compared to a case where the storage capacitor 240 is provided in the planar portion. Furthermore, unlike the storage capacitor 40 of the first embodiment, the storage capacitor 240 of the second embodiment is configured to include the two capacitance elements electrically coupled in parallel. Accordingly, even when the size of the pixels P decreases, the reflective liquid crystal device 200 can be provided as an electrooptical device including the element substrate 210 having a wiring structure capable of easily securing a desired electrical capacitance in the storage capacitor 240.

Third Embodiment

Electronic Apparatus

Figure 30:
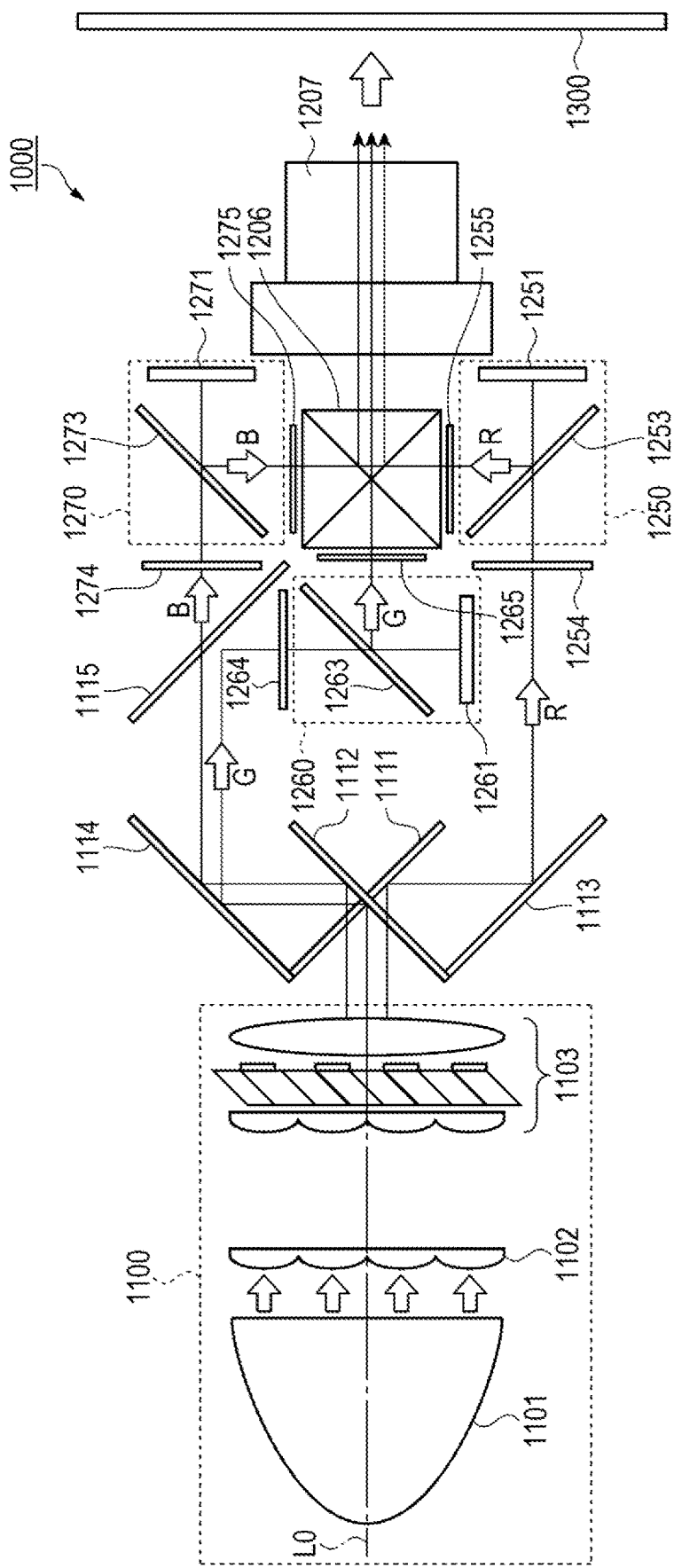
FIG. 30 is a schematic view illustrating a configuration of a 3CCD type reflective liquid crystal projector, which is an example of a projection-type display apparatus as an electronic apparatus of a third embodiment.

Next, with reference to FIG. 30, an electronic apparatus of the embodiment will be described by using a projection-type display apparatus as an example. FIG. 30 is a schematic view illustrating a configuration of a 3CCD type reflective liquid crystal projector being an example of a projection-type display apparatus as an electronic apparatus according to a third embodiment.

As illustrated in FIG. 30, a liquid crystal projector 1000 being a projection-type display apparatus according to the embodiment includes a polarized light illumination device 1100 disposed along a system optical axis L0, three dichroic mirrors 1111, 1112, and 1115 as color separation means, two reflection mirrors 1113 and 1114, reflective liquid crystal light valves 1250, 1260, and 1270 as three optical modulation means, a cross dichroic prism 1206 as a photosynthesis means configured to combine and display light modulated by each of the three optical modulation means, and a projection lens 1207.

The polarized light illumination device 1100 generally includes a lamp unit 1101 being as a light source including a white light source such as an extra-high pressure mercury lamp or a halogen lamp, an integrator lens 1102, and a polarization conversion element 1103.

Polarized light flux emitted from the polarized light illumination device 1100 is incident on the dichroic mirror 1111 and the dichroic mirror 1112 disposed to be orthogonal to each other. The dichroic mirror 1111 as the color separation means reflects red light (R) of the incident polarized light flux. The dichroic mirror 1112 as the other color separation means reflects green light (G) and blue light (B) of the incident polarized light flux.

The reflected red light (R) is reflected again by the reflective mirror 1113 and enters the liquid crystal light valve 1250 as a first light modulation means. On the other hand, the reflected green light (G) and blue light (B) are reflected again by the reflection mirror 1114 and enter the dichroic mirror 1115 as a color separation means. The dichroic mirror 1115 reflects the green light (G) and transmits the blue light (B). The reflected green light (G) is incident on the liquid crystal light valve 1260 as a second light modulation means. The transmitted blue light (B) is incident on the liquid crystal light valve 1270 as a third light modulation means.

The liquid crystal light valve 1250 includes a reflective liquid crystal panel 1251 and a wire grid type polarization element 1253 being a reflective polarization element.

The liquid crystal light valve 1250 is arranged so that the red light (R) reflected by the polarization element 1253 is incident perpendicular to an incident surface of the cross dichroic prism 1206. In addition, an auxiliary polarization element 1254 configured to compensate for a polarization of the polarization element 1253 is disposed on an incident side of the red light (R) in the liquid crystal light valve 1250, and the other auxiliary polarization element 1255 is disposed along the incident surface of the cross dichroic prism 1206 on an emission side of the red light (R). Note that when a polarizing beam splitter is used as the reflective polarization element, a pair of auxiliary polarization elements 1254 and 1255 may be omitted.

A configuration of such a reflective liquid crystal light valve 1250 and an arrangement of each component are the same in other reflective liquid crystal light valves 1260 and 1270.

The respective color light beams incident on the liquid crystal light valves 1250, 1260, and 1270 are modulated based on image information and enter again the cross dichroic prism 1206 via the wire grid type polarization elements 1253, 1263, and 1273. In the cross dichroic prism 1206, each of the color light beams is combined, the combined display light is projected onto the screen 1300 by the projection lens 1207, and the image is magnified and displayed.

In the embodiment, the liquid crystal device 100 of the first embodiment is applied as the liquid crystal light valves 1250, 1260, and 1270. On the incident side of the light of the liquid crystal device 100 as the liquid crystal light valve 1250, the wire grid type polarization element 1253 is disposed to be inclined at an angle of 45 degrees with respect to an optical axis. The same applies to the other wire grid type polarization elements 1263 and 1273.

The green light (G) modulated by the liquid crystal light valve 1260 moves straight to the cross dichroic prism 1206, and the red light (R) modulated by the liquid crystal light valve 1250 and the blue light (B) modulated by the liquid crystal light valve 1270 are reflected by a dielectric multi-layer film so that the resultant image is inversed horizontally.

According to such a liquid crystal projector 1000, the reflective liquid crystal light valves 1250, 1260, and 1270 provided for each of the color light beams, to which the liquid crystal device 100 is applied, has a simplified wiring structure in the pixel P and includes the element substrate 10 having the storage capacitor 40 where a desired electrical capacitance is secured, and thus, it is possible to offer the reflective liquid crystal projector 1000 capable of providing an excellent cost performance and a good-looking display state. Note that even when the liquid crystal device 200 of the second embodiment may be applied to configure the reflective liquid crystal light valves 1250, 1260, and 1270, a similar effect can be obtained.

The third embodiment includes the configuration in which the white light (polarized light flux) emitted from the polarized light illumination apparatus 1100 is dispersed into the respective types of color light by the dichroic mirrors and then is incident on the liquid crystal light bulbs 1250, 1260, and 1270, but the third embodiment is not limited to this configuration. As an illumination device capable of emitting three color light beams, for example, a solid-state light source such as a laser light source and an LED capable of emitting light of each color may be used. This can eliminate a need for the color separation means.

Note that, the present disclosure is not limited to the embodiments described above, and various modifications and improvements can be added to the above-described embodiments. Such modifications will be described below.

Modification 1

Figure 31:
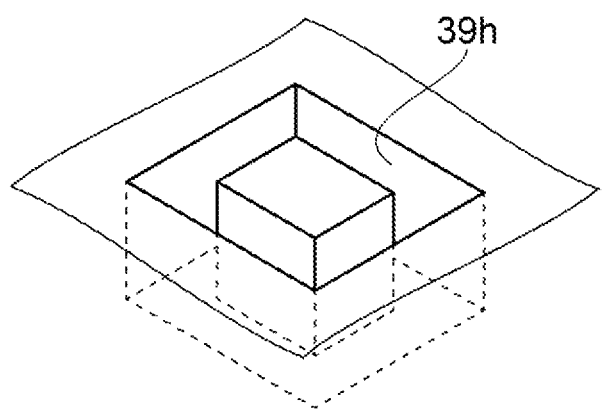
FIG. 31 is a schematic perspective view of a trench of a modified example.

In the embodiments described above, the trench 39 in which the storage capacitor is formed includes the three grooves 39a, 39b, and 39c, but is not limited to this configuration. FIG. 31 is a schematic perspective view illustrating a trench of a modification. As illustrated in FIG. 31, a trench 39h of the modification is formed of a frame-shaped continuous groove having a rectangular outer shape. Note that the outer shape of the trench 39h of the modification is not limited to a rectangular shape, and may be a polygon, a circle, an oval, or an irregular shape, other than a rectangular square.

Modification 2

The electrooptical device capable of applying the TFT 30 as the transistor, the storage capacitor, and the relay layer for the storage capacitor in the embodiments described above is not limited to a reflective liquid crystal device. For example, the present disclosure can also be applied to a top-emission type light emitting device in which a light emitting element is disposed in the pixel P.

Modification 3

The electronic apparatus to which the reflective liquid crystal device of the embodiments described above can be applied is not limited to the liquid crystal projector 1000 being the projection-type display apparatus. For example, the counter substrate 20 of the liquid crystal device 100 may include color filters corresponding to at least red (R), green (G), and blue (B), and the liquid crystal light valve may have a single plate configuration. In addition, the liquid crystal device 100 can be used suitably as, for example, a display unit of a projection-type Head-Up Display (HUD), a Head-Mounted Display (HMD), an electronic book, a personal computer, a digital still camera, a liquid crystal television, a view finder-type or monitor direct view-type video recorder, a car navigation system, an electronic diary, and an information terminal device such as Point Of Sale (POS) terminal. Likewise, the liquid crystal device 200 can be used suitably.

Contents derived from the embodiments will be described below.

An electrooptical device according to the present application includes a transistor, a pixel electrode provided correspondingly to the transistor, a storage capacitor in which a first capacitance electrode, a capacitance insulating layer, and a second capacitance electrode are stacked in order, and a first contact portion configured to electrically couple a semiconductor layer of the transistor and the pixel electrode. In the electrooptical device, the second capacitance electrode includes a first conductive layer and a second conductive layer stacked on the first conductive layer, and the first contact portion is configured of the second conductive layer and is provided so as to be in contact with the semiconductor layer.

In the configuration according to the present application, the second conductive layer included in the second capacitance electrode of the storage capacitor and the first contact portion configured to electrically couple the semiconductor layer of the transistor and the pixel electrode are provided in the same layer. Further, the first contact portion is provided so as to be in contact with the semiconductor layer. Accordingly, the wiring structure can be simplified compared to when the first contact portion is configured of a conductive layer not related to the storage capacitor. In other words, it is possible to provide an electrooptical device including the pixel electrode and the transistor, which have a simplified wiring structure.

The electrooptical device may include a second contact portion configured to electrically couple the semiconductor layer of the transistor and a data line, and, in the electrooptical device, the second contact portion may be configured of the second conductive layer and be provided so as to be in contact with the semiconductor layer.

With the configuration, the wiring structure in which the pixel electrode and the transistor are provided can be simplified compared to when the second contact portion is configured by using a conductive layer not related to the storage capacitor.

The electrooptical device may include a third contact portion configured to electrically couple a gate electrode of the transistor and a scanning line, and, in the electrooptical device, the third contact portion may be configured of the second conductive layer and be provided so as to be in contact with the gate electrode.

With the configuration, the wiring structure in which the pixel electrode and the transistor are provided can be simplified compared to when the third contact portion is configured by using a conductive layer not related to the storage capacitor.

In the electrooptical device, the first contact portion, the second contact portion, or the third contact portion may be provided on a sidewall and at an inside of the sidewall, and the sidewall may be configured of the capacitance insulating layer and the first conductive layer of the second capacitance electrode.

With the configuration, the first contact portion, the second contact portion, or the third contact portion can be formed by forming a plurality of through holes passing through the capacitance insulating layer and the first conductive layer of the second capacitance electrode and reaching a coupling destination, i.e., the semiconductor layer or the gate electrode, and then filling the plurality of through holes with the second conductive layer. In other words, in the first contact portion, the second contact portion, or the third contact portion, only one type of conductive layer serves as the conductive layer for contacting with the coupling destination, i.e., the semiconductor layer or the gate electrode. Thus, it is possible to provide a stable electrical coupling structure as compared to when the first contact portion, the second contact portion, or the third contact portion is configured of several types of conductive layers.

In the electrooptical device, the first contact portion, the second contact portion, or the third contact portion may include polysilicon.

With the configuration, by using the conductive polysilicon layer in the formation of the first contact portion, the second contact portion, or the third contact portion by forming and patterning of the conductive layer, it is possible to ensure excellent coverage and filling properties for the through holes reaching the coupling destination. Thus, it is possible to provide a stable electrical coupling structure as compared to when a conductive layer other than the conductive polysilicon layer is used.

The electrooptical device may include a plurality of interlayer insulating layers provided between the transistor and the pixel electrode, and in the electrooptical device, the storage capacitor may be provided along a recessed portion provided in one of the plurality of interlayer insulating layers.

With the configuration, it is possible to increase the electrical capacitance per unit area compared to when a storage capacitor is provided in the planar portion of the interlayer insulating layer.

Another electrooptical device according to the present application includes a transistor, a pixel electrode provided correspondingly to the transistor, a storage capacitor in which a first capacitance electrode, a first capacitance insulating layer, a second capacitance electrode, a second capacitance insulating layer, and a third capacitance electrode are stacked in order, a fourth contact portion configured to electrically couple a semiconductor layer of the transistor and the second capacitance electrode and a fifth contact portion configured to electrically couple the fourth contact portion and the pixel electrode. In the other electrooptical device, the second capacitance electrode includes a third conductive layer and a fourth conductive layer stacked on the third conductive layer, the third capacitance electrode includes a fifth conductive layer and a sixth conductive layer stacked on the fifth conductive layer, the fourth contact portion is configured of the fourth conductive layer and is provided so as to be in contact with the semiconductor layer, and the fifth contact portion is configured of the sixth conductive layer and is provided so as to be electrically coupled with the second capacitance electrode.

In the configuration according to the present application, the fourth contact portion configured to electrically couple the semiconductor layer of the transistor and the second capacitance electrode is provided in the same layer as the second capacitance electrode of the storage capacitor. Further, the fourth contact portion is provided so as to be in contact with the semiconductor layer. Further, the sixth conductive layer included in the third capacitance electrode of the storage capacitor and the fifth contact portion configured to electrically couple the fourth contact portion and the pixel electrode are provided in the same layer. In other words, the second capacitance electrode of the storage capacitor and the pixel electrode are electrically coupled to the semiconductor layer by the fourth contact portion and the fifth contact portion. Accordingly, the wiring structure can be simplified compared to when the fourth contact portion and the fifth contact portion are configured by using a conductive layer not related to the storage capacitor. In other words, it is possible to provide the other electrooptical device including the pixel electrode and the transistor, which have a simplified wiring structure.

The other electrooptical device may include a sixth contact portion configured to electrically couple the semiconductor layer of the transistor and a data line, and, in the other electrooptical device, the sixth contact portion may be configured of the sixth conductive layer and be provided so as to be in contact with the semiconductor layer.

With the configuration, the wiring structure in which the pixel electrode and the transistor are provided can be simplified compared to when the sixth contact portion is configured by using a conductive layer not related to the storage capacitor.

The other electrooptical device may include a seventh contact portion configured to electrically couple a gate electrode of the transistor and a scanning line, and, in the other electrooptical device, the seventh contact portion may be configured of the sixth conductive layer and be provided so as to be in contact with the gate electrode.

With the configuration, the wiring structure in which the pixel electrode and the transistor are provided can be simplified compared to when the seventh contact portion is configured by using a conductive layer not related to the storage capacitor.

In the other electrooptical device, the fifth contact portion, the sixth contact portion, or the seventh contact portion may be provided on a sidewall and at an inside of the sidewall, and the sidewall may be configured of the first capacitance insulating layer, the third conductive layer and the fourth conductive layer of the second capacitance electrode, the second capacitance insulating layer, and the fifth conductive layer of the third capacitance electrode.

With the configuration, the fifth contact portion, the sixth contact portion, or the seventh contact portion can be formed by forming a plurality of through holes passing through the first capacitance insulating layer, the third conductive layer and the fourth conductive layer of the second capacitance electrode, the second capacitance insulating layer, and the fifth conductive layer of the third capacitance electrode and reaching a coupling destination, i.e., the semiconductor layer or the gate electrode, and then filling the plurality of through holes with the sixth conductive layer. In other words, in the fifth contact portion, the sixth contact portion, or the seventh contact portion, only one type of conductive layer serves as the conductive layer for contacting with the coupling destination, i.e., the semiconductor layer or the gate electrode. Thus, it is possible to provide a stable electrical coupling structure as compared to when the fifth contact portion, the sixth contact portion, or the seventh contact portion is configured by using several types of conductive layers.

In the other electrooptical device, the fifth contact portion, the sixth contact portion, or the seventh contact portion may include polysilicon.

With the configuration, by using the conductive polysilicon layer in the formation of the fifth contact portion, the sixth contact portion, or the seventh contact portion by forming and patterning of the conductive layer, it is possible to ensure excellent coverage and filling properties for the through holes reaching the coupling destination. Thus, it is possible to provide a stable electrical coupling structure as compared to when a conductive layer other than the conductive polysilicon layer is used.

The other electrooptical device may include a plurality of interlayer insulating layers provided in a layer between the transistor and the pixel electrode, and in the other electrooptical device, the storage capacitor may be provided along a recessed portion provided in one interlayer insulating layer of the plurality of interlayer insulating layers.

With the configuration, it is possible to increase the electrical capacitance per unit area compared to when a storage capacitor is provided in the planar portion of the interlayer insulating layer.

An electronic apparatus according to the present application includes the electrooptical device described above.

With the configuration according to the present application, since the electrooptical device includes the pixel electrodes and the transistors, and has the simplified wiring structure, it is possible to provide the electronic apparatus capable of achieving excellent productivity or cost performance.

What is claimed is:

1. An electrooptical device, comprising:
   a transistor;
   a pixel electrode provided correspondingly to the transistor;
   a storage capacitor in which a first capacitance electrode, a capacitance insulating layer, and a second capacitance electrode are stacked in order, the second capacitance electrode including a first conductive layer and a second conductive layer stacked on the first conductive layer;
   an interlayer insulating layer provided in a layer between the transistor and the storage capacitor, the interlayer insulating layer including a through hole;
   a sidewall provided in a layer between the interlayer insulating layer and the pixel electrode and surrounding the through hole of the interlayer insulating layer in a plan view, the sidewall including a first layer provided in a same layer as the capacitance insulating layer and second layer provided in a same layer as the first conductive layer of the second capacitance electrode; and
   a first contact portion provided at an inside of the sidewall and at an inside of the through hole of the interlayer insulating layer such that the first contact portion electrically connects a semiconductor layer of the transistor and the pixel electrode, wherein
   the first contact portion includes a layer provided in a same layer as the second conductive layer of the second capacitance electrode and is provided so as to be in contact with the semiconductor layer.

2. The electrooptical device according to claim 1, comprising a second contact portion configured to electrically connect the semiconductor layer of the transistor and a data line, wherein
   the second contact portion is configured of the second conductive layer and is provided so as to be in contact with the semiconductor layer.

3. The electrooptical device according to claim 2, comprising a third contact portion configured to electrically connect a gate electrode of the transistor and a scanning line, wherein
   the third contact portion is configured of the second conductive layer and is provided so as to be in contact with the gate electrode.

4. The electrooptical device according to claim 3, wherein the first contact portion, the second contact portion, or the third contact portion is provided on a sidewall and at an inside of the sidewall, the sidewall being configured of the capacitance insulating layer and the first conductive layer of the second capacitance electrode.

5. The electrooptical device according to claim 4, wherein the first contact portion, the second contact portion, or the third contact portion includes polysilicon.

6. The electrooptical device according to claim 1, comprising a plurality of interlayer insulating layers provided between the transistor and the pixel electrode, wherein
   the storage capacitor is provided along a recessed portion provided in one of the plurality of interlayer insulating layers.

7. An electronic apparatus comprising the electrooptical device according to claim 1.

8. The electrooptical device according to claim 1, wherein the sidewall has an island shape.

9. An electrooptical device, comprising:
   a transistor;
   a pixel electrode provided correspondingly to the transistor;
   a storage capacitor in which a first capacitance electrode, a first capacitance insulating layer, a second capacitance electrode, a second capacitance insulating layer, and a third capacitance electrode are stacked in order;

a fourth contact portion configured to electrically connect a semiconductor layer of the transistor and the second capacitance electrode; and a fifth contact portion configured to electrically connect the fourth contact portion and the pixel electrode, wherein the second capacitance electrode includes a third conductive layer and a fourth conductive layer stacked on the third conductive layer, the third capacitance electrode includes a fifth conductive layer and a sixth conductive layer stacked on the fifth conductive layer, the fourth contact portion is configured of the fourth conductive layer and is provided so as to be in contact with the semiconductor layer, and the fifth contact portion is configured of the sixth conductive layer and is provided so as to be electrically connected with the second capacitance electrode.

10. The electrooptical device according to claim 9, comprising a sixth contact portion configured to electrically connect the semiconductor layer of the transistor and a data line, wherein the sixth contact portion is configured of the sixth conductive layer and is provided so as to be in contact with the semiconductor layer.

11. The electrooptical device according to claim 10, comprising a seventh contact portion configured to electrically connect a gate electrode of the transistor and a scanning line, wherein the seventh contact portion is configured of the sixth conductive layer and is provided so as to be in contact with the gate electrode.

12. The electrooptical device according to claim 11, wherein the fifth contact portion, the sixth contact portion, or the seventh contact portion is provided on a sidewall and at an inside of the sidewall, the sidewall being configured of the first capacitance insulating layer, the third conductive layer and the fourth conductive layer of the second capacitance electrode, the second capacitance insulating layer, and the fifth conductive layer of the third capacitance electrode.

13. The electrooptical device according to claim 12, wherein the fifth contact portion, the sixth contact portion, or the seventh contact portion includes polysilicon.

14. The electrooptical device according to claim 9, comprising a plurality of interlayer insulating layers provided in a layer between the transistor and the pixel electrode, wherein the storage capacitor is provided along a recessed portion provided in one interlayer insulating layer of the plurality of interlayer insulating layers.

* * * * *